(12) United States Patent
Moslehi

(10) Patent No.: US 9,219,171 B2
(45) Date of Patent: Dec. 22, 2015

(54) SYSTEMS AND METHODS FOR MONOLITHICALLY INTEGRATED BYPASS SWITCHES IN PHOTOVOLTAIC SOLAR CELLS AND MODULES

(71) Applicant: Solexel, Inc., Milpitas, CA (US)

(72) Inventor: Mehrdad M. Moslehi, Los Altos, CA (US)

(73) Assignee: Solexel, Inc., Milpitas, CA (US)

(*) Notice: Subject to any disclaimer, the term of this patent is extended or adjusted under 35 U.S.C. 154(b) by 209 days.

(21) Appl. No.: 14/055,813

(22) Filed: Oct. 16, 2013

(65) Prior Publication Data

US 2014/0102531 A1  Apr. 17, 2014

Related U.S. Application Data

(60) Provisional application No. 61/714,723, filed on Oct. 16, 2012.

(51) Int. Cl.
| | | |
|---|---|---|
| *H01L 31/00* | (2006.01) | |
| *H01L 31/02* | (2006.01) | |

(Continued)

(52) U.S. Cl.
CPC ...... *H01L 31/02008* (2013.01); *H01L 27/1421* (2013.01); *H01L 31/0201* (2013.01); *H01L 31/02021* (2013.01); *H01L 31/049* (2014.12); *H01L 31/0504* (2013.01); *H01L 31/0512* (2013.01); *H01L 31/0516* (2013.01); *Y02E 10/50* (2013.01)

(58) Field of Classification Search
CPC .................. H01L 31/02008; H01L 31/0201; H01L 31/02021; H01L 31/049; H01L 31/0504; H01L 31/0512; H01L 31/0516; H01L 27/1421; Y02E 10/50; Y02E 10/546; Y02E 10/547

See application file for complete search history.

(56) References Cited

U.S. PATENT DOCUMENTS

| 4,989,059 A | 1/1991 | Micheels et al. |
|---|---|---|
| 5,009,720 A | 4/1991 | Hokuyo et al. |

(Continued)

FOREIGN PATENT DOCUMENTS

| EP | 1 094 521 A2 | 4/2001 |
|---|---|---|
| EP | 1 428 267 B1 | 9/2012 |

(Continued)

OTHER PUBLICATIONS

PCT International Search Report and Written Opinion dated Jan. 17, 2014 issued in PCT/US2013/065316.

(Continued)

*Primary Examiner* — Matthew Martin
(74) *Attorney, Agent, or Firm* — John Wood

(57) ABSTRACT

Structures and methods for a solar cell having an integrated bypass switch are provided. According to one embodiment, an integrated solar cell and bypass switch comprising a semiconductor layer having background doping, a frontside, and a backside is provided. A patterned first level metal is positioned on the layer backside and an electrically insulating backplane is positioned on the first level metal. A trench isolation pattern partitions the semiconductor layer into a solar cell region and at least one monolithically integrated bypass switch region. A patterned second level metal is positioned on the electrically insulating backplane and which connects to the first level metal through the backplane to complete the electrical metallization of the monolithically integrated solar cell and bypass switch structure.

38 Claims, 38 Drawing Sheets

(51) Int. Cl.
*H01L 27/142* (2014.01)
*H01L 31/05* (2014.01)
*H01L 31/049* (2014.01)

(56) References Cited

U.S. PATENT DOCUMENTS

| | | | |
|---|---|---|---|
| 5,616,185 A | 4/1997 | Kukulka |
| 5,665,175 A | 9/1997 | Safir |
| 5,990,415 A | 11/1999 | Green et al. |
| 6,274,804 B1 | 8/2001 | Psyk et al. |
| 6,288,323 B1 | 9/2001 | Hayashi et al. |
| 6,313,396 B1 | 11/2001 | Glenn |
| 6,452,086 B1 | 9/2002 | Muller |
| 6,552,259 B1 | 4/2003 | Hosomi et al. |
| 6,600,100 B2 | 7/2003 | Ho et al. |
| 6,635,507 B1 | 10/2003 | Boutros et al. |
| 6,653,550 B2 | 11/2003 | Hayashi et al. |
| 6,680,432 B2 | 1/2004 | Sharps et al. |
| 7,592,536 B2 | 9/2009 | Glenn |
| 7,745,724 B2 | 6/2010 | Balasubramanian et al. |
| 7,812,250 B2 | 10/2010 | Smith |
| 7,932,462 B2 | 4/2011 | Van Riesen et al. |
| 8,134,217 B2 | 3/2012 | Rim et al. |
| 8,158,450 B1 | 4/2012 | Sheats et al. |
| 8,460,963 B2 | 6/2013 | Smith |
| 8,704,085 B2 | 4/2014 | Lockenhoff |
| 8,742,249 B2 | 6/2014 | Moslehi et al. |
| 8,847,060 B2 | 9/2014 | Moslehi et al. |
| 8,878,048 B2 | 11/2014 | Ho et al. |
| 2003/0140962 A1 | 7/2003 | Sharps et al. |
| 2007/0113884 A1 | 5/2007 | Kinsey et al. |
| 2008/0000523 A1 | 1/2008 | Hilgarth et al. |
| 2008/0035198 A1 | 2/2008 | Teppe et al. |
| 2009/0194164 A1 | 8/2009 | Sivaram et al. |
| 2010/0078057 A1 | 4/2010 | Karg et al. |
| 2010/0108119 A1 | 5/2010 | Gee et al. |
| 2010/0132759 A1 | 6/2010 | Jia et al. |
| 2010/0170558 A1 | 7/2010 | Stein |
| 2011/0070681 A1 | 3/2011 | Nakayashiki et al. |
| 2011/0083715 A1 | 4/2011 | Kang et al. |
| 2011/0265857 A1 | 11/2011 | Wang et al. |
| 2012/0152299 A1 | 6/2012 | Schultz-Wittmann et al. |
| 2012/0268087 A1 | 10/2012 | Kernahan |
| 2013/0032197 A1 | 2/2013 | Foti et al. |
| 2013/0104954 A1 | 5/2013 | Zhou et al. |
| 2014/0060610 A1 | 3/2014 | Moslehi et al. |

FOREIGN PATENT DOCUMENTS

| | | |
|---|---|---|
| JP | 2007073898 A | 3/2007 |
| KR | 20120019042 A | 3/2012 |
| WO | WO/2008/157577 | 12/2008 |
| WO | WO/2014/062850 | 4/2014 |
| WO | WO/2014/169295 | 10/2014 |

OTHER PUBLICATIONS

PCT International Preliminary Report on Patentability [Chapter II] dated Nov. 28, 2014 issued in PCT/US2013/065316.

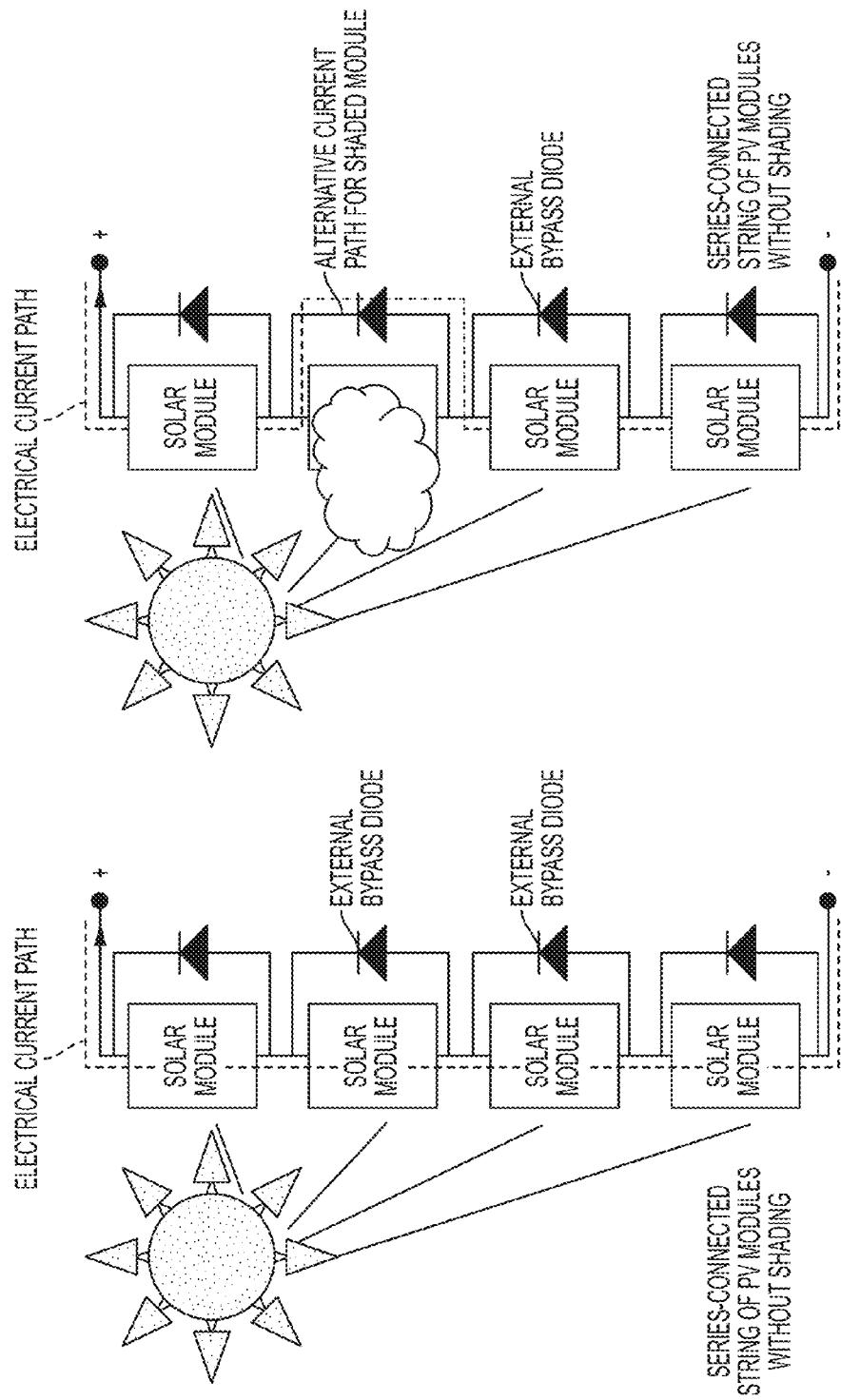

SYSTEMS AND METHODS FOR MONOLITHICALLY INTEGRATED BYPASS SWITCHES IN PHOTOVOLTAIC SOLAR CELLS AND MODULES

CROSS-REFERENCE TO RELATED APPLICATIONS

This application claims the benefit of provisional patent application 61/714,723 filed on Oct. 16, 2012, which is hereby incorporated by reference in its entirety.

FIELD OF THE INVENTION

The present disclosure relates in general to the fields of solar photovoltaic (PV) cells and modules, and more particularly to Monolithically Integrated Bypass Switches (MIBS) embedded in the module laminate for distributed integrated shade management resulting in enhanced power and energy harvesting in photovoltaic (PV) solar cells and modules.

BACKGROUND

Crystalline silicon photovoltaic (PV) modules currently (as of 2012), account for approximately over 85% of the overall global PV annual demand market and cumulative globally installed PV capacity. The manufacturing process for crystalline silicon PV is based on the use of crystalline silicon solar cells, starting with mono-crystalline or multi-crystalline silicon wafers made of czochralski (CZ) silicon ingots or cast silicon bricks. Non-crystalline-silicon-based thin film PV modules (e.g., such as CdTe, CIGS, organic, and amorphous silicon PV modules) may offer the potential for low cost manufacturing process, but typically provide much lower conversion efficiencies (in the range of single digit up to about 14% in STC module efficiency) for commercial thin-film PV modules compared to the mainstream crystalline silicon PV modules (which provide module efficiencies in the typical range of approximately 14% up to about 20%, and mostly in the range of about 14% to 17%, for commercial crystalline silicon modules), and an unproven long-term track record of field reliability compared to the well-established crystalline silicon solar PV modules. The leading-edge crystalline silicon PV modules offer superior overall energy conversion performance, long-term field reliability, non-toxicity, and life cycle sustainability compared to various other PV technologies. Moreover, recent progress and advancements have already driven the overall manufacturing cost of crystalline silicon PV modules to at or below approximately $0.65 to $0.80/Wp. Disruptive monocrystalline silicon technologies—such as high-efficiency thin monocrystalline silicon solar cells fabricated based on the use of reusable crystalline silicon templates, thin (e.g., crystalline silicon absorber thickness from approximately 10 μm up to about 100 μm, and typically ≤70 μm) epitaxial silicon, thin silicon support using backplane attachment/lamination, and porous silicon lift-off technology—offer the promise of high-efficiency (with solar cell and/or module efficiencies of at least 20% under Standard Test Conditions or STC) and PV module manufacturing cost at well below $0.50/Wp at mass manufacturing scale.

FIG. 1A is a schematic showing the equivalent circuit of a typical solar cell, such as a crystalline silicon solar cell or a compound semiconductor such as a GaAs solar cell. A solar cell may be represented as a current source, producing the photo-generation or light-induced current shown as $I_L$ or also known as short circuit current Isc (the current that flows when the solar cell base and emitter terminals are electrically shorted), in parallel with a diode, also in parallel with a parasitic shunt resistance, and in series with a parasitic series resistance. The electrical current produced by the current source depends on the level of sunlight irradiation power intensity on the solar cell. Undesirable dark current $I_D$ is produced by the recombination losses in the solar cell. Voltage across the solar cell when its terminals are open and not connected to any load is known as Voc or open-circuit voltage. A realistic solar cell equivalent circuit also includes the finite series resistance $R_S$ and the finite shunt resistance $R_{SH}$, as shown in the circuit schematic diagrams of FIGS. 1A and 1B. In an ideal solar cell, the series resistance $R_S$ is zero (i.e., no series resistance ohmic power losses) and the shunt resistance $R_{SH}$ is infinite (no shunt resistance power dissipation losses). However, in actual and realistic solar cells, the finite (non-zero) series resistance is due to the fact that a solar cell has parasitic series resistance components in its semiconductor absorber layer and in the metallization structure (i.e., it is not a perfect electrical conductor). Such parasitic resistance components, including semiconductor layer resistance and metallization resistance result in some ohmic losses and power dissipation (and hence, Fill Factor degradation) during the solar cell operation. The finite (non-infinite) shunt resistance is caused by the undesirable leakage of current from one terminal to the other due to detrimental effects such as area-based and edge-induced (including but not limited to imperfect edge isolation) shunting defects as well as other non-idealities in the solar cell. Again, an ideal solar cell would have a series resistance of zero and a shunt resistance of infinite resistance value.

FIG. 2A is again a schematic showing an equivalent circuit model of the solar cell, showing the current source, photo-generation current, and dark current (but not showing the parasitic series and shunt resistance components), and FIG. 2B is a corresponding qualitative current-voltage (IV) graph showing the typical current-voltage (IV) characteristics of a solar cell such as a crystalline silicon solar cell, with and without sunlight illumination on the cell. $I_L$ and $I_D$ are the desirable active photo-generated current and the undesirable dark current of the solar cell, respectively.

Solar cells used in photovoltaic (PV) modules are essentially photodiodes—they directly convert the sunlight arriving at their light-receiving surface to electrical power through photo-generated charge carriers (typically electrons and holes) in the semiconductor absorber. In a module with a plurality of solar cells, any shaded cells cannot produce the same amount of electrical power (or electrical current) as the non-shaded cells laminated within the same PV module. Since all the cells laminated in a typical PV module are usually connected in series strings, differences in power also cause differences in photo-generated electrical currents through the cells (shaded vs. non-shaded cells). If one attempts to drive the higher current of the series-connected non-shaded cells through a shaded (or partially shaded) cell which is also connected in series with the non-shaded cells, the voltage of the shaded cell (or partially shaded cell) actually becomes negative (i.e., the shaded cell effectively becomes reverse biased). Under this reverse bias condition the shaded cell is consuming or dissipating significant power instead of producing power. The power consumed and dissipated by the shaded or partially-shaded cell will cause the cell to heat up, creating a localized hot spot within the module where the shaded cell is located, and eventually possibly causing permanent cell and module failure, hence creating major reliability failure problems in the field (unless protective measures are implemented).

A standard (i.e., typically a PV module comprising 60 solar cells) crystalline silicon PV module is typically wired into three 20-cell (or 24 cells in the case of 72-cell modules or 32 cells in the case of 96-cell modules) series-connected strings within the PV module, with each string of 20 cells protected by an external bypass diode (typically either a pn junction diode or a Schottky diode) placed in an external junction box. These strings of 20 cells are electrically connected in series to each other within the junction box to form the final PV module assembly electrical interconnections and to provide the output electrical leads of the module, typically comprising series-connected solar cells. As long as the PV module receives relatively uniform solar irradiation on its surface and no cells are shaded, the cells within the module will produce essentially equal amounts of power (and electrical current), with a cell maximum-power voltage or $V_{mp}$ on the order of approximately ~0.5 V to 0.6 V for most crystalline silicon PV modules. Hence, the maximum-power voltage or $V_{mp}$ across each string of 20 cells connected in series will be approximately on the order of 10 to 12 V for a 60-cell PV module comprising three 20-cell series-connected sub-strings using crystalline silicon cells. Under a uniform module illumination condition, each external bypass diode will have about −10 to −12 V reverse bias voltage across its terminals (for instance, while the module operates at its maximum-power point or MPP) and the bypass diode remains in the reverse-biased OFF state (hence, there would be no impact on the module power output by the reverse biased external bypass diodes located in the junction box). In the case where a solar cell in a 20-cell string is partially or fully shaded, it produces less electrical power (and less electrical current) than the non-shaded cells. Since the cells in the string are usually connected in electrical series, the shaded solar cell effectively becomes reverse biased and starts to dissipate electrical power, and therefore, would create localized hot spot at the location of the reverse-biased shaded cell, instead of producing power. Unless appropriate precautions are taken, the power dissipation and the resulting localized heating of the shaded cell may result in poor cell and module reliability due to possible catastrophic failure (such as failure of the reverse-biased shaded cell, failure of cell-to-cell electrical interconnections, and/or failure of the module lamination materials such as the module encapsulant and/or backsheet), as well as possible fire hazards due to excessive heating or hot spots in the installed PV systems.

Crystalline silicon modules often use external bypass diodes in order to eliminate the above-mentioned hot-spot effects caused by the partial or full shading of solar cells, and to prevent the resulting potential cell and module reliability failures and safety hazards due to cell reverse bias heating. Such hot-spot phenomena, which are caused by reverse biasing of the shaded cells, may permanently damage the affected PV cells and even cause fire hazards if the sunlight arriving at the surface of the PV cells in a PV module is not sufficiently uniform (for instance, due to full or even partial shading of one or more solar cells). Bypass diodes (rectifiers) are usually placed across the sub-strings of solar cells within the PV module, typically one external bypass diode per sub-string of 20 solar cells in a standard 60-cell crystalline silicon solar module with three 20-cell sub-strings (the configuration may be one external bypass diode per sub-string of 24 solar cells in a 72-cell crystalline silicon solar module with three 24-cell sub-strings; many other configurations are possible for modules with any number of solar cells). This connection configuration with external bypass diodes across the series-connected cell strings prevents the reverse bias hot spots in the modules and enables the PV modules to operate with high reliability throughout their lifetime under various real life shading or partial shading or soiling conditions. In the absence of cell shading, each cell in the string acts as a current source with relatively matched current values with the other cells in the sub-string, with the external bypass diode in the sub-string being reversed biased with the total voltage of the sub-string in the module (e.g., 20 cells in series create approximately about 10 V to 12 V reverse bias across the bypass diode in a crystalline silicon PV module). With shading of a cell in a sub-string, the shaded cell is reverse biased, turning on the bypass diode for the sub-string containing the shaded cell, thereby allowing the current from the good solar cells in the non-shaded sub-strings to flow through the external bypass diode associated with the sub-string with a shaded cell. While the external bypass diodes (typically three external bypass diodes included in the standard mainstream 60-cell crystalline silicon PV module junction box) protect the PV module and cells in case of shading of the cells, they can also actually result in significant loss of power harvesting and energy yield for the installed PV systems as a result of shading losses.

FIGS. 3A and 3B are diagrams of representative 60-cell crystalline silicon solar module with three 20-cell sub-strings 2 (with 20 cells in each sub-string connected in series) connected in series, and three external bypass diodes 4 to protect the cells during shading or excessive partial shading of any cells in the module (FIG. 3A shows single-cell shading, shaded cell 6, and FIG. 3B shows multi-cell partial shading conditions, partially shaded row 8). As an example, FIG. 3A shows a 60-cell module with 1 shaded cell in the bottom row (one 20-cell sub-string affected by even a single-cell shading) and FIG. 3B shows a 60-cell module with 6 partially shaded cells in the bottom row (three 20-cell sub-strings all affected by shading). If one or more cells are shaded (or partially shaded to a significant degree of shading) in a sub-string (as shown in FIG. 3A), the external bypass diode for the sub-string with the shaded cell(s) is activated and shunts the entire sub-string, thus both protecting the shaded cell(s) by preventing the hot spots and also reducing the effective module power output by about ⅓ (if only one sub-string out of three is affected by solar cell shading). If at least one cell per sub-string is shaded (as shown in FIG. 3B), all three bypass diodes are activated and shunt the entire module, thus preventing extraction of any power from the module when there is at least one shaded or partially shaded cell in each of the three 20-cell sub-strings.

As an example, a typical prior art external PV module junction box may house three external bypass diodes in a 60-cell crystalline silicon solar module. The external junction box and related external bypass diodes contribute to a portion of the overall PV module Bill of Materials (BOM) cost and may contribute about 10% (or about 5% to 15%) of the PV module BOM cost (i.e., as a percentage of the PV Module BOM cost excluding the cost of solar cells). Moreover, the external junction box may also be a source of field reliability failures and fire hazards in the installed PV systems. While most current crystalline silicon PV modules predominantly use external junction boxes with external bypass diodes placed in the junction box, there have been some examples of PV modules with front-contact cells placing and laminating the three bypass diodes directly within the PV module assembly, but separate from the front-contact solar cells, during the module lamination process (however, still using one bypass diode per 20-cell sub-string of front-contact cells). This example still has the limitations of external bypass diodes, i.e., even when a single cell is shaded, the bypass diode shunts the entire substring of cells with the shaded cell within the sub-string, thus, reducing the power harvesting and energy yield capability of the installed PV system.

One known prior art method to minimize the reliability failure effects of shading on a module in a series string of modules is to use bypass diodes across modules connected in series, as schematically shown in FIGS. 4A and 4B along with an example circuit depicted in FIG. 5. This configuration is in effect the same as the modules with external bypass diodes within each module junction box. FIG. 4A shows a non-shaded current path for a series-connected string of solar PV modules and FIG. 4B shows the same series-connected string of solar PV modules with one module shaded and the associated bypass diode across the shaded module shunting the module and providing an alternative bypass current path for the series string. FIG. 5 is a schematic circuit model diagram of a plurality of series-connected solar cells with an external bypass diode used in a module sub-string or string (each solar cell shown with its equivalent electrical circuit diagram, comprising a current source, a rectifier diode, as well as parasitic series and parallel resistance elements). If none of the cells in a series-connected string are shaded, the bypass diode remains in the reverse bias state and the solar cell string operates normally, contributing fully to the solar module power generation. If any of the cells are partially or fully shaded, the shaded cell(s) (hence, all the solar cells in the series-connected string) is (are) reverse biased and the external bypass diode is, therefore, forward biased, hence, eliminating the possibility of a hot spot, reliability failure, and/or damage to the shaded cell(s). In other words, when at least a portion of a PV module becomes shaded, its bypass diode becomes forward biased and conducts electrical current preventing performance degradation and reliability problems in the series string of modules. The bypass diode holds the voltage of the entire shaded module (or a sub-string with at least one shaded cell) to a small negative voltage (e.g., −0.5V to 0.7V) limiting the overall power reduction in the module string array output.

FIG. 6 is a graph showing the current-voltage (I-V) characteristics of a typical crystalline solar cell with and without a bypass diode (example shown with a pn junction bypass diode; for Schottky diode the actual voltage drop would be less). The bypass diode limits the maximum reverse bias voltage applied across a shaded solar cell to no more than the turn-on forward bias voltage of the bypass diode (e.g., between about 0.3V-0.5V and 0.6V-0.7V for Schottky or pn junction bypass diodes, respectively).

FIG. 7 is a diagram showing a representative example of a crystalline silicon PV module similar to that of FIGS. 4 and 5 with one shaded (or partially shaded) cell per 20-cell sub-string within a 60-cell module (such as shaded cell 10, three cells are shaded total, as shown in this representative example) wherein the three shaded cells in the three 20-cell sub-strings result in the elimination of electrical power provided by the entire solar PV module since all three 20-cell sub-strings are shunted by their external bypass diodes to protect the shaded cells. Using an arrangement of one external bypass diode per 20-cell sub-string, the result of having three shaded cells in the three 20-cell sub-strings is that the electrical power extracted from the PV module essentially drops to zero even though only 3/60 of the module (or 3 out of 60 cells) is affected by shading. Again, this type of prior art PV module arrangement with external bypass diodes can result in significant energy yield reduction and power harvesting penalty for the installed PV systems in the field, particularly in the installations which are most susceptible to module shading and/or soiling conditions.

In crystalline silicon PV system installations with multiple module strings, the module shading effects and their detrimental impact on power harvesting and energy yield may be much larger than the examples shown above with a single series string of modules. In solar PV systems with multiple parallel strings of series-connected module strings, the parallel strings must produce approximately the same voltage as one another (i.e., the voltages of parallel strings must be closely matched, or else, there will be significant power losses). As a result, the electrical constraint of having all module strings connected in parallel operating at approximately the same voltage does not allow full flexibility for a shaded string to activate its bypass diodes without significant installed PV array power loss. Therefore, in essentially all cases, shade or even partial shading on PV modules affecting even one cell within one of the strings may actually cut off the power produced by the entire string. As a representative example, consider one non-shaded PV module string and one PV module string that is shaded as described in the previous example above. A Maximum-Power-Point-Tracking (MPPT) capability will enable the production of full power from the first PV module string and the production of 70% of full power from the second PV module string. In this way, both strings reach the same voltage (the currents from the parallel strings are additive at the same module string voltage for the parallel connected strings of series-connected modules). Therefore, in this example and using a centralized DC-to-AC inverter with centralized MPPT, the power produced by the PV module array would be 85% of the maximum possible power without any module shading. This represents a 15% power loss for the PV system.

FIGS. 8 and 9 are diagrams showing two examples of known PV system installations. FIG. 8 shows example of a prior art 3×6 array of PV modules (for instance, each with 50 W output) with bypass diodes connected to produce 600 V DC, 900 W PV output. FIG. 9 shows a series connection of 3 PV modules with external module bypass diodes and a blocking diode along with a charging battery. In conventional crystalline solar PV modules, the module strings connected in series and in parallel may typically use external bypass (and also blocking diodes in case of battery charging circuits). However, similar to previously described examples, these representative prior art PV module installations suffer from the electrical power harvesting limitation and reduced energy yield of the installed PV system due to the problems or performance constraints outlined earlier.

Another representative example of a prior art implementation is the monolithic compound semiconductor bypass diode used with a front-contact (emitter contact fingers and busbars on the front-side of the solar cell), compound semiconductor (III-V) on germanium substrate, multi junction solar cell, primarily for Concentrator PV (or CPV) applications. FIG. 10 is a diagram showing an example of this prior art monolithic bypass diode with a front-contact multi junction compound semiconductor CPV solar cell fabricated using compound multi junction solar cell layers on a starting germanium substrate (in order to provide relatively close lattice matching for growth of the multi-junction solar cell layer). This prior art example shows a multi-layer compound semiconductor Schottky diode used as a so-called bypass diode on the same starting germanium (Ge) wafer also used for making a front-contacted compound semiconductor, multi junction solar cell for CPV applications. In this example, the Schottky bypass diode and the compound semiconductor (gallium arsenide and its ternary III-V alloys in this prior art case), multi junction solar cell are both on the same side (top side) of the solar cell, with electrical contacts on both the solar cell sunnyside and opposite the sunnyside on the backside, and have different material layer stacks (i.e., the deposited and processed material stack used for the Schottky diode is quite different from the deposited and processed material stack used for the multi junction solar cell), thereby making the solar cell fabrication process much more complicated (due to the added manufacturing process steps and additional material layers used for the Schottky diode device) and costly (hence, such embodiment only demonstrated for the CPV application in which the CPV cells are quite expensive, far more expensive than the crystalline silicon solar cells as well as other non-CPV solar cells). Another limitation and potential manufacturing yield and complexity problem with this prior art implementation is that the material stack thicknesses or heights of the multi junction solar cell and the Schottky diode are different. This represents further challenges and added process complexity for implementation of the monolithic metallization contacts and interconnections of the solar cell and the Schottky diode. As a result of this prior art monolithic Schottky bypass diode with the expensive multi junction solar cell on the same expensive germanium substrate, the overall process complexity due to added process steps and manufacturing cost of this prior art multi junction solar cell embodiment are substantially and further increased, while incurring an effective solar cell and solar module (and installed PV system) efficiency penalty or loss due to the integration of the Schottky bypass diode on the same side as the active sunnyside of the cell (and the fact that the relative area ratio of the bypass diode to the relatively small active CPV multi junction cell area is rather large). This monolithic bypass Schottky diode made on a germanium substrate with a front-emitter-contacted compound semiconductor multi junction solar cell requires substantially different stacks of material layers in the solar cell and in the bypass diode, hence, substantially complicating the overall monolithic solar cell and Schottky diode processing, increasing the number of solar cell fabrication process steps, and raising its overall manufacturing cost. While such significant added processing complexity due to added process steps and cost increase for fabrication of the solar cell may be acceptable in a CPV solar cell due to the relatively high concentration ratios used, it cannot be economically viable or practical in a non-very-high concentration-CPV solar cell such as in crystalline silicon solar cells.

FIG. 11 is a diagram showing an example of a known monolithic bypass diode with a multi junction compound semiconductor CPV cell. All of the constraints and limitations (including process complexity and cost) of the monolithic Schottky bypass diode of the prior art structure shown in FIG. 10 also apply to the one depicted in FIG. 11. This prior art example shows a pn junction diode (instead of a Schottky diode) used as monolithic bypass diode on the same germanium (Ge) substrate as a compound semiconductor, multi junction (with a combination of ternary GaAs alloys used in a multi-layer structure) solar cell. In this example, the pn junction bypass diode and the compound semiconductor, multi junction solar cell are both on the same side (top side) of the solar cell, and have different material stacks (hence, processes and material layers not harmonized with respect to each other), thereby making the solar cell fabrication process much more complicated and costly (hence, such embodiment only demonstrated for the CPV application in which the CPV multi junction solar cells are much more expensive than the non-CPV single junction solar cells). In this prior art example, as a result of monolithic integration of the pn junction bypass diode with the solar cell on the same expensive germanium substrate (for subsequent growth of relatively lattice matched III-V binary and ternary compound semiconductor layers), the overall manufacturing process complexity and cost are further increased while incurring an effective solar cell and solar module (and installed CPV system) efficiency penalty due to the integration of the bypass diode on the same side as the active sunnyside of the cell, and due to the dis-similar material stack structures used in the CPV solar cell and the associated pn junction diode). Again, this monolithic integration of the bypass pn junction diode on a front-contact compound semiconductor multi junction CPV solar cell requires different stacks of material layers in the solar cell and in the bypass diode, hence, substantially complicating the overall monolithic solar cell structure and its fabrication processing, increasing the number of solar cell fabrication process steps, and raising its manufacturing cost. While such significant added processing complexity and cost increase for fabrication of the solar cell may be acceptable in an expensive and complex CPV solar cell used for CPV systems, it cannot be economically viable in a non-CPV (non-very-high-concentration-PV) solar cell such as in the much more widely used crystalline silicon solar cells and modules.

In general, while the prior art monolithic integration of the bypass diode (Schottky diode or pn junction diode) as shown, on an expensive multi junction front-contact solar cell on an expensive germanium substrate for very high concentration CPV applications, may be acceptable (although far from being a low-cost solution) for that specific application despite the extra processing steps and lack of harmonization between the material stacks and process steps, extra manufacturing cost, and added manufacturing process complexity of the monolithic integration with the solar cell, the prior art approaches demonstrated for the expensive compound semiconductor multi junction solar cells on expensive starting substrates (with expensive MOCVD-grown multi-junction compound semiconductor material stacks) would be prohibitively too complex, expensive, and not acceptable for mainstream flat-panel (non-concentrating or low to medium concentration) low-cost solar PV cells and modules. Also, as noted previously, because the prior art method of monolithic integration of the bypass diode consumes a fairly large area fraction, otherwise used by the expensive solar cell, it reduces the effective area for sunlight absorption and hence the effective cell efficiency due to loss of sunlight absorption area. In prior art demonstration of the monolithic bypass diode with an expensive compound semiconductor multi junction solar cell on an expensive germanium substrate, the electrical metallization and contacts of the solar cell and the bypass diode are on both sides of the devices and the substrate, including both on the sunnyside and on the backside of the substrate, making the overall monolithic interconnections of the solar cell and the bypass diode more complex and costly.

BRIEF SUMMARY OF THE INVENTION

Therefore, a need has arisen for high-efficiency solar cells, including but not limited to high-efficiency crystalline silicon solar cells as well as any crystalline semiconductor (using silicon and/or other semiconductor materials such as gallium arsenide-based) solar cells such as solar cells comprising a backplane and/or high-efficiency back-contact solar cells, with a bypass switch monolithically integrated with each solar cell, that provides distributed shade management, increased energy & power harvesting, and energy yield improvements for installed PV systems, as well as solar cell and PV module protection, based on a substantially harmonized manufacturing process flow and without increasing the solar cell manufacturing process complexity and cost as a result of such monolithic integration of cell-level bypass switches.

In accordance with the disclosed subject matter, a back-contact solar cell with at least one monolithically-integrated on-cell electronic bypass switch (MIBS) is provided which substantially eliminates or reduces disadvantages and energy yield harvesting limitations associated with previously developed solar photovoltaic cells and modules, as well as the limitations and disadvantages of known monolithic and non-monolithic bypass diode implementations.

According to one aspect of the disclosed subject matter, a back-contact solar cell with monolithically integrated on-cell power electronics, more specifically at least one monolithic bypass switch per solar cell, such as a Schottky diode (including but not limited to Super Barrier Schottky Diode) or a pn junction diode or a transistor-based switch, is provided. The back-contact solar cell is comprised of a semiconductor absorber substrate (for instance, a crystalline silicon absorber formed by epitaxial growth or from Czochralski wafers or from cast multi-crystalline wafers) having a light capturing front side and a backside opposite the light capturing front side, as well as a backplane. The backside may also serve as a secondary light-capturing surface in case of a bifacial solar cell. A first interdigitated metallization pattern (first metallization level known as M1) is positioned on the backside of the semiconductor substrate and a thin backplane sheet or material layer (for example made of an electrically insulating rigid or flexible material) is attached (for example laminated) to and supports the backside of the semiconductor substrate. Formation methods for patterned M1 include, but are not limited to, physical-vapor deposition (PVD) and patterning (laser ablation or masked wet or dry etch patterning) of a suitable metallic stack (e.g., comprising Al, NiV) or by direct printing (such as screen printing or stencil printing or inkjet printing) of a suitable metallic paste (such a suitable aluminum or aluminum-silicon alloy paste). A second interdigitated metallization pattern (second solar cell metallization level known as M2) is positioned on the backplane (and electrically isolated and separated from M1 by the backplane except for the pre-specified via holes through which conductive via plugs interconnect the M1 and M2 levels) and is electrically interconnected to the first interdigitated metallization pattern at designated sites through a patterned array of conductive via holes through the backplane (thus creating a patterned two-level metallization structure). At least one monolithically-integrated on-cell electronic component, such as an electronic bypass switch (e.g., Schottky diode or bypass diode or a transistor switch), is monolithically fabricated within the same semiconductor substrate used for fabrication of the solar cell, concurrent with and using essentially the same process steps utilized for the fabrication of the solar cell, and is electrically interconnected as a parallel bypass switch (e.g., including but not limited to a rectifying Schottky diode or pn junction diode) with the desired polarity to the solar cell terminals (e.g., the solar cell base and emitter terminals) using the patterned solar cell metallization structure (M1 and/or M2).

These and other aspects of the disclosed subject matter, as well as additional novel features, will be apparent from the description provided herein. The intent of this summary is not to be a comprehensive description of the claimed subject matter, but rather to provide an overview of some of the subject matter's functionality and embodiments. Other systems, methods, features and advantages here provided will become apparent to one with skill in the art upon examination of the following FIGUREs and detailed description. For instance, while the representative embodiments of this invention are presented and described for use with back-contact/back-junction solar cells using thin monocrystalline silicon absorbers with interdigitated (or interdigitated back-contact: IBC) metallization structures, it should be understood that the monolithically integrated bypass switch embodiments (various structures and processing methods) and concepts of this invention can be applied to other solar cell absorber materials and other solar cell structures made with any suitable semiconductor absorber materials, including but not limited to those (with crystalline silicon or structures comprising other semiconductor materials such as GaAs, GaN, etc.) with front-junction/back-contact (and non-interdigitated patterned interconnects), solar cells (with crystalline silicon or structures comprising other semiconductor materials such as GaAs, GaN, etc.) with both front emitter contact and backside base contact, solar cells made of materials other than monocrystalline silicon, solar cells using thicker semiconductor absorber layers than those described here, metallization wrap-through (MWT) solar cells, PERC and PERL solar cells, silicon heterojunction (SHJ) solar cells, etc. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings (various dimensions not shown to scale) in which like reference numerals indicate like features and wherein:

FIG. 4A is a diagram showing a non-shaded current path for a series-connected string of solar modules and FIG. 4B is a diagram showing the same series-connected string of solar modules with one module shaded and an external bypass diode providing an alternative bypass current path for the series-connected string of modules;

DETAILED DESCRIPTION

Figure 1A:
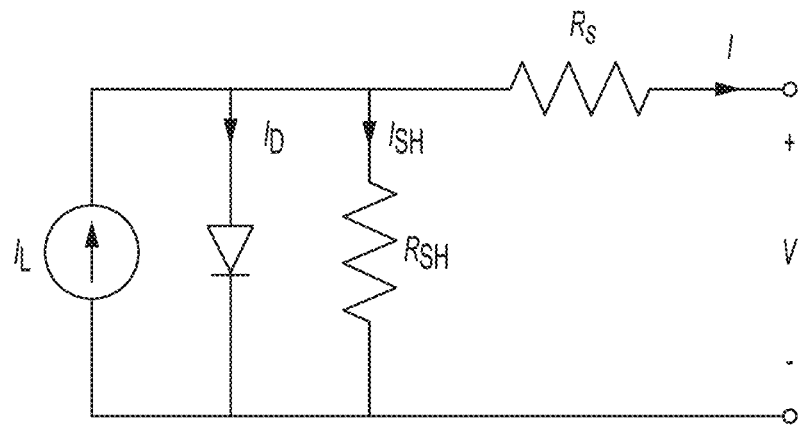
FIGS. 1A and 1B are electrical circuit schematics showing the equivalent circuit diagram for a solar PV cell, comprising a current source, a rectifying diode with the cell dark current, a parasitic finite series resistance, and a parasitic finite shunt resistance.
Figure 1B:
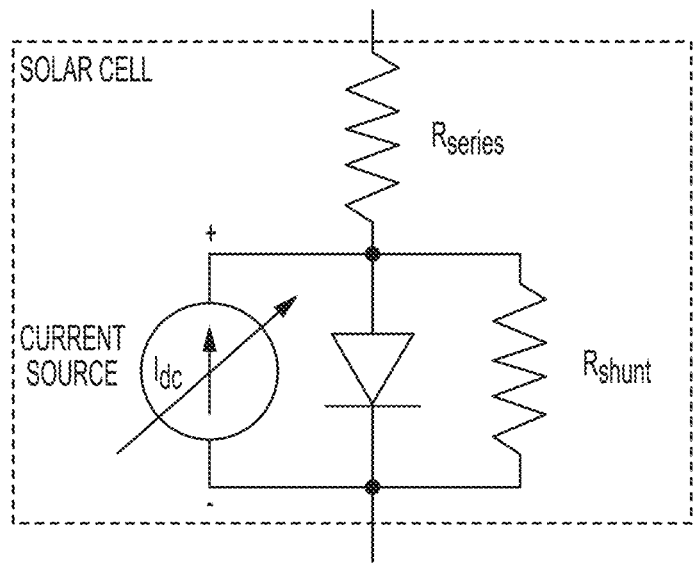
Figure 2B:
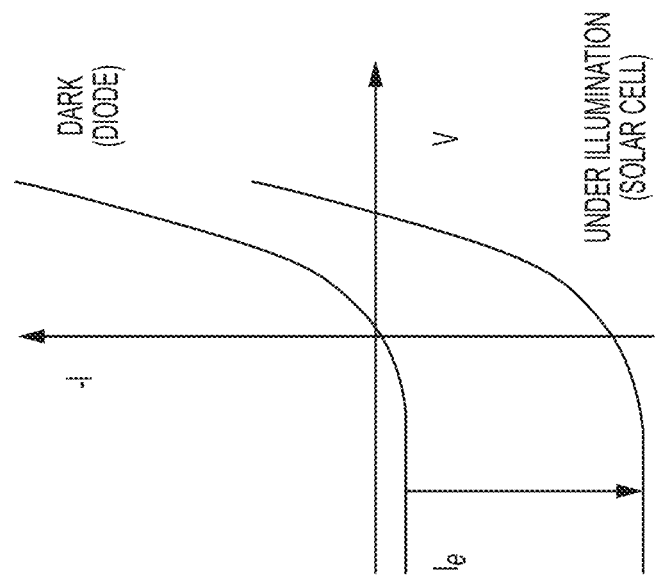
FIG. 2A is a schematic showing a simplified equivalent circuit model of an ideal solar cell (no parasitic series or shunt resistances shown) and FIG. 2B is a corresponding I-V graph showing the current-voltage (IV) characteristics of a solar cell under both dark and with sunlight illumination conditions.
Figure 2A:
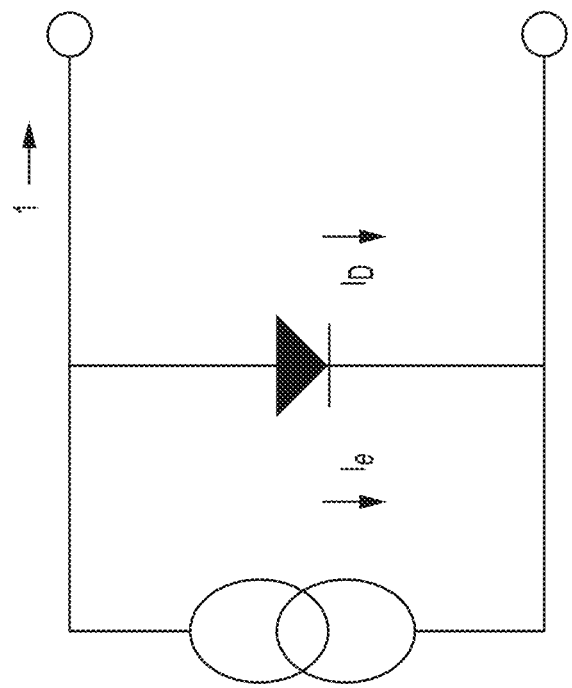
Figure 3B:
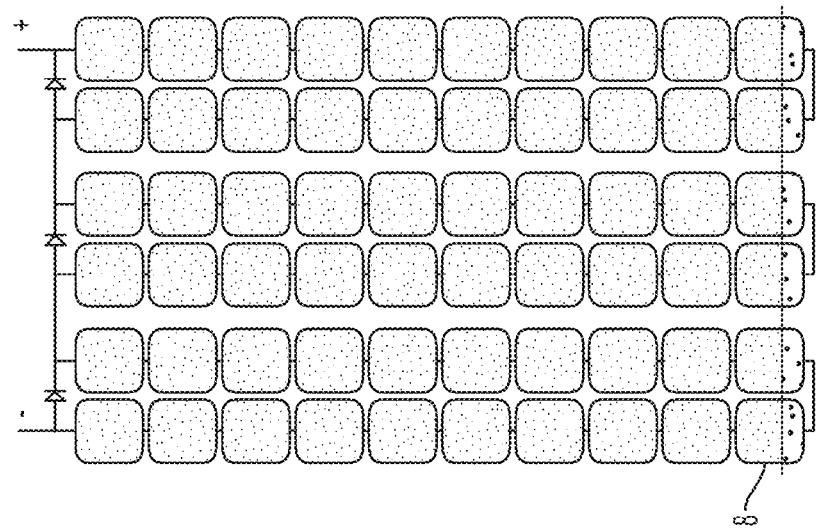
FIGS. 3A and 3B are representative diagrams of a typical 60-cell crystalline silicon solar module, with examples shown with one shaded cell (3A) and several partially shaded cells (3B), respectively.
Figure 3A:
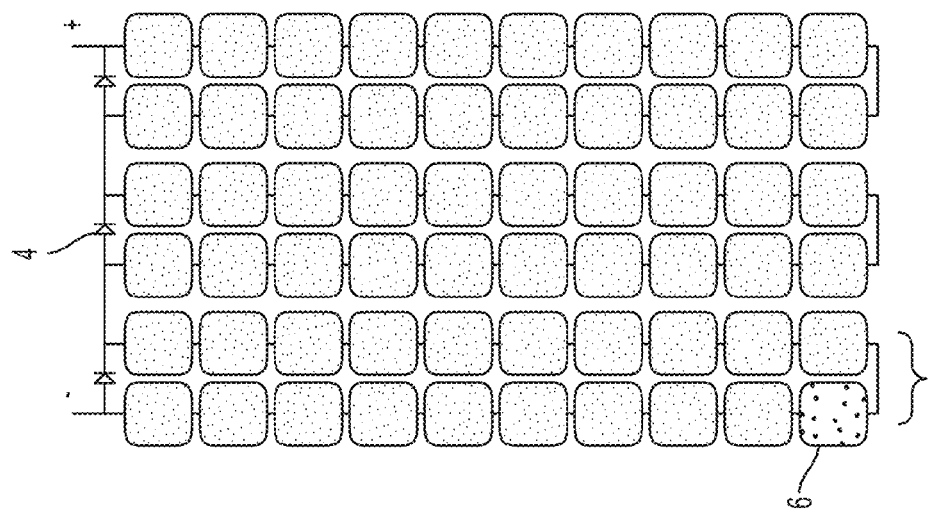
Figure 5:
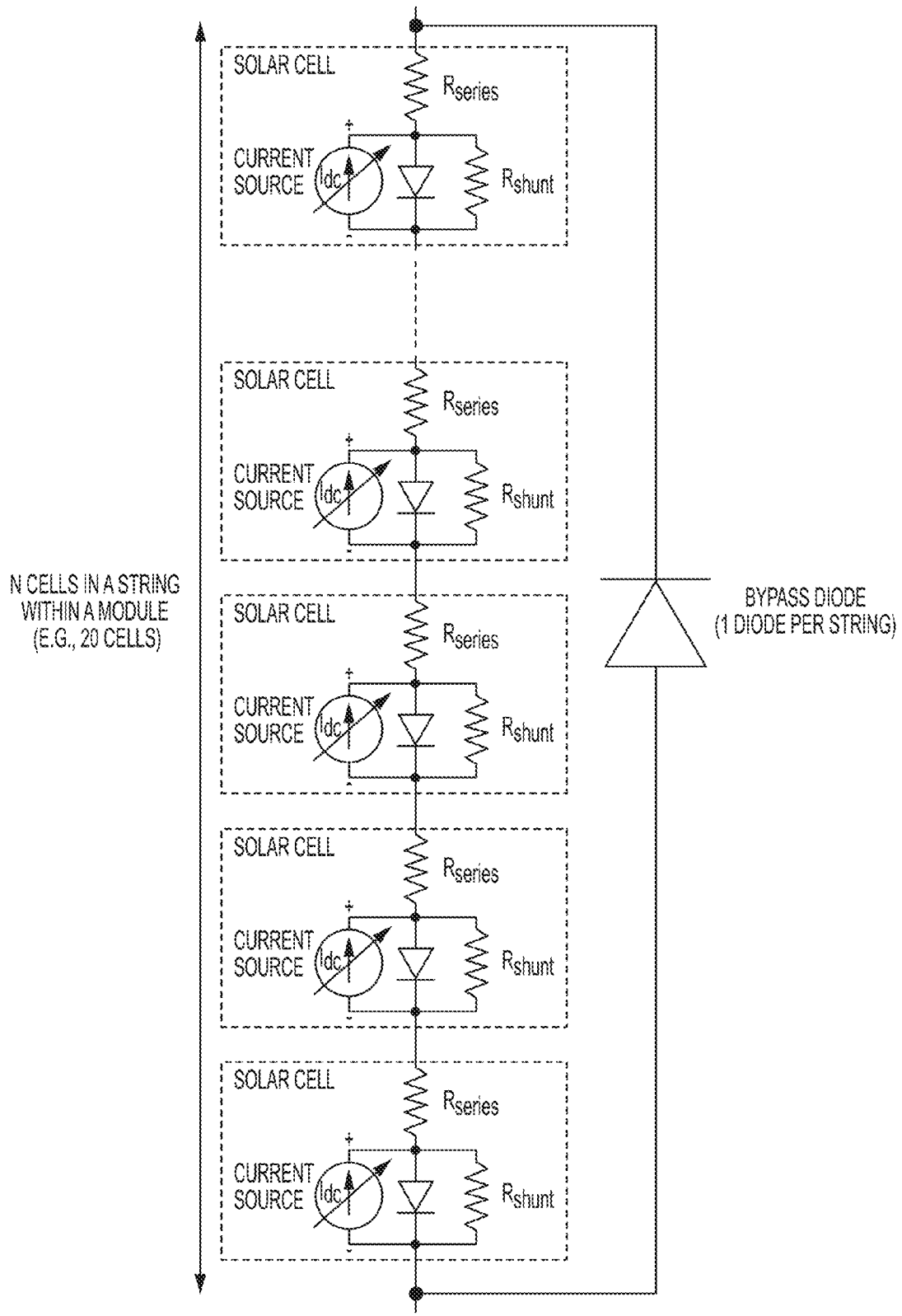
FIG. 5 is a schematic diagram of an external bypass diode used in a module sub-string comprising a plurality of series-connected solar cells, with the solar cells shown with their equivalent circuit diagrams.
Figure 6:
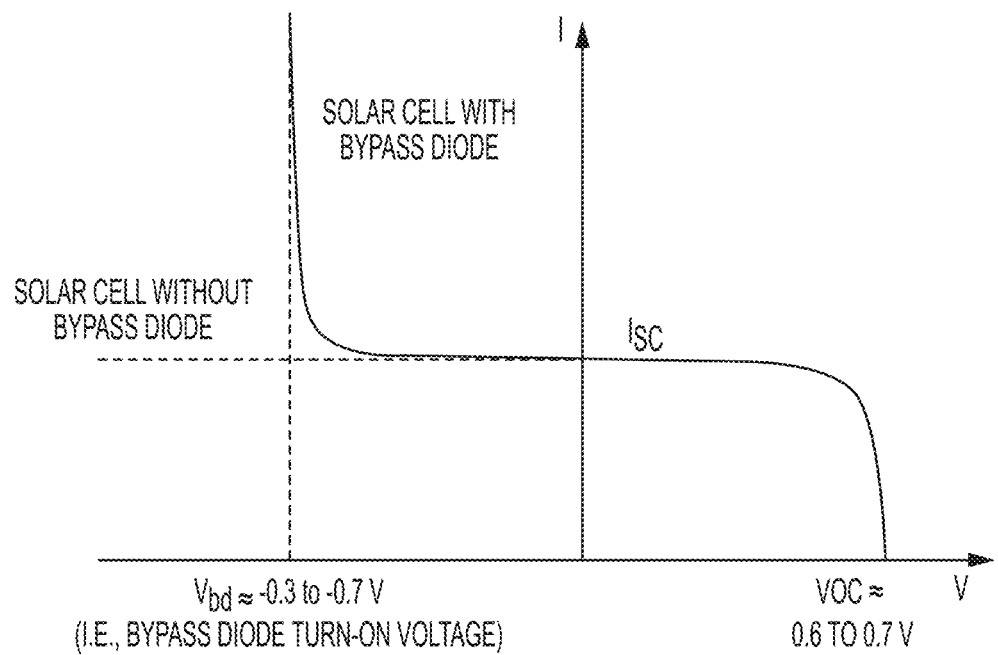
FIG. 6 is a graph showing the current-voltage (I-V) characteristics of a crystalline solar cell with and without a protective bypass diode.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

And although the present disclosure is described with reference to specific embodiments, such as back contact solar cells using monocrystalline silicon substrates, monocrystalline silicon such as epitaxial silicon solar cell absorber layers, and other described fabrication materials, one skilled in the art could apply the principles discussed herein to other solar cells based on different substrate types and/or solar cell structures and/or overall solar cell manufacturing methods, including the back-contact solar cells made using czochralski (CZ) monocrystalline silicon or cast multi-crystalline silicon starting wafers (hence, solar cell substrates without epitaxial silicon deposition), other back-contact solar cells (such as MWT back-contact solar cells), front contact solar cells made using either epitaxial silicon absorber or czochralski (CZ) silicon starting wafers or cast multi-crystalline silicon starting wafers, other fabrication materials including various semiconductor materials other than crystalline silicon (such as crystalline gallium arsenide, gallium nitride, germanium, etc.), technical areas, and/or embodiments without undue experimentation. Further, the dopant concentration/profile of the starting semiconductor layer, for example p-type or n-type, is known as background doping.

Accordingly, while the embodiments herein are described for interdigitated back-contact (i.e., IBC) crystalline (either monocrystalline or multi-crystalline) silicon solar cells, it should be understood that the inventive aspects disclosed may be applied to a much wider range of solar cell architectures (e.g., Metallization-Wrap-Through or MWT back-contact solar cells, front contact solar cells, bifacial solar cells, etc.) and materials (e.g., GaAs, Ge, etc. besides crystalline silicon).

As noted above, current state-of-the-art solar cell protection and solar module shade-induced hot spot prevention solutions providing reliable module operation in the presence of shading, in known crystalline silicon (or other cell-based) PV systems are often based on utilizing one or a combination of the following: separate or discrete bypass diodes, most commonly one external discrete bypass diode (usually placed and electrically wired in a photovoltaic module junction box) per one substring of series-connected solar cells (e.g., 20 or 24 cells per substring in 60-cell or 72-cell PV modules, respectively) in a PV module (typically three external bypass diodes are placed in an external module junction box per crystalline silicon PV module to provide shade-induced hot-spot protection for all the solar cells in the module); moreover, maximum power point tracking (MPPT) may be provided at the module level using an external micro-inverter (DC to AC), or alternatively a DC-to-DC converter, connected to the PV module; and/or, using a so-called programmable interconnect technology between the cells packaged within the module, in order to increase the energy yield of the cell-based PV module.

Figure 7:
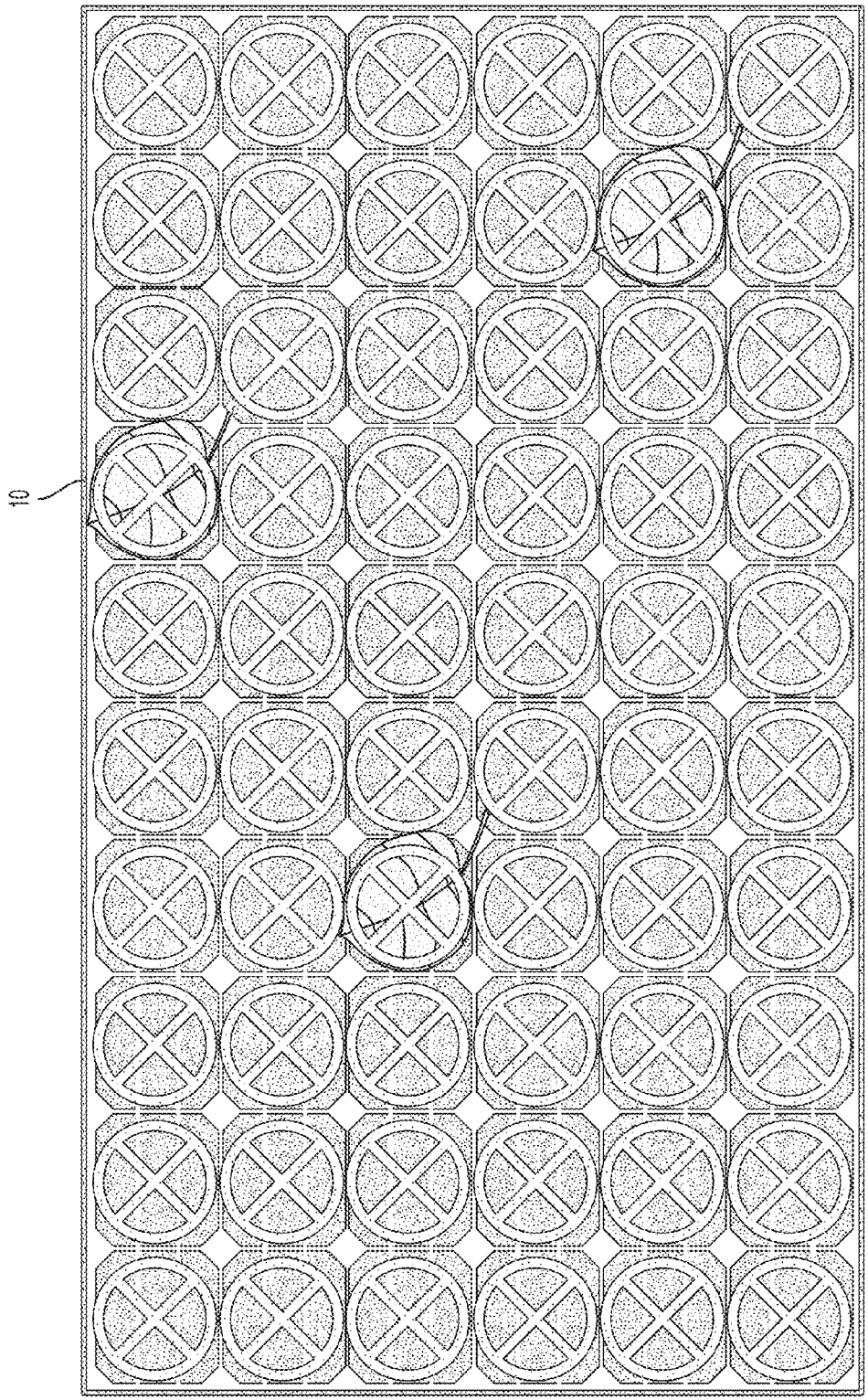
FIG. 7 is a diagram showing an example of a representative prior art 60-cell crystalline silicon PV module with three shaded cells on three different 20-cell sub-strings of the series-connected solar cells (with 3 external bypass diodes not shown—1 external bypass diode per 20-cell series-connected sub-string)
Figure 8:
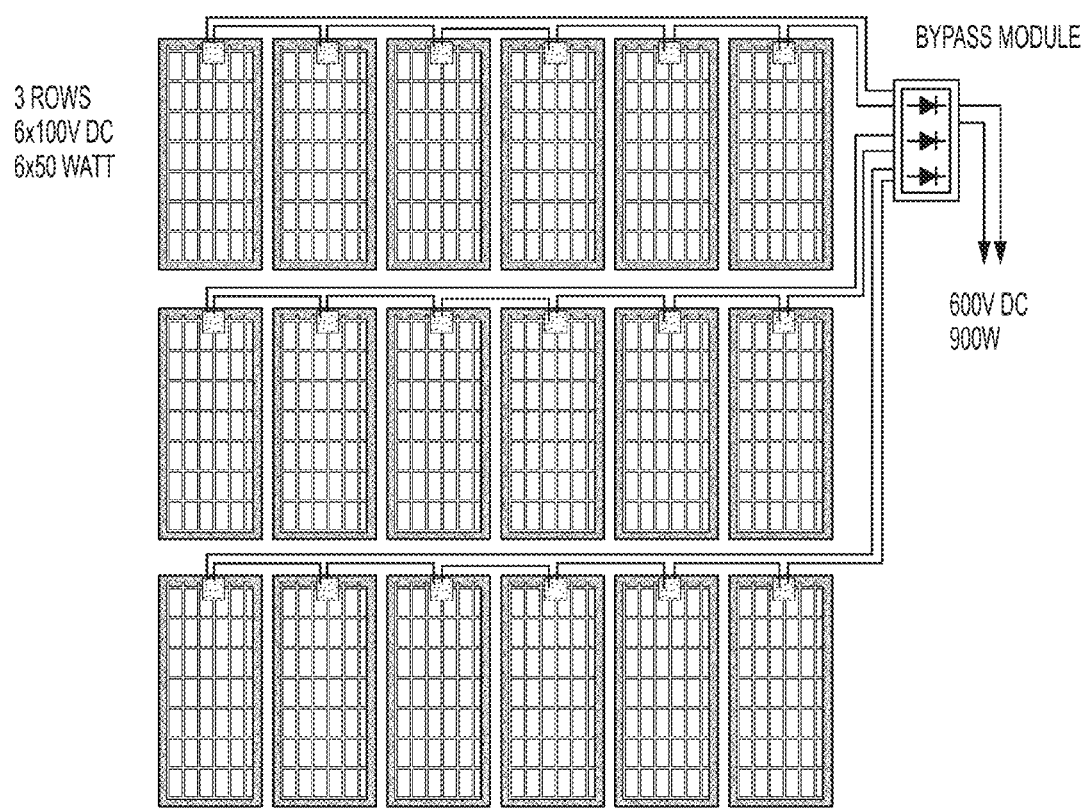
FIGS. 8 and 9 are diagrams showing two examples of representative prior art PV system installations comprising arrays of PV modules arranged in parallel and series module interconnections (FIG. 8 shown with external diodes in a bypass module) and all-series module interconnections (FIG. 9 shown with external module bypass diodes)
Figure 9:
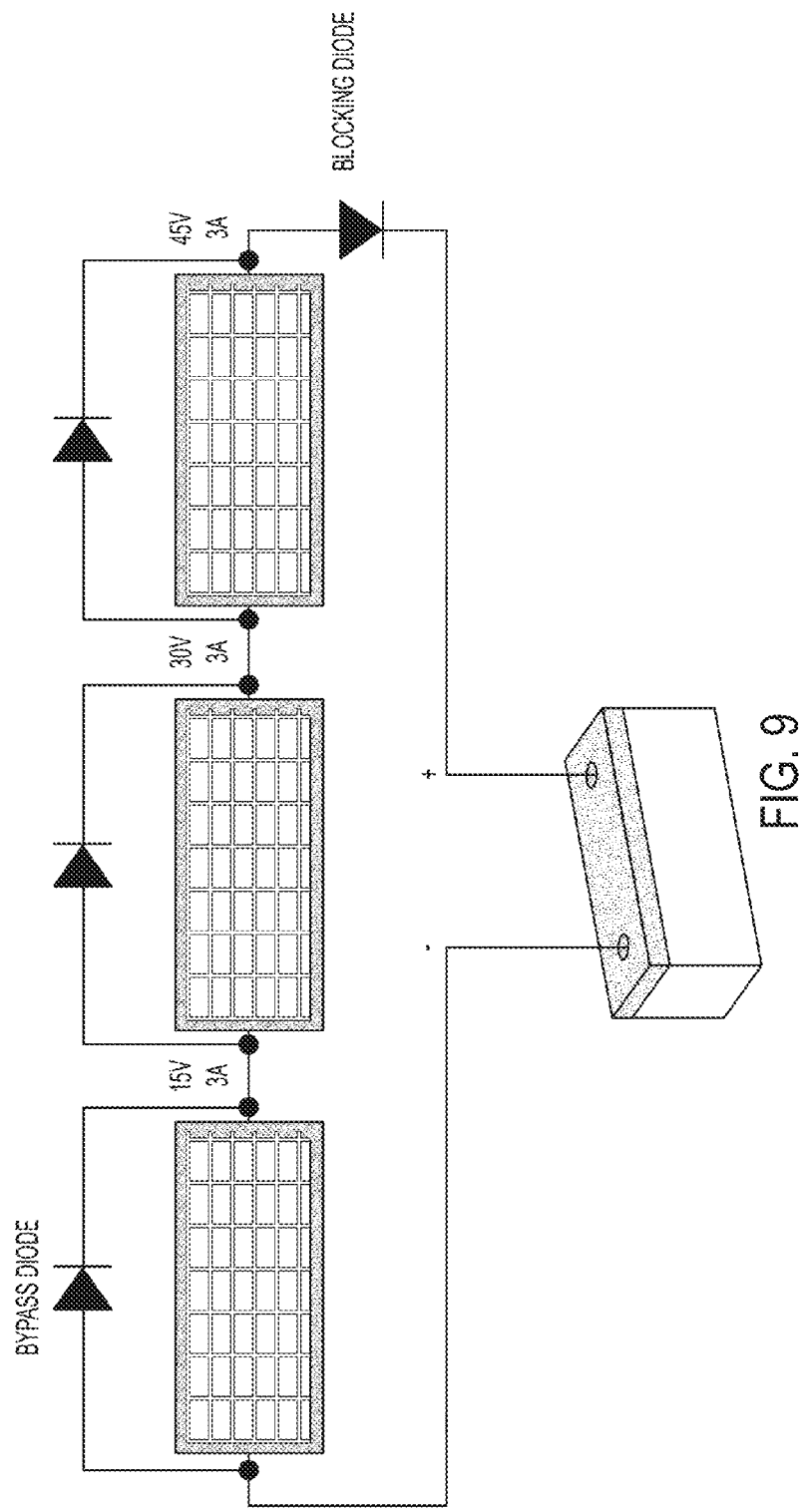
Figure 10:
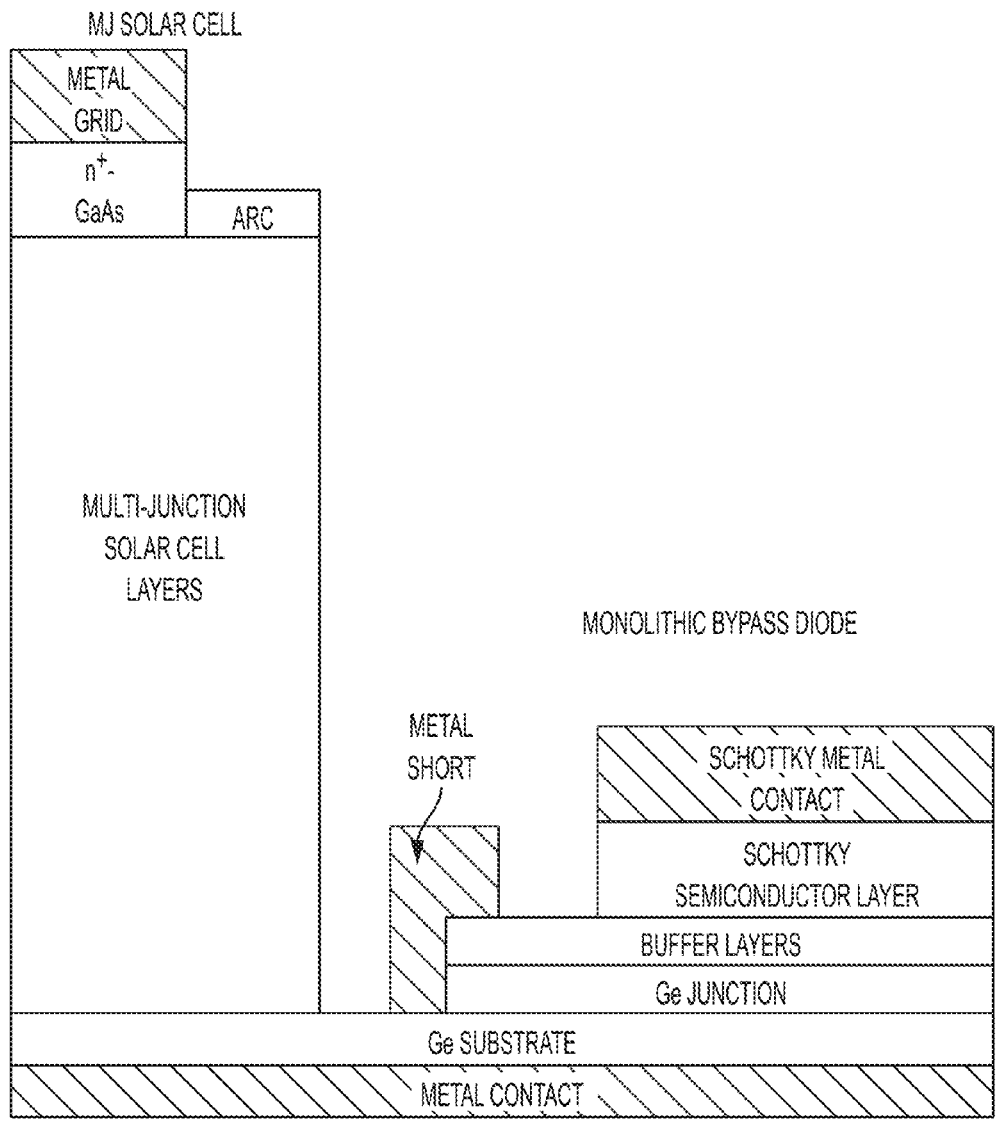
FIGS. 10 and 11 are diagrams showing the prior art monolithic integration of a compound semiconductor (GaAs-based) bypass diode (either Schottky diode or pn junction diode) with an expensive multi junction compound semiconductor concentrator PV (CPV) solar cell produced through an expensive compound semiconductor growth process on an expensive germanium substrate; the Ge and GaAs based multi junction solar cell material stack and fabrication process flow are different from and not harmonized with the bypass diode material stack and fabrication process flow, hence, resulting in significant additional process complexity and manufacturing cost as a result on adding the bypass diode (cell and bypass diode metallization formed on both frontside and backside of the devices in this demonstration)
Figure 11:
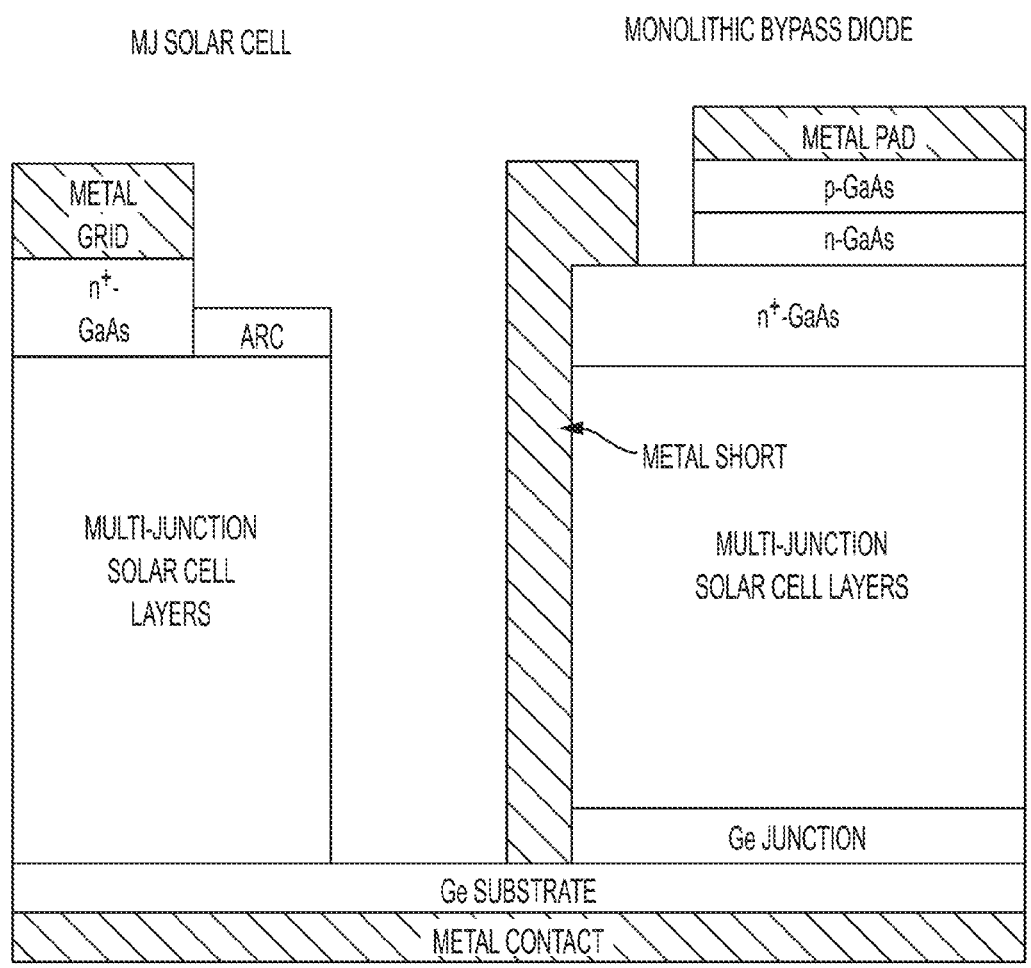

While the prior art bypass diodes are used to protect shaded cells, prevent hot spots, and prevent module failures due to hot spots and shaded (or partially shaded) reverse biased cells, they may also result in significant energy harvest degradation of energy yield reduction (in terms of kWh of energy harvested per KWp installed PV modules over a specified duration of field operation, such as on an annual basis) in realistic field operations due to module power extraction losses when module shading or soiling is present. For instance, assuming a standard 60-cell PV module design, a single shaded cell may result in loss of about ⅓ (or 33.33%) of the module power (the prior art external bypass diode in the junction box would bypass the entire 20-cell sub-string containing the shaded cell in order to prevent reverse biasing of the cell) while the single cell typically accounts for only about 1/60 of the total module power (for a typical 60-cell PV module) during normal non-shaded module operating conditions in the field. Similarly, with three shaded cells and assuming one shaded cell per 20-cell sub-string in a 60-cell PV module (an example of which is shown in FIG. 7), all three external bypass diodes are activated and the power extracted from the module drops to zero (or 100% loss of module power) while the three shaded cells account for only $3/60^{th}$ (or $1/20^{th}$) of the module power during normal non-shaded operating conditions.

In contrast, the distributed monolithic shade management solutions of this invention disclosed herein provide smart PV cells and smart PV modules with increased PV module power harvesting and increase energy yield using a Monolithically Integrated Bypass Switch (MIBS), which may be manufactured concurrently and monolithically integrated with each solar cell (thus eliminating the need for the external junction box with the external discrete bypass diodes), at essentially no incrementally added manufacturing cost while manufacturing the solar cells. The MIBS structures and implementation methods disclosed herein are also designed to increase the overall solar cell module reliability and extend operating lifetime in addition to other associated benefits.

In addition, the disclosed systems and methods enable smart PV cells and smart PV modules capable of integrating additional distributed cell-level (cellular) power electronics offering dramatic PV system cost and Levelized-Cost of Electricity (LCOE) reduction (supporting <$1/W installed PV system cost) and performance improvement in terms of energy yield (enabling less than about $0.10/kWh and even less than about $0.06/kWh Levelized Cost of Electricity or LCOE, depending on the specifics of PV installation sites and operating conditions). Important applications of the embodiments of this invention include cells and modules for the residential rooftop, Building-Integrated PhotoVoltaics (BIPV) in residential and commercial buildings, commercial rooftop, ground-mount utility-scale power plants, automotive, portable electronics, portable and transportable power generation, and other specialty applications.

Figure 12:
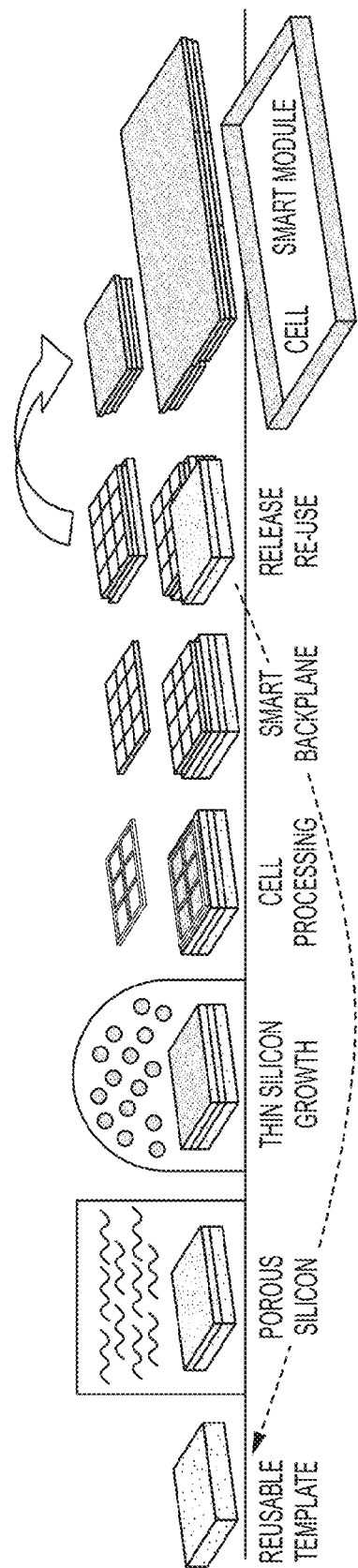
FIG. 12 is a representative process flow highlighting key processing steps of a thin-crystalline-silicon, back-contact/back-junction crystalline silicon solar cell manufacturing process using epitaxial silicon growth (this solar cell utilizes a backplane technology with two-level metallization for one embodiment of this invention). Embodiments may be applied to solar cells using this type of process flow as well as many other cell fabrication process flows including but not limited to the solar cells fabricated from starting monocrystalline wafers (e.g., Czochralski or CZ) or multi-crystalline wafers (from cast crystalline bricks) or epitaxial growth or other substrate fabrication methods.
Figure 13:
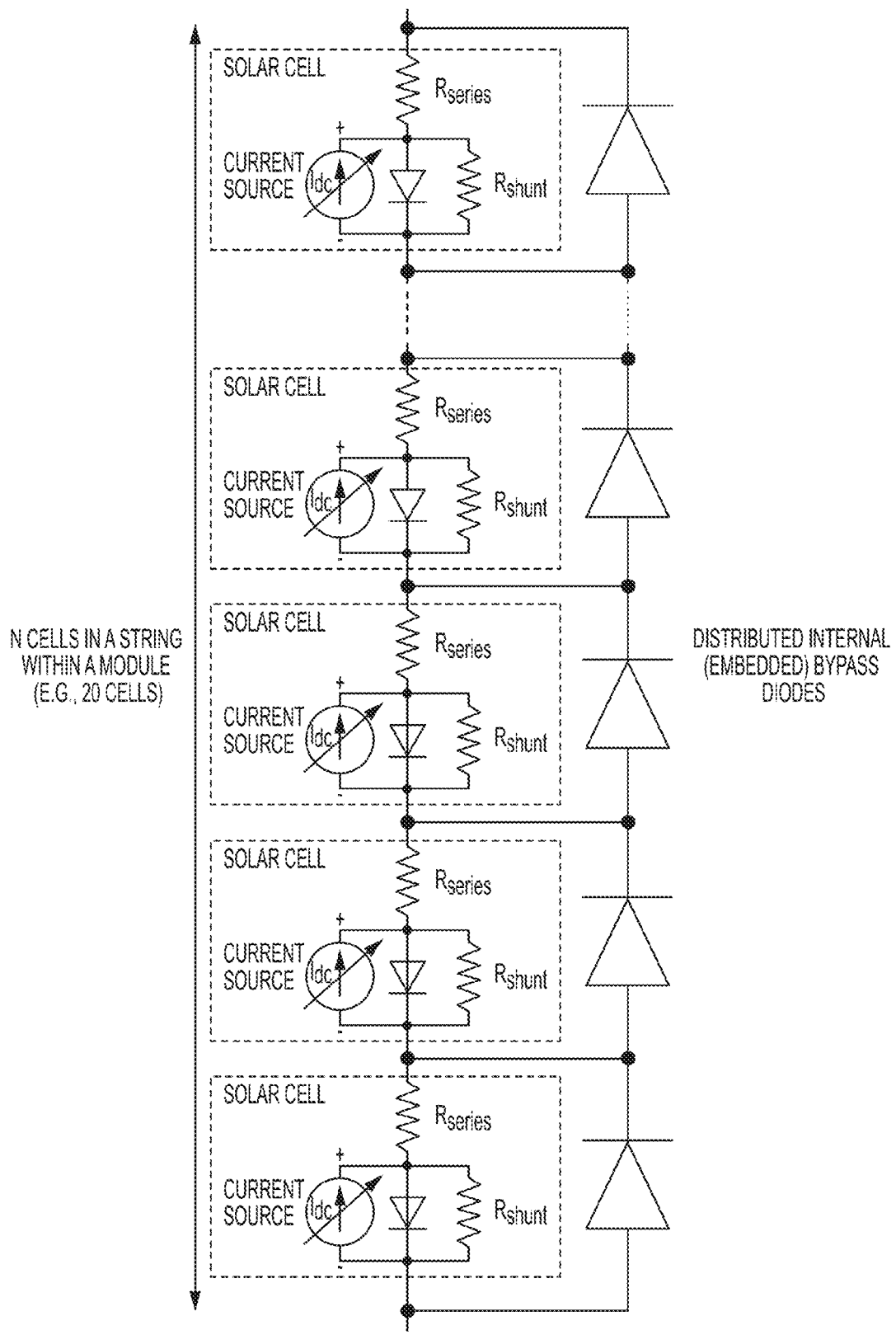
FIG. 13 is a schematic diagram showing a distributed cellular shade management system embodiment of this invention with one internal (embedded) monolithically-fabricated bypass switch (i.e., Schottky diode or pn junction diode or another semiconductor switch such as a transistor switch) per solar cell (solar cells shown with their equivalent circuit diagrams); the embodiments of this invention may use one internal monolithic bypass diode per cell or one internal monolithic bypass diode per plurality of solar cells or a plurality of internal monolithic bypass diodes per single solar cell (embodiments described here are presented for a single monolithic bypass diode per solar cell but it is understood that the designs, processes, and concepts of this invention are also applicable to the other above-mentioned arrangements)

As previously noted, crystalline silicon photovoltaics (PV) modules currently account for approximately over 85% of the overall global PV market. The silicon wafer material cost of these crystalline silicon PV modules currently constitutes approximately 30% to 50% of the total crystalline silicon PV module manufacturing cost. FIG. 12 is a representative process flow highlighting key processing steps of an epitaxial silicon/porous silicon based thin-crystalline-silicon back-contact/back-junction (also known as interdigitated back-contact or IBC) solar cell manufacturing process which substantially reduces silicon usage and eliminates several traditional manufacturing steps to create low-cost, high-efficiency, back-junction/back-contact monocrystalline cells. Specifically, this process flow produces high-efficiency solar cells with laminated backplanes (the backplane may be a relatively thin, such as about 50 microns to 200 microns in thickness, thin flexible or rigid electrically insulating sheet attached to the solar cell backside and enabling two-level metallization structure with on-cell M1 and on-backplane M2 metallization levels) for smart cells and smart modules using a reusable template and epitaxial silicon deposition on a release layer of porous silicon. In this invention, a smart cell is described as a solar cell which had at least a monolithic bypass switch associated with it. The smart cell described herein comprise a monolithically integrated bypass switch (MIBS) which is concurrently manufactured during solar cell processing using a harmonized fabrication process flow (i.e., the MIBS devices are made concurrently with and using the same fabrication process steps used for the solar cells, at essentially no added incremental manufacturing cost). While the representative process flows here, such as the one outlined in FIG. 13, are shown based on epitaxial silicon and porous silicon lift off processing to form the solar cell semiconductor absorber layer, the embodiments of this invention are also fully applicable to any crystalline semiconductor solar cells (including those made of mono-crystalline Czochralski—CZ—silicon starting wafers, or mono-crystalline float-zone—FZ—silicon starting wafers or cast multi-crystalline starting wafers or GaAs wafers or another semiconductor materials either formed from starting wire-sawn wafers or from epitaxially grown layers of different semiconductor materials) using a backplane support sheet, even without the use of porous silicon or epitaxial silicon processes (for instance, by using starting semiconductor wafers used to fabricate the solar cells). The backplane support sheet may be a thin flexible sheet with a relatively good coefficient of thermal expansion (CTE) match to that of the semiconductor substrate, for instance, a 50 micron to 250 micron thick sheet of a suitable prepreg material (such as a prepreg made using a combination of woven aramid fibers and suitable resin). Alternatively, the backplane material may be made of other suitable flexible (e.g., polymeric or plastic) or rigid electrically insulating materials in case of back-contact/back-junction (or also known as IBC) solar cells. The backplane is may be a continuous sheet which is permanently attached or laminated to the semiconductor substrate and serves several important functions, including: (i) provides support for the thin (e.g., few microns up to over 100 microns in thickness) semiconductor substrate, (ii) enables fabrication of bendable/flexible solar cells in case of using a flexible backplane in conjunction with a thin (e.g., sub-100 microns) semiconductor absorber, (iii) enable fabrication of two-level solar cell (and MIBS) metallization structures, resulting in significant architectural and performance benefits, (iv) enables formation of trench isolation regions in the semiconductor layer with the continuous backplane serving as a reliable monolithic support layer, and (v) enables formation of on-cell metallization (first level metal or M1) without busbars, hence, eliminating electrical shading losses from the solar cell, and (vi) enables formation of on-backplane metallization (second level metal or M2) with relatively coarse (hence, easy to make) metallization pitch (compared to M1) and with the final solar cell busbars used for cell-to-cell interconnections in the PV module.

The representative process flow shown in FIG. 12 starts with a reusable crystalline (mono-crystalline or multi-crystalline) silicon template, typically made of a p-type (such as a heavily-boron– doped monocrystalline silicon wafer), into which a thin sacrificial layer of porous silicon is formed (for example by an electrochemical etch process through a surface modification process in an HF/IPA or HF/acetic acid wet chemistry in the presence of an electrical current passing through the wafer). The porous silicon layer may have at least two different porosities: a higher porosity buried layer (serving as a subsequent lift-off release layer) and a lower porosity surface layer (serving as the subsequent epitaxial seed layer). Upon formation of the sacrificial porous silicon layer, which serves both as a high-quality epitaxial seed layer as well as a subsequent separation/lift-off (or release) layer, a relatively thin layer (for example a layer thickness in the range of a few microns up to about 100 microns, or more specifically in the range of a few microns up to about 70 microns) of in-situ-doped crystalline silicon is formed, also called epitaxial silicon growth. The in-situ-doped epitaxial crystalline silicon layer may be formed, for example, by atmospheric-pressure epitaxy using a chemical-vapor deposition or CVD process (also known as APCVD) in a process ambient comprising a suitable silicon source gas such as trichlorosilane or TCS and hydrogen (plus a suitable dopant source such as phosphine or $PH_3$). The epitaxial layer may be formed with n-type doping in order to manufacture higher efficiency solar cells (n-type substrates provide higher minority carrier lifetimes compared to p-type silicon and do not suffer from the B-O pairing defects causing light-induced degradation in the solar cells made using p-type silicon substrates.

After completion of a majority of solar cell processing steps (e.g., the backside doped emitter and base regions, the rear passivation structure, the rear base and emitter contacts, and the patterned on-cell busbarless M1 metallization layer with fine-pitch interdigitated fingers made of a suitable metallization material such as aluminum or an aluminum-silicon alloy), a relatively inexpensive backplane layer (such as a 50 to 250 micron thick flexible prepreg layer with relatively close CTE match to that of silicon) may be bonded or laminated to the thin epitaxial silicon layer for permanent cell support and reinforcement as well as to enable the two-level cell metallization architecture of the solar cell. The backplane material may be made of a thin (for instance, about 50 to 250 microns), flexible (or if desired rigid), and electrically insulating material sheet such as an inexpensive flexible prepreg material (with relatively close CTE match to that of the semiconductor substrate, such an aramid fiber prepreg sheet) commonly used in applications such as printed circuit boards, which meets the process integration and reliability requirements of solar cells and PV modules. Besides prepreg, other suitable polymeric or plastic materials may be used as the solar cell and MIBS backplane material (flexible or semi-flexible or rigid). The mostly-processed (processed through the patterned M1 layer and laminated with the continuous backplane sheet) back-contact, back-junction backplane-reinforced large-area (for instance, a solar cell area of at least 125 mm×125 mm or larger such as with dimensions of at least 156 mm×156 mm full square or pseudo square formats) solar cell is then separated and lifted off from the reusable template along the mechanically-weakened sacrificial porous silicon layer (for example through a Mechanical Release—MR—process) while the template may be re-used many times (e.g., at least a few times and in some instances at least 10's of times) to further minimize the overall solar cell and PV module manufacturing costs. Final back-end cell processing (comprising completion of the sunnyside texture, passivation, and anti-reflection coating or ARC deposition followed by completion of the via plugs and second level metallization or M2) may then be performed, first on the solar cell sunny-side which is exposed after being released from the template. Sunny-side processing may include, for instance, completing frontside texturization (for instance, using alkaline or acidic wet chemistry) and surface passivation and anti-reflection coating (ARC) deposition (for instance, using a passivation and ARC layer or layer stack comprising SiNxHy or SiOwHz/SiNxHy or Al2O3/SiNxHy formed by PECVD or ALD and PECVD) process. One may use a process using a starting CZ or FZ or multi-crystalline silicon wafer (instead of using porous silicon and epitaxial growth on a reusable substrate) to manufacture the IBC cells described above (the first 3 blocks or steps shown to the left of FIG. 12 would not be required and instead a starting crystalline silicon wafer is used to proceed through the solar cell fabrication process as shown to the right side of the first three steps in FIG. 12).

The MIBS implementation methods and designs of this application may be integrated into the disclosed solar cell fabrication process flow (as well as many other crystalline silicon solar cell process flows, including but not limited to those using either wire-sawn starting wafers or epitaxially grown solar cell substrates) without substantially altering or adding manufacturing process steps or tools, and thus without substantially adding to the cost of manufacturing the solar cell. In one embodiment, the combination of back-junction/back-contact (or IBC) cell designs in conjunction with a backplane-enabled two-level interconnection and backplane-enabled solar cell support provides an enabling solar cell architecture for Monolithically-Integrated Bypass Switch (MIBS) implementation at the cell level, hence, eliminating the need for the use of discrete components such as discrete diodes in conjunction with the module junction box or in conjunction with each cell. In addition to serving as a permanent structural support/reinforcement and providing backplane-enabled low-cost/high-conductivity (e.g., using aluminum and/or copper and/or their alloys or other suitable high-conductivity metallization materials) interconnects for the high-efficiency crystalline semiconductor solar cell (such as crystalline silicon solar cell), these backplane technologies also enable effective MIBS integration with each solar cell without significantly compromising solar cell power (since the MIBS area is a very small fraction of the solar cell area) and with negligible or no addition to the overall solar cell manufacturing cost. The embodiments of this invention enable very economic and reliable integrated shade management solution using MIBS, by eliminating the reliability concerns and component costs of prior art discrete bypass diodes (also eliminating the need for discrete component soldering or attachment to the solar cell or module junction box. They also provide excellent reliability similar to that of the solar cell itself (due to the monolithic integration of MIBS and solar cell and the fact that they use harmonized manufacturing process and materials).

The backplane material may be a thin (e.g., about 50 microns to 250 microns thick; may be thinner or thicker than this range too) sheet of a suitable material, for instance a flexible material such as a prepreg sheet or a polymeric or a plastic material, with sufficiently close coefficient of thermal expansion (CTE) match the CTE of the semiconductor substrate in order to avoid causing excessive thermally induced CTE-mismatch stresses on the thin semiconductor (e.g., crystalline silicon) layer. Moreover, the backplane material should meet process integration requirements for the backend cell fabrication processes, including in particular chemical resistance during wet etch/texturing of the solar cell frontside and sufficient thermal stability during the subsequent PECVD deposition of the frontside (single-layer or multi-layer) passivation and ARC layer(s). The electrically insulating backplane material sheet attached to the thin semiconductor substrate should also meet the subsequent module-level lamination process thermal budget and long-term field operation reliability requirements. While various suitable polymeric (such as plastics, fluoropolymers, prepregs, etc.) and suitable non-polymeric materials (such as glass, ceramics, etc.) may be used as the backplane material (either flexible or rigid backplane), backplane material choice depends on many considerations including, but not limited to: cost, ease of solar cell process integration, long term reliability, thermal stability, flexibility, pliability, etc.

A good material choice for backplane is prepreg comprising a suitable combination of fibers and resins. Prepreg sheets are used in many applications such as building blocks of printed circuit boards (PCB) and may be made from combinations of suitable resins and Coefficient of Thermal Expansion or CTE-reducing fibers (such as aramid fibers) or particles. The backplane material sheet may be an inexpensive, low-CTE (typically with CTE <10 ppm/° C., or in some instances with CTE<5 ppm/° C., since the semiconductor materials such as crystalline silicon have relatively low CTE values on the order of 3 ppm/° C.), thin (usually in the range of about 50 microns to 250 microns, and in some instances in the smaller range of about 50 microns to 100 microns for reduced backplane sheet cost and enhanced flexibility of the backplane-laminated solar cell) prepreg sheet which is relatively chemically resistant to wet etch/texturization chemicals (such as alkaline or acidic texturization chemistries) and is relatively thermally stable at temperatures up to at least about 180° C. (or even up to as high as about 400° C.-450° C.). In the case of crystalline silicon solar cells made using epitaxial silicon deposition on porous silicon on template, the prepreg sheet may be attached to the solar cell substrate backside after completion of the solar cell manufacturing process through the patterned M1 metallization layer (first-level metal on the solar cell backside) while the cell semiconductor substrate is still on the template (i.e., before the solar cell substrate lift off process) using a vacuum-thermal laminator. Alternatively, in the case of crystalline silicon solar cells made using starting CZ monocrystalline or FZ monocrystalline or cast multicrystalline wafers (and not using epitaxial silicon deposition on porous silicon on template), the prepreg sheet may be attached to the solar cell wafer backside after completion of the solar cell manufacturing process through the patterned M1 metallization layer (first-level metal on the solar cell backside) and before completion of the back-end process steps (such as the sunnyside texture, passivation, and ARC as well as the conductive vi plugs through the backplane and the second-level metallization level or M2 formed on the backplane). Upon applying a combination of heat (for instance, to temperatures of up to about 200° C. to 300° C.) and pressure (for instance, pressures of up to several to about 20 atmospheres), the thin prepreg sheet is permanently laminated or attached to the backside of the partially-processed back-contact solar cell. In the case of crystalline silicon solar cells made using epitaxial silicon deposition on porous silicon on template, the lift-off release peripheral boundary is defined around the periphery of the solar cell (near the template edges based on some pre-specified exclusion zone), for example by using a pulsed laser scribing tool, and the backplane-laminated solar cell substrate is then separated and lifted off from the reusable template using a mechanical release or lift-off process. The released backplane-attached solar cell may then be optionally laser trimmed around the edges to prepare the final straight solar cell peripheral edges according to the final specified solar cell dimensions. Alternatively, in the case of crystalline silicon solar cells made using starting CZ monocrystalline or FZ monocrystalline or cast multicrystalline wafers (and not using epitaxial silicon deposition on porous silicon on template), there is no release process and an optional post-lamination laser trimming process may be used to remove any excess prepreg extending from the active edges of the solar cell (and MIBS). The subsequent process steps (either with epitaxial cells or with CZ/FZ/Multi-crystalline silicon wafer-based cells) may include: (i) completion of the frontside texture and passivation/ARC processes on the solar cell sunnyside, (ii) completion of the solar cell high conductivity metallization (the second-level metallization or M2 may be formed in conjunction with the associated M1-M2 conductive plugs, with metallization materials comprising aluminum and/or copper and/or their alloys or other suitable metallic materials) on the cell backside (which is the solar cell backplane). The high-conductivity metallization (for example comprising rather inexpensive aluminum and/or copper, as opposed to silver to reduce the overall solar cell material and manufacturing costs) including the interconnections to both the solar cell emitter and base polarities (fingers and busbars) are formed on the laminated solar cell backplane using the patterned M2 layer.

In the back-contact solar cell and MIBS embodiments of this invention, solar cell designs and manufacturing processes described herein have two levels of metallization (on-cell M1 or first metallization level and on-backplane M2 or second metallization level) which are separated by the electrically insulating backplane layer, and interconnected according to a pre-specified pattern of via holes through conductive via plugs interconnecting the patterned M2 and M1 metallization regions based on a pre-specified interconnection arrangement. For the IBC cells using the embodiments of this invention, the M1 pattern may be a relatively fine-pitch pattern of interdigitated base and emitter metallization fingers (without any busbars on M1 to eliminate the electrical shading degradation effects on solar cell efficiency), while the M2 pattern may be a relatively coarse pitch pattern of interdigitated base and emitter metallization fingers, with the M2 fingers being substantially orthogonal or perpendicular to the M1 fingers, and the M2 finger count being substantially less than the M1 finger count (for instance, by a factor of about 5 to 50). Prior to the backplane lamination process, the solar cell base and emitter contact metallization pattern is formed directly on the cell backside (the M1 metallization level), for example by using a relatively thin (with a thickness of about a fraction of one micron up to about 20 microns; typically thinner layers formed by PVD and thicker layers formed by screen printing) layer of screen printed or plasma sputtered (PVD) aluminum (or aluminum silicon alloy) material layer. This first layer of metallization formed on the solar cell rear side or backside prior to the backplane attachment or lamination process (herein referred to as M1) defines the solar cell contact metallization pattern, such as fine-pitch (e.g., base & emitter metallization finger pitch on the order of about 0.5 millimeter up to few millimeters) interdigitated back-contact (IBC) M1 conductor fingers defining the base and emitter regions of the IBC cell. In some instances, the patterned M1 layer does not have any solar cell busbars in order to eliminate any detrimental electrical shading losses associated with the solar cell metallization busbars. The M1 layer (also known as the solar cell contact metallization) extracts the solar cell current and voltage (or the solar cell electrical power) and transfers the solar cell electrical power to the second level/layer of relatively higher-conductivity solar cell metallization (herein referred to as M2) formed after M1 on the backplane surface (and physically separated from the patterned M1 layer by the laminated or attached backplane sheet). After attachment or lamination of the backplane sheet to the solar cell backside following formation of the patterned M1 layer, and in the case of epitaxial silicon solar cell after subsequent detachment of the backplane-supported solar cell from the template (not applicable if the solar cell is fabricated on CZ or FZ monocrystalline silicon wafer or on cast multi-crystalline silicon wafer), and following completion of the frontside texture and passivation and ARC formation fabrication processes, the via holes are formed through the backplane sheet (holes landing on designated pads on patterned M1 layer) and the relatively higher sheet-conductance layer M2 is formed on the backplane (for instance, using a relatively inexpensive high-conductivity metal or metal alloy comprising aluminum and/or copper). Via holes (in some instances up to hundreds or thousands of via holes within the area of the continuous backplane) are drilled into the backplane (for example by a pulsed laser drilling process). These via holes land on pre-specified regions of patterned M1 fingers (solar cell base and emitter metal fingers) for subsequent electrical interconnections between the patterned M2 and M1 layers through electrically conductive plugs formed in these via holes. Subsequently, the patterned higher-conductivity metallization layer M2 is formed (for example by plasma sputtering, electrochemical deposition or plating, attachment of a metallic foil to the backplane, or a combination thereof—using an M2 material, for example a relatively inexpensive and high-conductivity electrical conductor comprising aluminum and/or copper). For an interdigitated back-contact (IBC) solar cell with fine-pitch IBC fingers on M1 (for instance, hundreds of M1 metal fingers per IBC solar cell), the patterned M2 layer may be designed and fabricated with its conductor fingers to be substantially orthogonal or perpendicular to M1—i.e., the M2 base and emitter fingers are made essentially perpendicular to the M1 base and emitter fingers. The M2 fingers alternate between base and emitter polarities and connect to the respective base and emitter busbars formed as part of the M2 layer. Because of this orthogonal transformation for M2 with respect to M1, the M2 layer may have far fewer IBC fingers than the M1 layer (for instance, by a factor of about 5 to 50 fewer M2 fingers compared to M1 fingers). Hence, the M2 layer may have a much coarser pattern with much wider M2 IBC fingers than the M1 layer. For instance, the average width of M2 fingers may be several millimeters to over 1 centimeter whereas the average width of M1 fingers may be 100's of microns up to over 1 millimeter. Solar cell busbars may be positioned on the M2 layer, and not on the M1 layer, in order to eliminate the electrical shading losses associated with busbars on a solar cell. And as both the base and emitter interconnections and busbars may be positioned on the M2 layer on the solar cell backside backplane, electrical access is provided to both the base and emitter terminals of the solar cell on the backplane. The patterned M2 layer also forms the conductive via plugs (for instance, using the same deposited metal layer used for the patterned M2 layer fingers and busbars).

Intelligent Cellular Shade Impact Suppression (ISIS) or Integrated Shade Management Using MIBS.

Often due to the series wiring and interconnections of the solar cells within a PV module, a small amount of obstruction on a PV module light-absorbing face may lead to large output loss. The same is true when considering an installed PV system comprising an array of PV modules connected in electrical series and parallel arrangement. Examples of power harvesting capability loss as a result of cell and module shading (partial or full shading) include the following. For instance, one published study determining that obstruction on 0.15%, 2.6%, and 11.1% of the PV module surface area may cause 3.7%, 16.7%, and 36.5% of output power loss, respectively, hence resulting in a significant reduction of the installed PV system energy yield in case of even partial shading. As described earlier, when the electrical current of one obstructed cell drops due to partial or full shading of the cell, the shaded cell may drag down the current of all the other cells wired in series in a string or sub-string, or alternatively the shaded solar cell may be reverse biased by the larger electrical current generated by the unshaded cells resulting in a hot spot and reliability problem at the shaded cell area, unless corrective action is taken in the design and build of the PV module. MIBS-based ISIS or shade management designs disclosed herein monolithically integrate a bypass switch (a pn junction diode or a Schottky diode—or alternatively another semiconductor switch such as a suitable transistor switch) to provide for the automatic re-routing (or bypassing) of electricity around any obstructed or shaded cells with minimal impact on the series string and the PV module—thereby maximizing the power generation capability of the PV module and the overall energy yield output of the PV modules—without substantially changing the solar cell fabrication process flow (hence, a so-called harmonized process flow) and with negligible or no incremental addition to the overall solar cell manufacturing cost. The MIBS-based ISIS or shade management structures and methods described in this invention improve the overall cell and module reliability by substantially mitigating any thermally induced stresses from heat dissipation associated with mismatched electrical current within the PV modules; they also eliminate the need for a module junction box with external bypass diodes and eliminate the need for any discrete bypass switch components, thus reducing the cost per watt of the resulting smart PV module; and, they also eliminate thermal and mechanical stresses associated with mounting and soldering discrete bypass diode components on the solar cells.

Intelligent Cellular Shade Impact Suppression (ISIS) or Shade Management Solutions Using Monolithically-Integrated Bypass Switches (MIBS) with Solar Cells:

The following section describes various shade management MIBS implementation embodiments of this invention. As a representative example, considerations and criteria relating to selection of a MIBS ON resistance for use in the distributed cellular shade management (ISIS) systems disclosed, without substantial power dissipation losses in the distributed switches, include but are not limited to:

A cellular bypass switch with a small on-state voltage drop, in some instances far smaller than that of a forward-biased diode. For example, assuming Vmp=575 mV (maximum-power-point voltage) and Imp=9.00 A (maximum-power-point current) (corresponding to open-circuit voltage of approximately Voc=660 mV and short-circuit current of about ISC=9.75 A), an on-state voltage of 50 mV would result in an on-state power dissipation of 0.45 W which is less than about 10% of that of a diode (this calculation excludes any loss associated with the switch series resistance Rseries).

A cellular bypass switch with a very small on-state series resistance to minimize the on-state switch power dissipation, such as an on-state switch Rseries less than or equal to 10 mΩ (for example Rseries=5 mΩ, ohmic power dissipation of switch=0.405 W).

MIBS may use low-forward-bias voltage Schottky diode with an on-state or forward-bias voltage of −0.2 V to −0.5V, or alternatively a pn junction diode with an on-state forward bias voltage of −0.6 V to −0.7 V. The use of an optimal Schottky diode can result in lower power dissipation compared to a pn junction diodem, when the MIBS switch is activated due to cell shading.

MIBS structures with the following functionality may be used:

Low power dissipation when the MIBS is turned ON (the MIBS diode is forward biased) due to cell shading. For example, the MIBS power dissipation due to its ohmic losses may be limited to about no larger than the average cell power production, and in some instances to a fraction of the average solar cell power production. For instance, for a 5 Wp (watt peak) solar cell, the MIBS device design (such as a Schottky diode or a pn junction diode) may limit the power dissipation in the shaded cell in a series-connected string of solar cells to no more than about 2 W up to about 5 W when the full cell string current passes through the shaded cell MIBS device (lower power dissipation with Schottky diode MIBS compared to pn junction MIBS due to the lower forward-bias voltage of the Schottky diode compared to the pn junction diode). The MIBS diode is designed to provide a very low on-resistance in order to minimize the MIBS power dissipation when the MIBS device is activated.

Relatively low reverse leakage current in the MIBS device when the solar cell MIBS is OFF (reverse biased) or when the cell is not shaded and is operating under normal un-shaded conditions. For instance, the MIBS device may be designed such that its reverse leakage current is substantially below 1% or even below 0.1% of the solar cell photo-generated current.

FIG. 13 is a schematic circuit diagram showing a distributed cellular shade management (Intelligent Cellular Shade Impact Suppression—ISIS) using one low-power-dissipation MIBS device (for example each MIBS device comprising a Schottky diode or a pn junction diode) per solar cell within the PV module. This distributed MIBS (using either pn junction diode or Schottky diode as the MIBS device) arrangement eliminates the need for external junction box bypass diodes as well as any discrete on-cell diode components (hence, requiring soldering or conductive adhesive attachment of the discrete diodes to the solar cells, resulting in potential reliability problems in the field) and improves the overall energy yield performance of the modules in PV installations as compared to a one bypass diode per multi-cell sub-string arrangement (such as when using one bypass diode per 20-cell substring arrangement in 60-cell modules as in the prior art configurations). As shown, because one MIBS (rectifying diode such as a Schottky diode or a pn junction diode) per solar cell is used, the entire module may be wired as a single string of all the solar cells within the module, for example all connected in electrical series (e.g., one string of 60 cells connected in series for a 60-cell module). Alternatively, the solar cells in the module may be wired in any combination of series/parallel interconnection arrangements depending on the module current and voltage requirements. Thus, the use of the MIBS-based ISIS or shade management architecture and manufacturing methods disclosed herein does simplify the module manufacturing process and reduce the module Bill-of-Materials (BOM) cost, while providing high power output performance and field reliability.

Monolithically-Integrated Bypass Switch (MIBS) for Distributed Shade Management in PV Modules.

Various examples of smart solar cells with monolithically integrated shade management solutions eliminating the need for the external bypass switches and discrete bypass switch components are described herein. The MIBS structures and methods provide, for example and among other benefits, the following advantages:

- A monolithically integrated bypass switch (MIBS) may be implemented on each cell at essentially zero incremental manufacturing cost to the cell manufacturing cost (i.e., negligible or no increase in manufacturing cost per cell as a result of the MIBS implementation with each solar cell).
- MIBS enabled solar cells provide distributed shade management directly at the cell level for enhanced energy yield and enhanced energy harvesting in PV modules as compared to traditional PV modules comprising external discrete bypass diodes in PV module junction boxes.
- In numerous fabrication embodiments, including those described herein, fabricating MIBS-enabled solar cells may add essentially no additional cell/module manufacturing cost and may incur negligible cell efficiency/power penalty while providing substantially enhanced energy harvest and higher energy yield for PV modules operating in realistic field conditions with environmental shading and/or soiling of modules (for instance, on residential rooftop PV installations).
- Monolithic integration solutions and processes of this invention utilizing MIBS are provided for relatively thin (e.g., semiconductor absorber or substrate thickness in the range of a few microns up to over 100 microns in thickness) semiconductor (e.g., thin epitaxial silicon substrate or thin crystalline silicon wafer) solar cells with attached or laminated backplane support with essentially no change to the solar cell process flow (hence, harmonized manufacturing process flow), essentially no added solar cell processing complexity, and essentially no added solar cell processing cost. Moreover, the MIBS embodiments described herein may use the same material stack layers (semiconductor, dielectric, and metal layers) as the solar cell itself—thus the fabrication processing of the solar cell and the MIBS device associated with the solar cell may be performed concurrently and in a harmonized manner using the same process tools utilized for the solar cell fabrication.
- Exemplary monolithic integration solutions for MIBS cells using either pn junction diodes or metal-electrode Schottky diodes that eliminate the need for discrete bypass switch components and their attachment to the solar cells are provided.
- Low cost and reliable integrated shade management solutions which eliminate reliability concerns and component costs of discrete diode components (and also eliminate the need for discrete switch component soldering or attachment by conductive adhesive to the solar cell) are provided.
- Because the MIBS methods and structures disclosed utilize the same materials as the solar cell, they have excellent long-term reliability identical to that of the solar cell itself. The MIBS and its associated solar cell are interconnected as required using the solar cell metallization structures, for instance, the M1 layer and/or the M2 layer.
- MIBS methods and structures disclosed may also provide mitigation of thin semiconductor micro-cracks (micro-crack generation and/or propagation) since there is no discrete soldered bypass diode component attached to the solar cell and a peripheral MIBS device may serve as a micro-crack prevention shield or guard for the solar cell.

For example, key attributes and benefits of MIBS solar cells, include, but are not limited to:

- MIBS embodiments disclosed herein may be applied to various cell-based PV modules in general, and specifically to crystalline semiconductor solar cells including thin (e.g., from about 1 μm up to about 100 μm thick or even thicker semiconductor absorber) crystalline semiconductor (e.g., silicon and gallium arsenide) solar cells.
- MIBS embodiments disclosed herein provide structures and manufacturing methods for producing relatively thin-crystalline semiconductor, such as thin crystalline silicon, solar cells with at least one relatively low-power-dissipation monolithically-integrated bypass switch (MIBS) on each solar cell which provide reliable cell-level shade management in a PV module made of a plurality of MIBS-enabled solar cells.
- Structures and methods disclosed herein are described for high-efficiency back-contact/back-junction (also called IBC) solar cells fabricated using thin (e.g., from about 1 micron up to about 100 microns or even thicker) epitaxial silicon lift-off processing or alternatively fabricated using starting crystalline silicon wafers (CZ or FZ or multi-crystalline silicon wafers) and comprising a laminated or attached backplane support. However, the structures and methods of the disclosed subject matter are also applicable to solar cells made of semiconductor absorber materials other than crystalline silicon (e.g., gallium arsenide, germanium, gallium nitride, etc.) as well as other solar cell designs (e.g., front-contact cells or other back-contact non-IBC cells).
- MIBS solar cell embodiments disclosed herein may be facilitated and enabled by the combination of thin (with the semiconductor cell absorber thickness less than about 200 microns and in some instances less than about 100 microns) semiconductor absorber and a permanently laminated or attached continuous backplane support layer on the backside of the solar cell.
- MIBS solar cells may have a monolithically-integrated bypass switch (either a pn junction diode or a Schottky diode), for example on a peripheral rim of the solar cell, formed during the solar cell manufacturing process flow without adding any appreciable incremental cost to the cell manufacturing process and without compromising the cell power output because the MIBS device area consumption is only a relatively small fraction of the active solar cell area (for example, the MIBS area can be chosen to be less than about 1% of the solar cell area and even less than a fraction of one percent, for instance, about 0.1% up to 1%).

Figure 14:
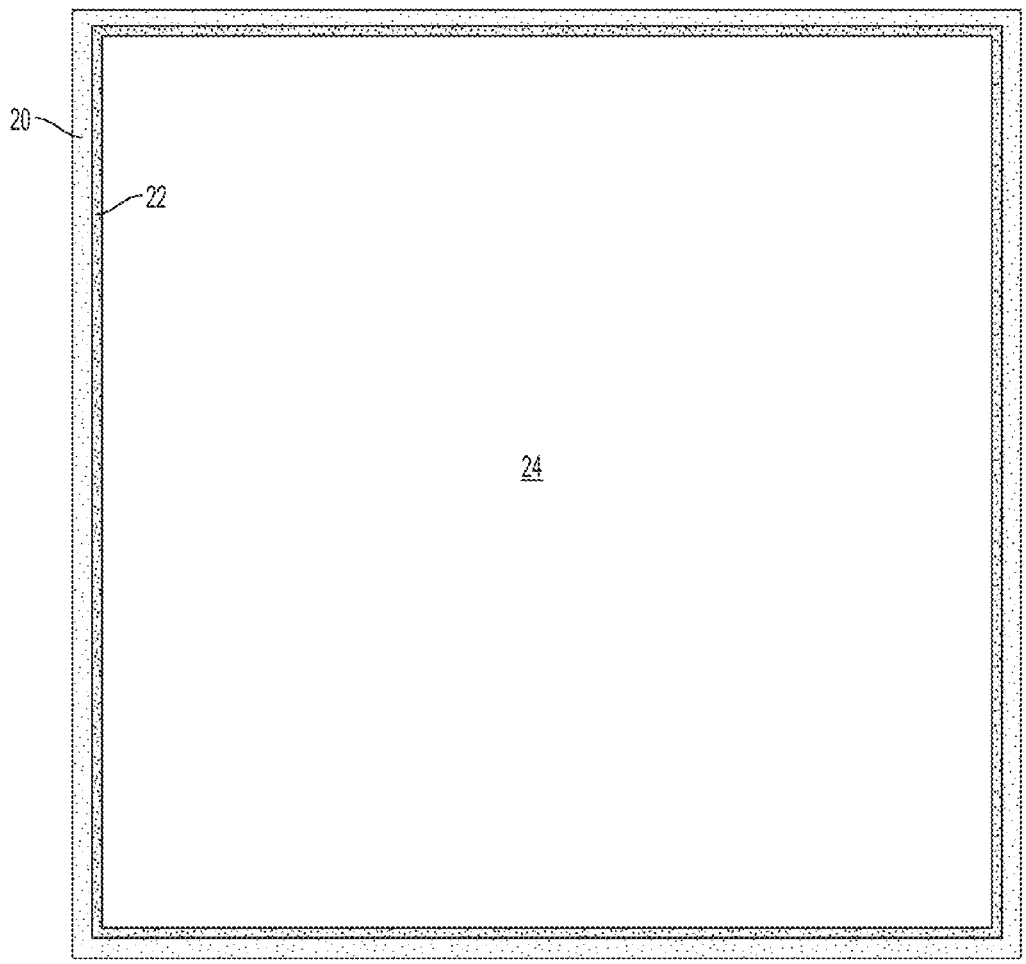
FIG. 14 is a diagram showing a sunnyside view of a Monolithically-Integrated Bypass Switch (MIBS) solar cell embodiment using a full-periphery closed loop rim (peripheral) MIBS bypass diode, with the diode substrate separated and electrically isolated from the main solar cell substrate region by a trench isolation region (such monolithic configuration enabled by the backplane)

For a polygonal shaped solar cell, a peripheral rim (edge located) bypass switch diode may be formed on any one of the polygon sides or on a plurality of the polygon sides or continually along all the polygon sides. For a relatively common square-shaped solar cell format (for instance, with typical dimensions of 156 mm×156 mm, 210 mm×210 mm, or any other desirable solar cell dimensions, for example, a solar cell with cell area in the range of less than about 100 cm2 to over 1,000 cm2) a peripheral rim diode (pn junction diode or Schottky diode) may be formed on at least a portion of the solar cell periphery (on at least one side or a corner or at least a portion of one side or a portion of one corner, or a combination thereof), or as a continuous closed-loop (or continuous segmented closed loop) full-periphery rim surrounding the entire solar cell around its periphery forming a larger solar cell island area enclosed by the much smaller area island rim, both supported on the continuous backplane (as shown in FIG. 14).

The MIBS bypass diode and the solar cell share the same common continuous backplane and their semiconductor layers (e.g., epitaxial silicon or semiconductor substrate made of CZ or FZ or multi-crystalline wafer) are fully isolated from each other using a trench isolation process performed during the cell manufacturing process, for example by using a through-semiconductor pulsed laser scribe to form the device isolation trenches. The isolation trench may penetrate the entire thickness of the semiconductor layer (e.g., thin epitaxial Si) and stop on the electrically insulating backplane. The width of the trench isolation depends on the properties of the laser beam (for example a pulsed nanoseconds laser beam) used for isolation scribe and the semiconductor layer thickness and may be, for example, in the range of about 1 micron up to about 100 microns or even more (narrower trenches may be formed in order to reduce the area-related losses). Generally, a narrower trench isolation width may be advantageous. In practice, the trench isolation width may be on the order of 10's of microns. Alternatively, the trench isolation regions may be formed by using a technique other than pulsed laser scribing, for instance, by mechanical dicing or ultrasonic scribing or another method. A suitable trench isolation formation process such as a pulsed laser scribing or cutting process selectively cuts through the semiconductor layer and effectively stops on the backplane sheet after cutting through the thickness of the semiconductor substrate without a substantial removal of the backplane material (hence, maintaining the integrity of the continuous backplane sheet).

Further, monolithically integrated bypass switch (MIBS) fabricated concurrently with the solar cell using a shared manufacturing process flow may offer the following advantages, among others:

Integrated bypass switches may be fabricated at negligible or essentially zero incremental manufacturing cost added to the solar cell or PV module.

Eliminate the need for attachment of discrete bypass switches to the solar cells or solar cell backplanes.

Resolve the potential reliability concerns of attaching (e.g., soldering) discrete components, such as discrete diodes, to the solar cells and permanently laminating such cells with attached discrete components in solar modules.

Maintain overall planarity for the solar cells with monolithically integrated bypass switches as there are no discrete component bumps, as well as eliminate the need to use thicker module encapsulant (such as EVA or polyolefin) to accommodate discrete component topography and bumps.

Eliminate the cost of the discrete bypass switches (e.g., diodes or transistors) and/or the external junction box with external bypass diodes.

Eliminate the cost of discrete bypass switch component assembly process (e.g., component soldering) on the solar cells.

MIBS solar cells may have substantial identical reliability as compared to the solar cell itself because the MIBS structures may be made from the same solar cell materials and processes (semiconductor substrate, dielectric, metallization, and backplane materials) and are monolithically integrated with the solar cell. This minimizes bankability issues and concerns as the overall reliability of the solar cell and PV module is not compromised (due to the use of robust monolithic bypass diode instead of discrete component soldered to the cell).

The monolithically-integrated bypass switch (MIBS) may be a pn junction diode, such as a rim pn junction diode around the solar cell island. Alternatively, the MIBS be a metal-contact Schottky diode (which usually can provide a smaller forward-bias voltage than a pn junction diode), such as a rim Schottky diode around the solar cell island, made of, for example, an aluminum or aluminum-silicon alloy Schottky contact on n-type silicon.

If a rim diode design is utilized, the monolithically integrated bypass switch (MIBS) rim may also provide the additional benefit of mitigating or eliminating the generation and/or propagation of micro-cracks in the solar cell during and/or after fabrication of the solar cells. This is due to the fact the MIBS rim separated from the solar cell island by the trench isolation region can also serve as a shield or guard against edge-induced and edge-propagating microcracks.

The solar cell embodiments described herein enable smart solar cells and smart solar modules, such as back-contact solar cells including back-contact/back-junction IBC cells, with permanently attached (e.g., laminated) backplanes and integrated MIBS devices with the cells. FIG. 14 is a schematic diagram showing a sunnyside view of a MIBS solar cell embodiment using full-periphery closed loop rim MIBS bypass diode 20 isolated from solar cell island 24 by full-periphery laser-scribed isolation trench 22. MIBS bypass diode 20 and solar cell island 24 are attached to a common and shared backside backplane (not shown) and are formed from a common originally continuous and subsequently partitioned solar cell semiconductor substrate (from a starting semiconductor wafer or substrate). The isolation trench may be formed by a scribing method, for example by pulsed laser scribing, plasma scribing, or mechanical dicing, through solar cell substrate 24 to the backplane positioned on the backside of the cell. FIG. 14 shows the sunny-side (also referred to as the frontside or top side) view of a MIBS-enabled solar cell with a closed-loop full-periphery rim diode (pn junction diode or Schottky diode). As shown in this embodiment, solar cell 24 is a full square cell and may have dimensions, for example, such as 156 mm by 156 mm, although other solar cell shapes and dimensions may also be used. Solar cell 24 may be a thin-semiconductor (for example thin epitaxial silicon or thin crystalline silicon from a starting CZ or FZ or multi-crystalline wafer) back-contact back-junction solar cell. Full periphery rim diode 22 may have a width in the range of ten to around a thousand microns, for example a diode width in the range of 100 to 500 microns.

The full-periphery through-silicon trench separating and isolating the rim bypass diode from the solar cell may have, for example, an isolation width in the approximate range of a few microns up to about 100 microns (may be even larger width than about 100 microns, though less desirable to use larger width) depending on the laser beam diameter and semiconductor layer thickness. A typical trench isolation width formed by pulsed nanoseconds (ns) laser scribing may be around 20 up to about 100 microns although the trench isolation width may be smaller. While pulsed laser ablation or scribing is an effective and proven method to form the trench isolation regions, it should be noted that other non-mechanical and mechanical scribing techniques may also be used instead of pulsed laser scribing to form the trench isolation regions for all MIBS solar cell embodiments. Alternative non-laser methods include plasma scribing, ultrasonic or acoustic drilling/scribing, water jet drilling/scribing, or other suitable mechanical dicing or scribing methods capable of selective cutting or scribing of the semiconductor substrate (absorber) layer with sufficient special resolution (i.e., relatively narrow trench isolation width).

The term monolithic integrated circuit is used to describe a plurality of semiconductor devices and corresponding electrical interconnections that are fabricated onto a slice of semiconductor material layer, also known as the semiconductor substrate. Hence, a monolithic integrated circuit is typically manufactured on a thin continuous slice or layer of a semiconductor material such as crystalline silicon. The integrated solar cell and bypass switch structures described herein are monolithic semiconductor integrated circuits as the integrated solar cell and bypass switch (MIBS) device are both formed/manufactured on a slice of semiconductor substrate layer (from either a starting semiconductor wafer or a grown semiconductor layer formed by epitaxial deposition). Further, the combination of a continuous backplane attached to the semiconductor substrate layer backside enables the monolithic integrated solar cell and bypass switch (or monolithically-integrated bypass switch -MIBS) embodiments in accordance with the disclosed subject matter.

Figure 15:
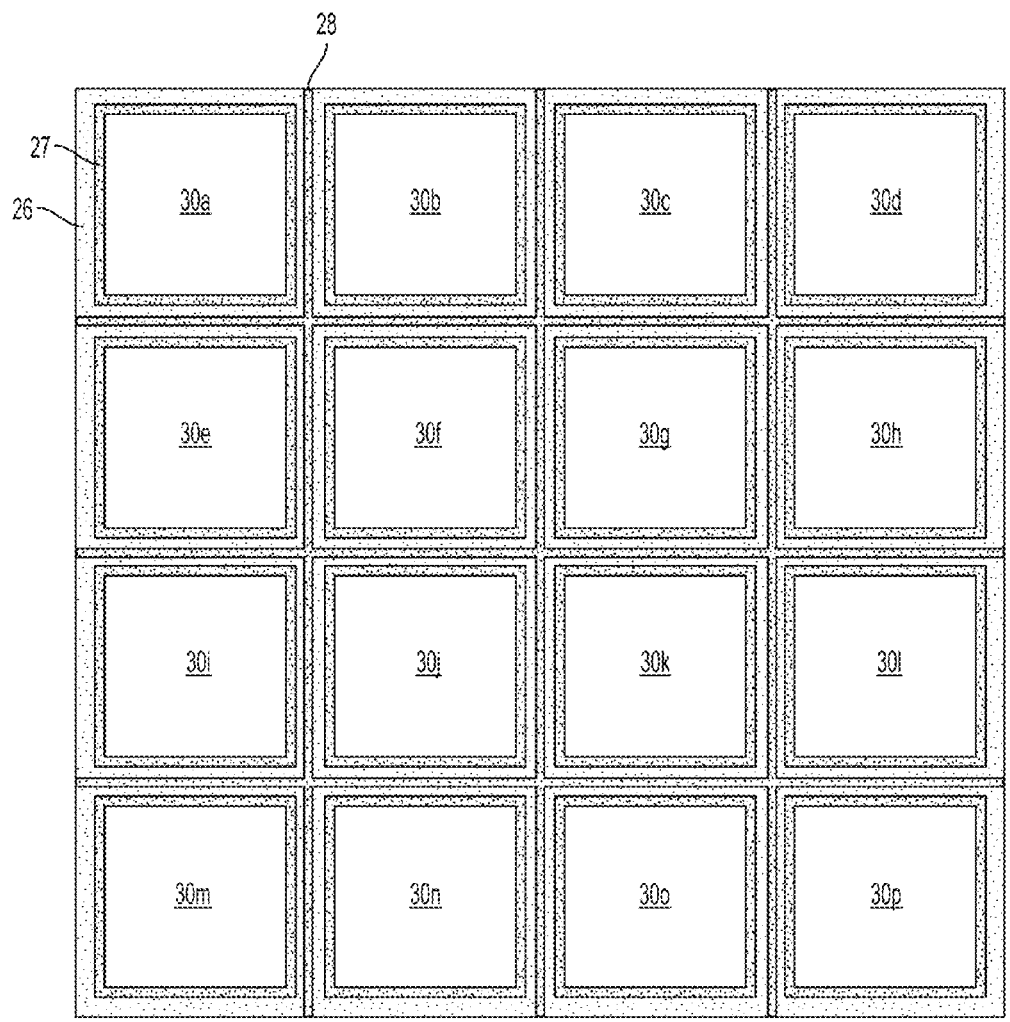
FIG. 15 is a diagram showing a sunnyside view of a MIBS solar cell embodiment with a plurality of full-periphery closed loop MIBS bypass diodes surrounding a plurality of solar cell isles or islands sharing a continuous backplane (example shown as an N×N array of isles or islands with N being an integer; other N×M arrays of isles or islands may be used with N and M being different integers) monolithically forming a solar cell—all the MIBS regions and solar cell isles or islands are electrically isolated using trench isolation regions, using a continuous backplane shared among the isles/islands and related MIBS bypass diodes.

FIG. 15 is a schematic diagram showing a sunnyside view of a MIBS solar cell embodiment with a plurality of full-periphery closed loop MIBS bypass diodes, for example MIBS bypass diode 26 with its semiconductor substrate electrically isolated from cell 30*a* semiconductor substrate by full-periphery isolation trench 27, isolated from a plurality of solar cells (or islands of solar cells sharing a continuous backplane and sharing M1 and M2 metallization layers—also known as iCell™) 30*a*-30*p* by full-periphery laser-scribed (or another suitable scribing method as described above) trenches, such as cell isolation trenches (trenches cut through the semiconductor substrate and landing or terminating on the shared continuous backplane sheet) 28, to form a mini-cell array based on a plurality of cell islands or tiles all located on a common continuous backplane (a solar cell comprising a plurality of mini-cells or smaller cell islands—also known as iCell™) sharing a common (and in some embodiments continuous) shared backplane and formed from a common originally continuous and subsequently partitioned solar cell semiconductor substrate (partitioning performed through the trench isolation pattern).

FIG. 15 shows the schematic sunnyside view of the MIBS-enabled solar cell comprising a plurality of mini-cells and full-periphery closed-loop rim diodes) on a shared continuous permanently attached backplane sheet and a single original semiconductor substrate (from a starting CZ or FZ or multi-crystalline wafer, or grown such as with epitaxial deposition). Each mini-cell island 30*a*-30*p* may have a full periphery isolation trench (through-semiconductor scribe or cut regions, landing or terminated on the shared continuous backplane sheet) and full-periphery MIBS rim diode (such as MIBS bypass diode 26 and periphery isolation trench 27 for cell 30*a*)—thus each mini cell has a corresponding MIBS rim diode, or in other words there is may be at least one MIBS rim diode per mini cell, all sharing the same shared continuous backplane for the iCell™. In some instances, the total area of the full-periphery trench isolation gap (e.g., 27) and the MIBS device (e.g., 26) is made to be a relatively small fraction (less than about a few percentage points and particularly less than about 1%) of the total area of the associated mini-cell (e.g., 30*a*). This is a design rule to ensure that the area allocated to the non-photogenerating solar cell areas is minimized for maximum effective total-area solar cell and PV module efficiency. The mini-cells sharing a common continuous backplane sheet in an iCell™ configuration may be electrically connected in series through the cell metallization pattern design although other electrical interconnections of the mini-cells such as parallel or a combination of series and parallel are also possible and practical. These interconnections are made through the overall iCell™ M1 and M2 metallization layers.

As a representative example, FIG. 15 shows a 4×4 array of equally sized and shaped mini-cells to make an iCell™ on a shared continuous backplane, and each mini-cell having a corresponding full-periphery closed-loop rim diode (either Schottky diode or pn junction diode). The semiconductor regions of the plurality of mini-cells and associated MIBS devices are all from a single original continuous semiconductor substrate (either from a starting semiconductor wafer or grown by a deposition method such as epitaxial growth), subsequently partitioned to create electrical isolation among various device substrates through the trench isolation regions. In general, this architecture may use an N×N array of mini-cells and corresponding full-periphery closed-loop rim diodes with N being an integer equal to or greater than two to form mini-cell array. And while FIG. 15 shows a symmetrical N×N mini-cell array for a full-square-shaped solar cell, the mini-cell design may have an asymmetrical array of N×M mini-cells. The mini-cells may be square-shaped (when N=M for a square-shaped master cell) or rectangular (when N is not equal to M and/or the master cell is rectangular instead of square shaped), or various other geometrical shapes such as polygons such as hexagons.

Further, the mini-cells comprising a master cell or iCell™ (a master cell refers to an array of mini-cells sharing a common continuous backplane sheet and all originating from the same original solar cell semiconductor substrate (from a starting wire-sawn wafer or grown by a deposition method such as epitaxial growth) subsequently partitioned into the mini-cell regions through the trench isolation regions) may optionally have substantially equal areas although this is not required. The mini-cells in the mini-cell array may be electrically isolated from each other using trench isolation formed by a suitable cutting or scribing technique such as laser scribing or plasma scribing (or water jet scribing or ultrasonic scribing or etc.). Moreover, each mini-cell semiconductor substrate is electrically isolated from its corresponding adjacent full-periphery closed-loop MIBS diode semiconductor substrate using trench isolation gap while the substrates share the same continuous electrically insulating backplane. All the trench isolation regions on the solar cell may be formed during the same manufacturing process step, for example a single process step such as a pulsed laser-scribe process step during the cell fabrication process flow.

The MIBS diode may be a pn junction diode used as the MIBS device or shade management switch. A pn junction MIBS diode fabrication process to produce a MIBS-enabled solar cell of may have the following, among others, attributes and benefits:

In some solar cell processing designs such as the IBC solar cells with backplane-enabled two-level metallization architecture as described in this invention, there may be essentially no change to or added process steps/tools in the main solar cell fabrication process flow to implement MIBS (for example assuming back-junction/back-contact crystalline silicon solar cell fabrication using either epitaxial silicon and porous silicon/lift-off processing in conjunction with a reusable crystalline silicon template or silicon substrate from a starting CZ/FZ monocrystalline silicon wafer or silicon substrate from a starting cast multicrystalline silicon wafer, and using an electrically insulating continuous backplane shared between the solar cell and MIBS devices). Thus, there is essentially no added manufacturing cost to implement MIBS along with the solar cell.

In a back-contact/back-junction (or IBC) solar cell design utilizing a crystalline semiconductor absorber layer such as a semiconductor substrate layer formed by an epitaxial lift-off cell process or from a starting crystalline (CZ monocrystalline or FZ monocrystalline or cast multi-crystalline wafer), following the completion of the cell processing involving most of the back-contact, back-junction cell process steps (backside doped base and emitter regions, backside passivation, base and emitter contact openings, and patterned M1 metallization layer), the following processes may be performed (provided as an example of various possible process flows—many variations and embodiments of IBC process flows are possible and not all are included and described specifically in this invention): (i) backplane sheet attachment or lamination to the solar cell backside; (ii) in the case of using an epitaxially grown silicon layer on porous silicon on reusable template: pre-release trench isolation scribe (for example using a pulsed nanoseconds laser scribe tool or alternatively using another scribing tool such as plasma scribe or mechanical dicing scribe) of the semiconductor substrate (i.e., the thin epitaxial silicon substrate) to define the epitaxial silicon lift-off release boundary (Note: This step is not required when the solar cell and MIBS are fabricated on CZ monocrystalline wafer or FZ monocrystalline wafer or cast multi-crystalline wafer, without using epitaxial growth of silicon on a reusable template); (iii) in the case of using an epitaxially grown silicon layer on porous silicon on reusable template: mechanical lift-off release of the backplane-supported cell and its detachment from the reusable crystalline silicon template (Note: This step is not required when the solar cell and MIBS are fabricated on CZ monocrystalline wafer or FZ monocrystalline wafer or cast multi-crystalline wafer, without using epitaxial growth of silicon on a reusable template); (iv) optional laser trim (for example using a pulsed nanoseconds or microseconds or picoseconds laser source) of the backplane-laminated cell for precision trim and to establish the final desired precise dimensions for the solar cell in conjunction with its associated MIBS; (v) pulsed nanoseconds laser scribing (or plasma scribing or mechanical dicing scribing or water jet scribing or another suitable scribing technique) on the sunny-side of the solar cell to form the trench isolation region(s) and to define the inner solar cell semiconductor island(s) and the peripheral rim diode(s) semiconductor regions, this step providing and defining the MIBS region with its semiconductor region electrically isolated from the solar cell semiconductor region through the trench isolation (trench gap) regions; (vi) and, subsequent cell sunny-side optional wet etch as needed (e.g., to thin the silicon substrate if desired), texture and post-texture surface clean, followed by additional cell process steps such as PECVD sunny-side passivation and anti-reflection coating layer(s) deposition, and final completion of rear side cell metallization including via holes through the backplane to provide access to pre-specified regions of patterned M1 layer, and formation of patterned second level metallization (or patterned M2) and conductive via plugs (for instance, by penetration of M2 metal through the drilled via holes to interconnect patterned M2 and patterned M1 layers according to a pre-specified pattern of conductive via plugs). In the representative process flow described above and in the case of using an epitaxially grown silicon layer on porous silicon on reusable template for the solar cell and its associated MIBS, the trench isolation scribing process and tool may optionally be the same as the process and tool used for pre-release trench scribe and/or the post-release precision trim of the backplane-laminated solar cell and MIBS substrate.

The laser scribed (or any suitable scribe or cut process capable of forming relatively narrow trenches through the entire thickness of the semiconductor substrate layer, terminating and landing on the backplane sheet with negligible removal or trenching of the backplane sheet material and without compromising the integrity of the continuous backplane sheet) trench isolation process may be performed (for example using a pulsed nanoseconds laser source) to create complete through-semiconductor (e.g., through-silicon in the case of silicon-based solar cell and MIBS) trench regions within thin semiconductor substrate layer through the entire thickness of the semiconductor layer (e.g., epitaxial silicon or silicon substrate from a starting crystalline silicon wafer) and substantially stopping at the backplane with minimal or negligible removal of the backplane material—thus forming the electrically isolated semiconductor rim region (e.g., n-type crystalline silicon when forming n-type IBC cells) for the MIBS diode and the semiconductor island region for solar cell, assuming an n-type base (hence, n-type semiconductor cell and MIBS substrate layer) and p+ emitter solar cell (which is common doping type for a back-contact/back-junction or IBC solar cell). If desired, the semiconductor substrate may be a p-type silicon layer (hence, p-type base for the solar cell) and the doped field emitter region on the cell backside may be an n+ doped (e.g., phosphorus or arsenic doped) junction region.

The pn junction MIBS diode pattern may be one of many possible pattern designs. For instance, in one MIBS diode pattern, the peripheral rim diode p+ emitter region (formed concurrently with the IBC solar cell doped emitter region) may be a continuous closed-loop band sandwiched between (or surrounded by) the n-type base regions (n-type semiconductor is also used within the solar cell island as the base of the solar cell), this pattern is shown in FIG. 16 (dimensions not shown to scale).

Figure 16:
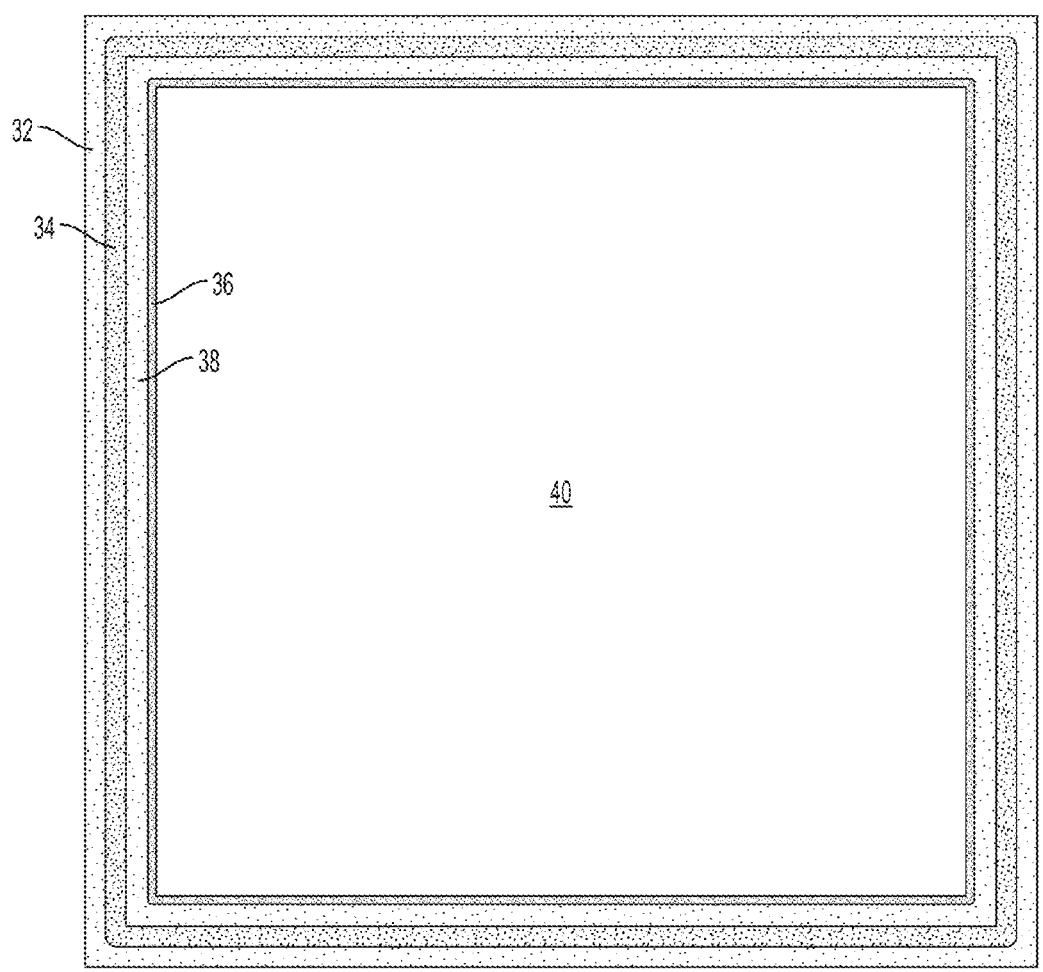
FIG. 16 is a schematic diagram showing a top view of a MIBS device with a back-contact/back-junction solar cell embodiment (both the MIBS and associated solar cell sharing a continuous backplane) with a full-periphery closed-loop (rim-shaped) continuous pn junction diode, comprising the regions of opposite n-type and p-type semiconductor doping polarities.

FIG. 16 is a schematic diagram showing a top view of a MIBS back-contact/back-junction (i.e., IBC) solar cell embodiment with a full-periphery closed-loop continuous pn junction diode (MIBS rim diode width and other relative cell dimensions are not shown to scale here). This representative embodiment is described using an n-type semiconductor layer (i.e., an n-type base for the IBC solar cell). However, similar structures can be made using p-type semiconductor layer (i.e., a p-type base for the IBC solar cell). Solar cell island 40 (e.g., IBC solar cell with n-type base) is surrounded by full-periphery trench isolation region 36 which isolates solar cell semiconductor substrate 40 from the MIBS rim semiconductor substrate region comprising n-type (e.g., phosphorus or arsenic doped) region 38 and p+ doped (e.g., boron or gallium doped) surface region 34 (inner n doped region 38 and outer n doped region 32 surround or sandwiched p+ doped region 34) and the n-doped substrate region is also underneath the p+ and outer n doped region 32 are in electrical communication with each other, and surround the p+ doped surface region 34 on its sides and underneath, forming a pn junction diode for the MIBS device), all sharing a common continuous backplane and formed from a common originally continuous and subsequently partitioned solar cell semiconductor substrate using the trench isolation gaps. FIG. 16 shows the p+ doped (serving as the field emitter junction of the solar cell and the p+ region of the pn junction diode) and n-doped silicon substrate (the n-doped substrate region in the solar cell island 40 also serves as the solar cell base region) regions of the full-periphery MIBS rim diode which is attached or laminated to the same common continuous backplane sheet or substrate as solar cell 40. In this representative example for an IBC solar cell with n-type base and p+ emitter, the solar cell itself has an n-type silicon solar cell base and p+ doped silicon solar cell emitter junction region. In the case where a Schottky diode is used as a MIBS instead of a pn junction diode, p+ doped region 34 in the MIBS rim region may be replaced with an aluminum or aluminum-silicon alloy Schottky contact to n-type silicon (thus no p+ doping in the MIBS region in the latter scenario in order to allow formation of Al/n-type silicon Schottky contact). In some instances a Schottky contact rectifier may provide a superior MIBS device as compared to a pn junction diode since a Schottky diode may be made with a smaller forward-bias voltage compared to a pn junction diode (for instance, about 0.2 V to 0.5 V for Schottky diode compared to about 0.6 V to 0.8 V for a pn junction diode), hence, a smaller power dissipation with Schottky diode MIBS compared to a pn junction MIBS.

FIG. 16 shows the doped MIBS pn junction diode regions: doped p+ diode region 34 forming the p+n junction diode as well as the surrounding n-type silicon regions 32 and 38 sandwiching or surrounding and enveloping the p+ doped closed loop band. Using a harmonized and concurrent MIBS and solar cell manufacturing process flow, the p+ doped region of the MIBS pn junction diode may be formed together and concurrent with the p+ emitter (either the field emitter or the p+ doped emitter contact regions in the case of solar cells with double-doped selective emitter and doped emitter contact regions) of the main solar cell during a back-contact/back-junction (i.e., IBC) solar cell fabrication process flow using either in-situ-doped n-type epitaxial silicon or n-type starting wafer without reliance on epitaxy (e.g., CZ or FZ mono-crystalline wafer or cast multi-crystalline wafer) as the base region of the solar cell. Similarly, the n-type silicon region used in both the solar cell as its base region (in case of IBC solar cell with n-type base) and its associated MIBS is the n-type semiconductor base of the solar cell (for instance, in the case of using an epitaxially grown silicon layer on porous silicon on reusable template, formed during the in-situ-doped epitaxial silicon deposition process). The n+ doped region for conductive (e.g., metallic by M1 layer) ohmic contact of the lightly-doped or n-type region of the MIBS diode may also be formed together and concurrent with the more heavily doped known as n+ doped base contact region for conductive (e.g., metallic by M1 layer) ohmic contact of the n-type base region of the solar cell. Thus, the MIBS pn junction diode device layers and fabrication process steps are essentially harmonized with and the same as those of the solar cell itself without MIBS, hence there may be only negligible or essentially no added manufacturing cost for the MIBS diode implementation along with the solar cell manufacturing.

The full-periphery p+ doped region 34 (enveloped and surrounded by the n-type substrate region) may occupy a portion to most (for instance, from about 5% to about 95%, and more particularly about 20% to about 80%) of the trench-isolated rim semiconductor substrate surface area and may be separated from the edges of the trench-isolated rim diode and the sidewall edge of the MIBS by the inner n-type region 38 and outer n-type region 32 (the inner and outer n-type regions are essentially the n-type substrate region) to keep the p+n junction edge and depletion region edge away from the MIBS rim pn junction diode edges or sidewalls (in order to prevent degradation or increase of the reverse leakage current and prevent degradation or decrease of the breakdown voltage of the pn junction diode). The p+ doped region (formed concurrently with the solar cell emitter) forms the MIBS pn junction rim diode for integrated cell-level shade management and reverse bias protection of the solar cell in case of partial or full shading. The MIBS p+n junction diode and its related depletion region edges may be kept away (recessed) from the passivated edges of the rim diode (the inner boundary at isolation trench 36 and outer boundary forming the sidewall edge of the rim diode) in order to ensure good bypass diode performance and related low reverse leakage current and high reverse breakdown voltage. The edges of the trench-isolated MIBS rim pn junction diode may also be passivated at the same time and using the same passivation and ARC process that is used to form the solar cell sunny-side passivation and ARC layer(s) is, for example by a Plasma-Enhanced Chemical-Vapor Deposition or PECVD process to deposit hydrogenated silicon nitride or a combination of hydrogenated silicon nitride and an underlying passivation layer comprising amorphous silicon or amorphous silicon oxide or amorphous silicon oxynitride or amorphous silicon oxycarbide or silicon dioxide or aluminum oxide or a combination thereof. As an example, assuming a total rim (comprising inner n-type region 38, outer n-type region 32, and p+ doped region 34) semiconductor (e.g., crystalline silicon) width of, for example, about 400 microns, the doped p+ region may have a width of about 300 microns and is separated from each sidewall edge by about 50 microns (in other words inner n-type region 38 outer n-type region 32 each having a width of about 50 microns). Alternatively and as another example, assuming a total rim (comprising inner n-type region 38, outer n-type region 32, and p+ doped region 34) semiconductor (e.g., crystalline silicon) width of, for example, about 600 microns, the doped p+ region may have a width of about 200 microns and is separated from each sidewall edge by about 200 microns (in other words inner n-type region 38 outer n-type region 32 each having a width of about 200 microns). Other absolute and relative dimensions both smaller and larger are possible in accordance with the disclosed subject matter. And while the MIBS diode embodiment of FIG. 16 is shown as a closed-loop full-periphery rim pn junction diode here, many other embodiments of the MIBS diode are possible including, but not limited to: non-closed-loop trench-isolated MIBS rim diode, trench-isolated MIBS diode islands clustered near or at the edge of the solar cell (shown in FIG. 17), trench-isolated MIBS diode islands distributed throughout the solar cell area, etc.

Alternatively, and described in reference to structure shown FIG. 16, the MIBS rim diode may have a full-periphery closed-loop continuous Schottky diode instead of the pn junction diode as described above and shown in FIG. 16 (MIBS rim diode width and other relative cell dimensions not shown to scale). In a Schottky diode MIBS embodiment, the p+ diode region 34 forming the p+n junction diode of FIG. 16 is alternatively not formed and is replaced with a lightly doped n-type silicon (which may be the same as that used for the solar cell n-type base or the solar cell n-type silicon substrate itself) used to form a suitable Schottky barrier contact, for instance, an Aluminum/n-type Si Schottky barrier contact closed loop band, where the Aluminum Schottky barrier contact essentially has the same overall structure as that of the p+ diode region 34 as shown in FIG. 16 and is surrounded or enveloped and sandwiched by n-type silicon substrate regions. In the case of using an epitaxially grown silicon layer on porous silicon on reusable template, the n-type silicon region of the MIBS diode used for subsequent aluminum Schottky barrier contact may be formed together and concurrent with the n-type epitaxial base of the main solar cell during the back-contact/back-junction solar cell fabrication process flow using in-situ-doped n-type epitaxial silicon deposition as the base region of the solar cell. Similarly and in the case of using an epitaxially grown silicon layer on porous silicon on reusable templat—the n-type silicon region (used in both the solar cell base as well as for the non-Schottky/ohmic contact regions of the MIBS Schottky diode) may be the same in-situ-doped epitaxial base of the solar cell formed during the epitaxial silicon deposition process. Alternatively, in the case of using a starting crystalline silicon wafer (such as CZ mono-crystalline or FZ mono-crystalline or cast multi-crystalline wafer) instead of epitaxial silicon deposition, the n-type silicon substrate from the starting crystalline silicon wafer serves both as MIBS diode n-type region used for subsequent aluminum Schottky barrier contact formation as well as the n-type base region of the main solar cell. In either case (either using n-type crystalline starting wafers without epitaxy or using n-type epitaxial silicon growth), the n+ doped regions (e.g., more heavily doped regions—doped with an n-type dopant such as phosphorus) providing the heavily doped regions for low-resistance ohmic contacts of the n-type region of the MIBS Schottky diode (positioned on at least one side or both sides of the Schottky contact, such as the aluminum/n-type silicon Schottky contact band, thus sandwiching or surrounding the metallic (e.g., aluminum) Schottky contact band, and spaced apart from the edges of the aluminum Schottky barrier contact to prevent shunting or increased reverse leakage current) may also be formed together with the n+ doped regions for low-resistance ohmic contacts of the n-type base region of the solar cell. Therefore, as with the MIBS pn junction diode, the MIBS Schottky barrier diode device layers and fabrication process steps are essentially harmonized with and the same as those of a solar cell without MIBS thus adding negligible or no incremental manufacturing cost for a MIBS Schottky barrier diode implementation.

The full-periphery aluminum/n-type silicon Schottky barrier contact region of the MIBS device may occupy from a small fraction (as low as a few percentage points) up to most (for instance, as large as about 95%) of the trench-isolated peripheral rim surface area and in some instances may be spaced and separated from the edges of the trench-isolated rim diode and the sidewall edges of the structure by the inner and outer n-type regions (passivated and n+ contacted n-type regions surrounding the Schottky barrier contact region) to keep the Schottky barrier (e.g., aluminum/n-type silicon) Schottky contact edge and semiconductor depletion region edge away from the passivated MIBS rim diode edges or sidewalls (in order to prevent degradation of the Schottky barrier diode characteristics such as the reverse bias current and reverse breakdown voltage as well as the forward-bias characteristics). The aluminum/n-type silicon Schottky contact region forms the MIBS Schottky rim diode for cell-level shade management and reverse bias protection. The Schottky barrier metal (e.g., aluminum or aluminum silicon alloy) contact to lightly doped n-type region as well as the ohmic metal (e.g., aluminum or aluminum silicon alloy) contact to the surrounding n-type regions through the heavily doped n+ contact regions can be formed on the MIBS device using the same metal layer as patterned M1 and at the same time and using the same process used to form the patterned M1 layer for the solar cell. The MIBS device Shottky barrier contact such as the aluminum/n-type silicon or aluminum-silicon alloy/n-type silicon Schottky barrier contact may be kept away from the passivated edges of the rim diode by the inner and outer n-type silicon region (the surrounding n-type region not covered by the Schottky barrier metal) boundaries in order to ensure a good bypass diode performance characteristics, including both the forward-bias and reverse bias characteristics. The edges of the trench-isolated MIBS rim Schottky diode may also be passivated at the same time that the solar cell sunny-side passivation and ARC layer(s) is/are deposited, for example by a PECVD (to deposit single-layer or multi-layer passivation & ARC) process or a combination of Atomic-Layer Deposition or ALD (e.g., to deposit Aluminum Oxide passivation layer) and PECVD (to deposit hydrogenated silicon nitride passivation/ARC layer) process. The same passivation and ARC process and films used for the solar cell sunnyside also form the passivation on the MIBS frontside (the side opposite the patterned M1 side).

Figure 17:
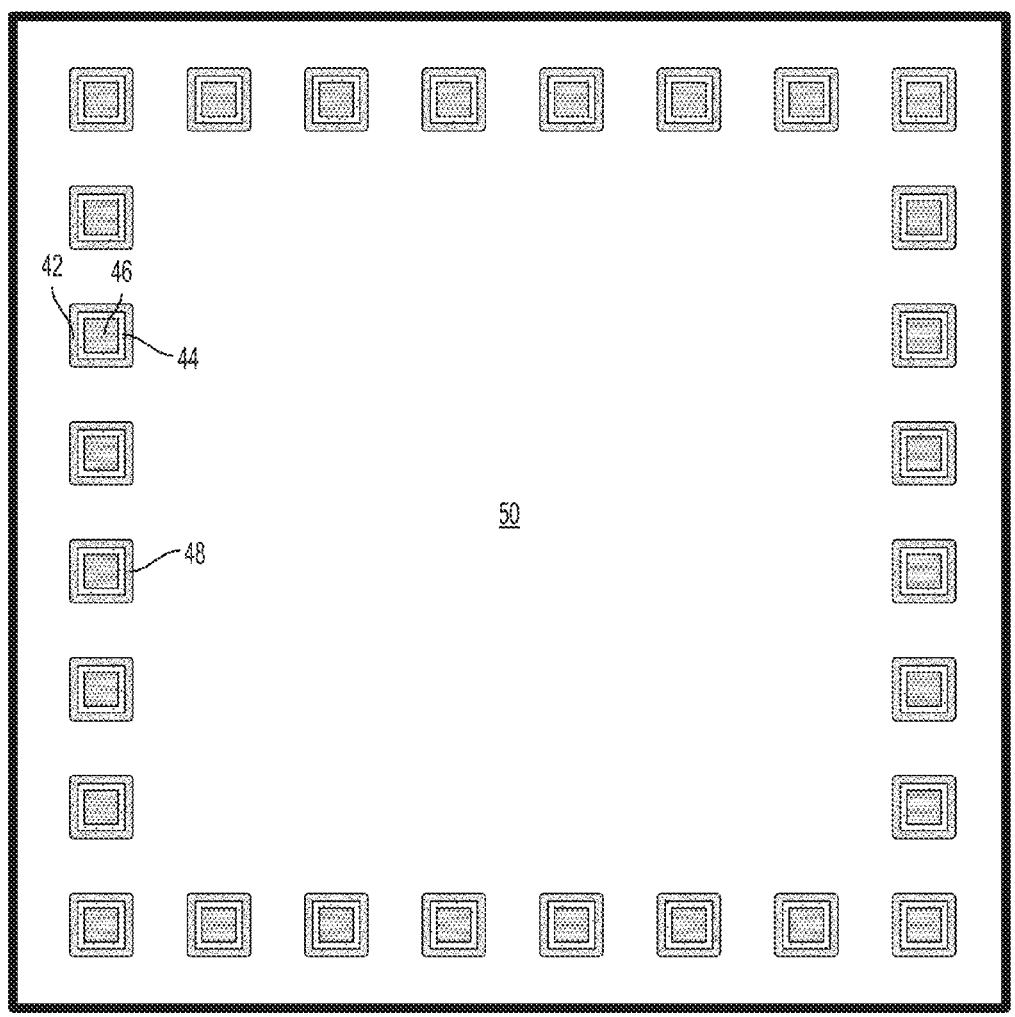
FIG. 17 is a diagram showing a top view of a plurality of MIBS devices associated with a back-contact/back-junction solar cell embodiment with an alternative geometrical MIBS diode pattern using a plurality of pn junction diode islands positioned around and near the peripheral edges of the solar cell, with the plurality of the MIBS islands and solar cell sharing a continuous backplane.

FIG. 17 is a schematic diagram showing a top view of a MIBS back-contact/back-junction (or IBC) solar cell embodiment with an alternative geometrical MIBS diode pattern using a plurality of pn junction diode islands associated with the solar cell. Importantly, and as described earlier in relation to FIG. 16, this embodiment may also utilize a Schottky barrier diode MIBS instead of pn junction diode MIBS. The MIBS diode solar cell of FIG. 17 comprises solar cell 50 and a plurality of segmented or separated MIBS diode islands 48 clustered around and near the peripheral edge of the solar cell (MIBS diode dimensions are not shown to scale) and all MIBS islands and the solar cell substrate sharing a common continuous backplane and formed from a common originally continuous and subsequently trench-isolation-partitioned solar cell semiconductor substrate (either formed from a starting silicon wafer or formed by an epitaxial silicon lift-off process as described earlier). While this representative embodiment shows the solar cell 50 and a plurality of segmented or separated MIBS diode islands 48 clustered around and near the peripheral edge of the solar cell, it should be understood that alternative embodiments and designs may use a plurality of segmented or separated MIBS diode islands 48 distributed according to any desired pattern throughout the solar cell substrate area (and not just clustered around and near the peripheral edge of the solar cell. In case of IBC cells with n-type semiconductor (base) layer, MIBS diodes islands 48 are pn junction MIBS diode islands formed of p+ doped junction regions 46 (formed concurrently with the solar cell p+ field emitter and/or emitter contact diffusion region, and which, again, may alternatively be Schottky diode islands (comprising a suitable Schottky barrier metal contact such as aluminum or aluminum-silicon alloy contact to n-type silicon), surrounded and enveloped by n-doped (lightly n-doped) silicon region 44 (which can be the same as the original n-type semiconductor substrate used as the base region of the solar cell) and the MIBS semiconductor substrate electrically isolated from solar cell 50 substrate by full-periphery isolation trench 42 landing and terminated on the shared continuous electrically insulating backplane sheet or substrate.

MIBS device plurality of pn-junction diode islands may be made in any geometrical shapes, for example including but not limited to square or circular or rectangular or other polygonal shapes, and have side dimensions, for example, in the range of less than about 100 microns up to about 100's of microns and may be as large as several millimeters. The number of trench-isolated MIBS diode islands may be in the range of at least 2 to tens or even several hundreds of MIBS islands. The MIBS islands may be distributed throughout the solar cell substrate according to any desired distribution pattern (including but not limited to a uniform regular distribution pattern throughout the solar cell substrate area or clustered around and near the edge of the solar cell or any other desired distribution pattern). All MIBS diode islands 48 have trench isolated edges for proper electrical isolation of the MIBS diode silicon islands from the solar cell silicon substrate region (all sharing the same continuous electrically insulating backplane sheet or substrate). As shown in FIG. 17 (example described for MIBS with n-type base/substrate IBC solar cell), the p+ doped junction region of each of the MIBS islands may be spaced apart and separated from the edges of the trench-isolated MIBS diode by n-doped region 44 (which may be the same as the n-type silicon substrate material layer as the solar cell n-type base region and the same as the original n-type silicon substrate layer from the starting wafer or grown n-type epitaxial layer). The p+ doped region (formed concurrently with and using the same process used for formation of the solar cell field p+ emitter and/or p+ emitter contact diffusion region, the latter for IBC with a selective emitter process) concurrently forms the pn junction diode in each MIBS island. The p+n junction formed in the MIBS islands is may be spaced apart and kept away from the passivated edges of the MIBS pn junction diode (in order to keep the semiconductor pn junction depletion layer edge away from the edge and achieve the best pn junction diode forward bias and reverse bias characteristics without any edge-induced degradations). The edges (as well as the front surface region) of the MIBS diode islands are passivated at the same time that the solar cell sunny-side passivation & ARC layer(s) is/are deposited, for example by a PECVD passivation process (or a combination of PECVD and another process such as ALD if desired). As a representative example, assuming a MIBS diode island side dimension of, for example, about 500 microns, doped p+ region 46 may have a side dimension of about 400 microns, separated from each sidewall edge by about 50 microns (in other words the width of n-doped region 44 adjacent the p+ doped region is about 50 microns), while other dimensions and arrangements are possible. Alternatively and as another representative example among numerous possibilities, assuming a MIBS diode island side dimension of, for example, about 600 microns, doped p+ region 46 may have a side dimension of about 200 microns, separated from each sidewall edge by about 200 microns (in other words the width of n-doped region 44 adjacent the p+ doped region is about 200 microns).

Figure 18A:
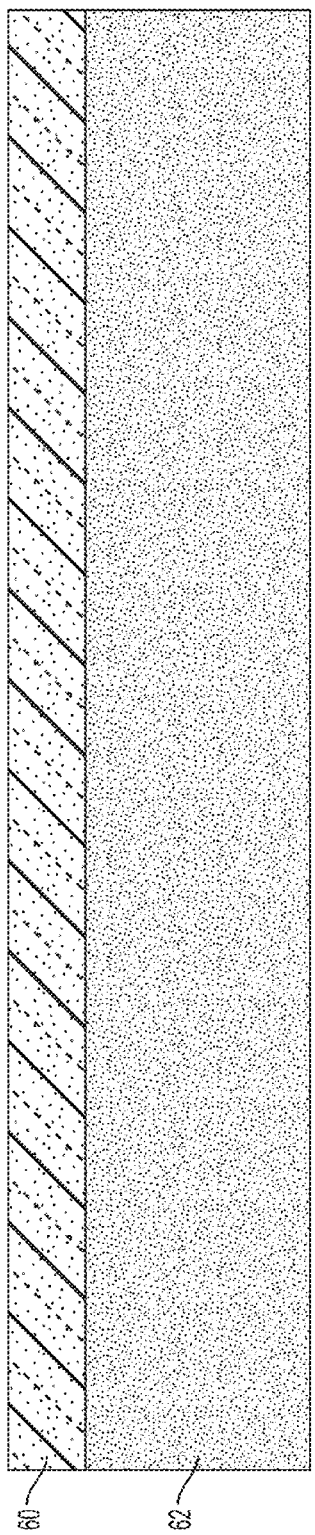
FIGS. 18A and 18B are cross-sectional schematic diagrams of a MIBS peripheral rim diode and a solar cell on a monolithically-shared continuous backplane at different stages of solar cell (and concurrent MIBS) device processing using a process flow harmonized for both the solar cell and MIBS devices.
Figure 18B:
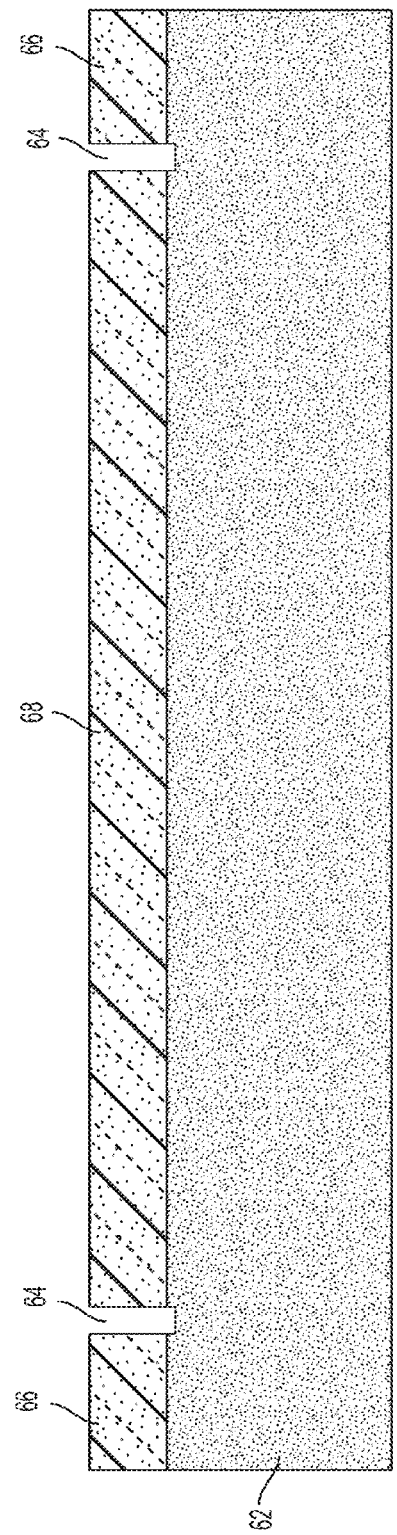

FIGS. 18A and 18B are cross-sectional diagrams of a MIBS rim diode and a solar cell on a shared continuous backplane substrate (permanently laminated or attached to the original semiconductor substrate from which the solar cell and its associated MIBS device are formed) at different stages of solar cell and MIBS processing. As in the other figures, in these figures the MIBS rim diode and solar cell relative dimensions are not shown to scale. This representative example shows a backplane-laminated solar cell semiconductor substrate before and after a trench isolation (e.g., pulsed laser cutting or scribing through the semiconductor substrate) process to define and separate a peripheral (such as full-periphery rim) MIBS diode silicon substrate region from the solar cell silicon substrate region (both formed from the same original silicon substrate either from a starting silicon wafer or an epitaxial silicon lift-off process). In the case of back-contact/back-junction solar cells fabricated using epitaxial silicon lift-off processing, the trench isolation process is performed by scribing through silicon substrate from the sunny-side after completion of the back-contact/back-junction solar cell processing through completion of the patterned M1 metallization layer and after completion of the backplane lamination and solar cell epitaxial lift-off and detachment from the reusable template. Alternatively, in the case of back-contact/back-junction solar cells fabricated using crystalline silicon (e.g., CZ mono-crystalline or FZ mono-crystalline or cast multi-crystalline silicon) wafers, the trench isolation process is performed by scribing through silicon substrate from the sunny-side after completion of the back-contact/back-junction solar cell processing through completion of the patterned M1 metallization layer and after completion of the backplane lamination process on the solar cell backside.

FIG. 18A is a cross-sectional diagram showing a relatively thin (for instance, in the thickness range of about 50 microns to 250 microns) backplane sheet (such as a suitable aramid fiber prepreg sheet) 62 attached or laminated to back-contact/back-junction (IBC) solar cell 60 comprising a thin (e.g., from about one micron up to about 200 microns and more particularly in the thickness range of less than about 100 microns) silicon substrate, for example an epitaxial silicon layer with a semiconductor substrate thickness in the range of about 5 microns to 80 microns or a silicon wafer (CZ monocrystalline or FZ mono-crystalline or cast multi-crystalline silicon wafer) with a post-lamination silicon substrate thickness in the range of about 50 microns to 200 microns (structural solar cell details not shown) after solar cell substrate fabrication. As shown, epitaxial silicon layer has an n-type background doping. In the case of epitaxial silicon lift-off processing for solar cells, the thin silicon substrate fabrication steps may comprise on-template back-contact/back-junction cell processing through completion of the patterned M1 metallization layer, backplane lamination, and epitaxial silicon lift-off release and separation from a reusable silicon template (lift-off release and separation are not used in the process when using starting silicon wafers instead of epitaxial lift-off silicon substrates). The back-contact/back-junction cell of FIG. 18A is shown before formation of trench isolation regions (for instance, to be formed by pulsed laser scribing) to define and electrically isolate or partition the MIBS rim diode substrate and serve as the MIBS rim diode isolation boundary. Thin backplane sheet 62 may be a flexible electrically insulating prepeg sheet with a thickness in the range of about 50 to 200 microns, and having a relatively close CTE match to the silicon substrate (for instance, by using a suitable aramid fiber/resin prepreg material). Thin backplane sheet 62 is laminated (for instance, by thermal/vacuum/pressure lamination) to the rear side of the back-contact/back-junction solar cell 60 and acts as the common continuous backplane substrate shared by both the solar cell and MIBS rim diode. The backplane retains the overall structural integrity of the integrated solar cell and MIBS device sharing the backplane as well as the patterned M1 and M2 layers.

FIG. 18B is a cross-sectional diagram showing solar cell 60 attached to its continuous backplane sheet 62 of FIG. 18A after formation of trench isolation regions 64 (for instance, by pulsed laser scribing or another suitable method) to define and isolate MIBS rim diode 66 and solar cell island 68. The trench isolation process cuts through the entire thickness of the semiconductor substrate layer, forming the trench isolation narrow gap (e.g., trench with a width of a few microns up to 100's of microns, and more particularly with a trench width of <100 microns), without substantially digging into the continuous backplane sheet (depending on the thickness of the backplane sheet, there is an allowance for the trench isolation process to remove from a few microns to about 10's of microns of the backplane material in the exposed trench regions, in some instances removing a relatively small or no amount of the backplane material sheet). For example, solar cell island 68 may have square (or pseudo square) side dimensions in the range of about 156 mm×156 mm or about 210 mm×210 mm (other dimensions may be chosen for the solar cell, to provide solar cell areas over a wide range from just a few cm² to 100's of cm² and even over 1000 cm²). Trench isolation regions 64 may have a width in the range of a few microns up to about 100 microns (or even larger). Pulsed laser trenching is capable of forming trench isolation regions with relatively narrow width (which is desirable) on the order of about 20 to 60 microns (hence, little silicon substrate is wasted for the important purpose of trench isolation between the solar cell and MIBS device). MIBS rim diode region 66 may be a full periphery rim diode with a width in the range of about 200 microns to 600 microns (smaller or larger widths are also possible) and may be either a pn junction diode or a Schottky barrier diode bypass switch. In some instances, the overall width of the full-periphery rim diode is chosen to be as small as possible in order to make the MIBS device area a relatively small fraction of the total solar cell area (in order to maximize the total-area efficiency of the solar cell and resulting solar PV module). The resolution capability of the overall solar cell and MIBS fabrication process (such as screen printing, laser ablation, etc.) determine the capability for the minimum achievable width of the full-periphery rim MIBS device.

Figure 19A:
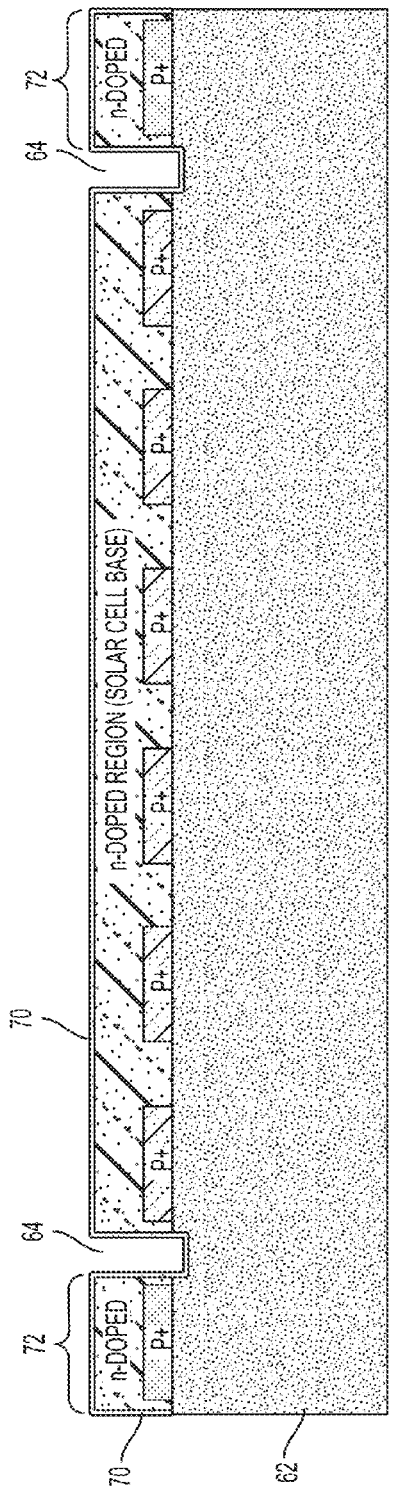
FIGS. 19A and 19B are cross-sectional schematic diagrams detailing MIBS rim diode (pn junction diode MIBS in FIG. 19A or Schottky diode MIBS in FIG. 19B) solar cell embodiments of the back-contact back-junction solar cell after completion of manufacturing processes to form a MIBS-enabled back-contact/back-junction solar cell with monolithically-integrated shade management.
Figure 19B:
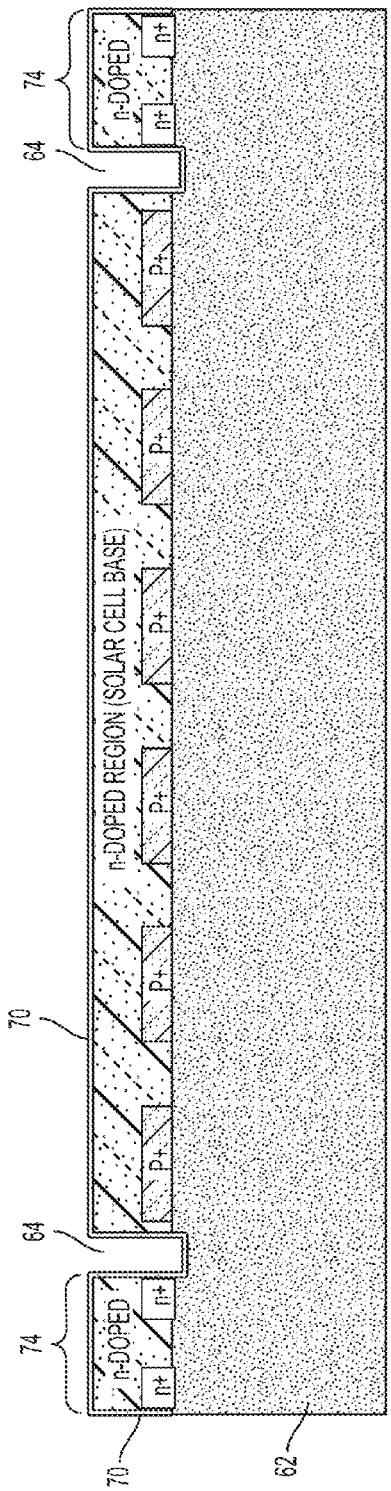

FIGS. 19A and 19B are cross-sectional diagrams detailing MIBS rim or full-periphery diode solar cell embodiments of the back-contact/back-junction solar cell shown in FIG. 18B on shared continuous backplane 62 after completion of manufacturing processes to form a MIBS-enabled back-contact/back-junction IBC solar cell, including frontside passivation and ARC coating on the textured surface of the solar cell (and MIBS device) shown as passivation/ARC coating layer 70 in the solar cell and 72 in the MIBS device. The solar cell and MIBS structural details such as the patterned M1 and M2 metallization layers are not shown here. FIG. 19A shows a MIBS implementation using a pn junction peripheral rim diode bypass switch. Trench-isolated MIBS rim pn junction diode region 72 comprises an n-doped (e.g., phosphorus doped) region and a p+ doped (e.g., heavily boron doped) region and is used as a pn junction diode bypass switch. MIBS rim pn junction diode region 72 may be a full peripheral rim diode, for example with a width in the range of about 200 to 600 microns (smaller or larger dimensions are also possible as described earlier). The MIBS rim diode and solar cell relative dimensions are not shown to scale. In one fabrication embodiment, FIG. 19A shows a backplane-laminated (or backplane-attached) MIBS-enabled solar cell after completion of manufacturing processes for a MIBS-enabled back-contact/back-junction (IBC) solar cell comprising completion of back-contact/back-junction cell processing through patterned first-level metallization or M1 (for example made of screen printed or PVD aluminum or aluminum-silicon alloy or another suitable metal comprising nickel, etc.), backplane lamination, epitaxial silicon lift-off release and separation from a crystalline silicon reusable template (if using an epitaxial silicon lift-off process to form the substrate—this process not applicable when using a starting crystalline silicon wafer), formation of trench isolation regions (e.g., by pulsed laser scribing or cutting) to define the MIBS rim diode border, optional silicon etch, texture and post-texture clean, passivation & ARC deposition (e.g., by PECVD or a combination of ALD and PECVD), and fabrication of the final patterned second-level metal or M2 (along with the conductive via plugs) on the backplane.

As can be seen in FIG. 19A, the process used to form the p+ emitter regions (field emitter regions and/or heavily doped emitter contact regions) of the solar cell may also be used to form p+ junction doping for the MIBS pn junction formation. The patterned M1 metal (not shown), for example made of aluminum or an aluminum alloy such as aluminum with some silicon addition, not only provides the contact metallization or the first-level metallization for the solar cell but also creates metallization contacts (to both the p+ region and the n-type substrate region through n+ doped contact windows) for the MIBS pn junction diode. The n– doped silicon region of the MIBS pn junction diode is formed from the same n-type silicon substrate which also serves as the base region of the solar cell (e.g., from the n-type silicon wafer when using starting n-type crystalline silicon wafers without epitaxy, or from in-situ-doped n-type crystalline silicon layer formed by epitaxial deposition when using epitaxial silicon lift-off processing to form the solar cell and MIBS substrate)—the substrate bulk region doping may also be referred to as the background doping of the substrate. The patterned M1 and M2 metallization structures complete the required monolithic solar cell and MIBS pn junction diode electrical interconnections and also ensure the MIBS diode terminals are properly interconnected to the respective solar cell base and emitter terminals to provide cell-level integrated shade management and continual solar cell protection against shading. As can be seen in FIG. 19A, the sidewall edges and the top surface of the MIBS pn junction diode are also passivated using the same passivation layer(s) and processes used to passivate the sunny-side and edges of the solar cell, passivation/ARC coating layer(s) 70. FIG. 19A does not show some details of the solar cell and MIBS structure such as the patterned M1 and M2 metallization, rear side passivation layer, M1 contact holes, M1-M2 via holes through the backplane, and the n+ doped contact windows for n-type substrate M1 connections in the MIBS device structures.

FIG. 19B shows a MIBS implementation using a peripheral Schottky rim diode bypass switch. Isolated Schottky rim diode bypass switch region 74 comprises an n-doped region and an inner and outer n+ region and is used as a Schottky diode bypass switch. Schottky rim diode bypass switch region 74 may be a full peripheral rim diode with a width in the range of 200 to 600 microns (this dimension may be chosen to be larger or smaller than this range).

In one fabrication embodiment, FIG. 19B shows a backplane-laminated or backplane-attached MIBS-enabled solar cell after completion of manufacturing processes for the MIBS-enabled back-contact/back-junction solar cell comprising completion of the back-contact/back-junction cell processing through a patterned first-level metallization or M1 (for example made of a suitable conductor which can serve as both an effective ohmic contact on heavily doped silicon as well as an effective Schottky barrier contact on lightly doped silicon, such as aluminum or aluminum-silicon alloy), backplane lamination, epitaxial silicon lift-off release and separation from a crystalline silicon reusable template when using an epitaxial lift off silicon substrate (this process not applicable or required when using starting crystalline silicon wafers instead of epitaxial lift off substrates), formation of the trench isolation (e.g., by pulsed laser scribing or cutting) to define MIBS rim Schottky diode border, optional silicon thinning etch, texture and post-texture clean, formation of passivation and ARC (e.g., by PECVD or a combination of PECVD with another process such as ALD), and fabrication of a final patterned second-level metal or M2 on the backplane (in conjunction with the conductive M1-M2 via plugs).

As can be seen in FIG. 19B, the n-type silicon substrate also used as the base region of the solar cell (for instance formed through in-situ-doped epitaxial deposition when using epitaxial lift off processing, or from a starting n-type crystalline silicon wafer when not using epitaxial lift off processing) is also used as the n-type silicon substrate region for the MIBS Schottky diode. The M1 metal (not shown), for example made of aluminum or a suitable aluminum alloy such as aluminum with some silicon addition, not only makes the M1 ohmic contact metallization for the solar cell (for both base region through n+ doped contact openings and emitter contact region through p+ doped contact openings of the solar cell), but also creates the metallization contacts for the MIBS Schottky diode (both the non-ohmic Schottky barrier contact on the lightly doped n-type silicon substrate region and the ohmic contact to n-type silicon through heavily doped n+ doped regions). The lightly doped n-type silicon substrate region of the MIBS diode is from the same n-type substrate used for the solar cell and serving as its base region (e.g., the n-type substrate may be formed by in-situ-doped n-type epitaxial silicon deposition when using epitaxial silicon lift-off processing, or from a starting n-type crystalline silicon wafer when not using epitaxial silicon lift off processing). The heavily doped n+ diffusion doping of the n-type silicon region for the MIBS Schottky diode ohmic contacts to the n-type silicon substrate may be formed at the same time and using the same process also used for producing the heavily doped n+ doped base contact regions for the solar cell (in preparation for the subsequent patterned M1 metallization). The combination of patterned M1 and M2 metallization structures complete the solar cell and MIBS Schottky diode electrical interconnections and ensure the MIBS diode terminals are properly connected to the solar cell terminals to provide cell-level integrated shade management and solar cell protection. As can be seen FIG. 19B, the sidewall edges and the top surface of the MIBS Schottky diode are also passivated using the same passivation & ARC layer(s) and process(es) used to form the passivation and ARC layer(s) on the sunny-side and edges of the solar cell—note passivation/ARC coating layer(s) 70. Again, FIG. 19B does not show some structural details of the solar cell structure including but not limited to the patterned M1 and M2 metallization layers.

The MIBS embodiments disclosed herein employ trench isolation in conjunction with a shared backplane substrate to establish partitioning and electrical isolation between the semiconductor substrate regions of the MIBS device and the solar cell. One method to create the trench isolation regions is pulsed (such as pulsed nanoseconds) laser scribing. Below is a summary of key considerations and laser attributes for using a laser scribing process to form the trench isolation regions which partition and electrically isolate the MIBS diode substrate region(s) from the solar cell substrate region(s), such as for the previously described full-periphery MIBS rim diode or pn junction or Schottky diode:

Pulsed laser scribing for trench isolation formation may use a pulsed nanoseconds (ns) laser source at a suitable wavelength (e.g., green, or infrared or another suitable wavelength to ablate the semiconductor layer with relatively good selectivity to cut through the semiconductor substrate layer with respect to the backplane material) commonly used and proven for scribing and cutting through silicon. The laser source may have a flat-top (also known as top-hat) or a non-flat-top (e.g., Gaussian) laser beam profile. It's possible to use a pulsed laser source wavelength which is highly absorptive in silicon but can partially or fully transmit through the backplane (hence, cut through the semiconductor layer without substantially removing the backplane material after the through-semiconductor layer laser cutting is complete and the beam reaches the backplane sheet). For instance, we may use a pulsed nanoseconds IR or green laser beam which may effectively cut through the silicon substrate layer and partially transmit through the backplane material (hence, removing little to negligible amount of backplane material during the trench isolation cut).

The pulsed laser beam diameter and other properties of the pulsed nanoseconds laser source may be chosen such that the isolation scribe width is in the range of a few microns up to 10's of microns as a width much larger than about 100 microns would be rather excessive and result in unnecessary waste of precious silicon substrate area and some reduction of the total-area efficiency of the solar cells and modules. Thus, it is beneficial to minimize the trench isolation areas as compared to the highly desirable solar cell area. In practice, pulsed nanoseconds laser cutting can produce trench isolation regions with width in the desirable range of about 20 microns up to about 60 microns. For instance, for a 156 mm×156 mm solar cell, a trench isolation width of 30 microns corresponds to an area ratio of 0.077% for the trench isolation area as a fraction of the cell area. This represents a rather negligible area compared to the solar cell area, in other words, this small ratio provides negligible waste of solar cell area and ensures negligible loss of total-area solar cell and module efficiency.

Pulsed nanoseconds (ns) laser scribing or cutting to form trench isolation may be performed immediately after the backplane lamination process when using starting crystalline silicon wafers to fabricate the solar cells and associated MIBS devices (and in the case of solar cells and MIBS fabricated using epitaxial silicon lift-off processing, after completion of the backplane lamination process and subsequent lift-off release of the laminated cell from the reusable template and after or before pulsed laser trimming of the solar cell) in a back-contact/back-junction solar cell fabrication process as described herein. In the case of solar cells and MIBS fabricated using epitaxial silicon lift-off processing, the trench isolation scribing or cutting process may optionally use the same pulsed laser tool and source used for pre-release scribing of the epitaxial silicon layer to define the lift-off release boundary and/or used for post-release trimming of the laminated solar cell. Thus, no additional laser process tool may be needed in order to form the trench isolation regions.

Pulsed nanoseconds (ns) laser scribing to form trench isolation may also be used to define the fully isolated MIBS rim diode region outside an isolated solar cell island surrounded by and defined by the rim. Alternatively, the pulsed ns laser scribing process may form other designs of the MIBS diode, such as in a multiple MIBS diode island design as well as and many other possible MIBS pattern designs.

Pulsed laser scribing may be used to cut through the thin (such as sub-200 microns and more particularly sub-100 microns) silicon substrate layer (from the sunny side) and substantially stop on the backplane material sheet. If desired and/or required, a simple real-time in-situ laser scribe process end-pointing, such as using reflectance monitoring, may be used for process control and end-pointing to minimize trenching or material removal in the backplane sheet while enabling complete through-semiconductor-layer laser cut.

The sidewalls of the solar cell and the MIBS rim diode regions may be subsequently wet etched (for instance, as part of the solar cell sunny-side wet etch/texture process), post-texture cleaned, and passivated (by deposition of the passivation and ARC layer) during the remaining solar cell fabrication process steps.

Below, key process flow attributes are described in relation to a solar cell utilizing a pn junction diode used as a MIBS device implementation.

The solar cell process flow may remain essentially unchanged and harmonized (hence negligible to no added incremental fabrication cost) for MIBS device implementation with no additional fabrication process tools required to implement the MIBS pn junction diode with each solar cell.

Trench isolation processes defining the full-periphery MIBS rim diode region and the solar cell island (or any other design for the MIBS diode arrangement) may be performed on the sunny-side or frontside, for example after completion of the cell processing through patterned M1 layer and backplane lamination to the silicon substrate (and in the case of solar cells made from epitaxial silicon lift-off processing, after epitaxial substrate release process), and in the case of solar cells made from epitaxial silicon lift-off processing, may use the same pulsed laser source used for pre-release silicon scribing as part of the release tool. The trench isolation laser scribing completely scribes the silicon substrate layer and substantially stops on the backplane with little or negligible removal of the backplane material.

A MIBS pn junction diode p+ doped junction region may be formed concurrently with the same process steps that form the solar cell p+ doped field emitter (or the solar cell p+ doped emitter contact regions in case of an IBC cell process with selective emitter process comprising two different emitter heavily doped regions for the field emitter and for the emitter contact regions). The MIBS pn junction diode n– doped region may be same as the starting n-type crystalline silicon wafer used as the solar cell substrate and base region (or in the case of solar cells made from epitaxial silicon lift-off processing, the same as the in-situ-doped epitaxial solar cell base region). For instance, the same solar cell emitter and base doping processes (such as with APCVD, laser ablation, and thermal processing) used to fabricate the back-junction/back-contact solar cell may also be used to form the desired p+/n rim diode device structure concurrently and without added incremental process cost.

Metal-1 (M1) and Metal-2 (M2) conductor patterns may be designed such that the p+ doped electrode of the MIBS pn junction diode is connected to the n-type base of the solar cell and the n-type substrate region ohmic contact (through n+ doped contact regions formed together with the solar cell n+ doped base contact regions) electrode of the MIBS diode is connected to the p+ emitter of the solar cell. These properly formed connections may be designed in a distributed format to minimize undesirable current crowding and localized hot spots whenever the MIBS diode is activated and bypasses the solar cell as a result of solar cell shading.

Cell busbars (base and emitter busbars) and final coarser pitch pattern of interdigitated based and emitter fingers may be formed on the second level metal M2 pattern (which may be formed on the exposed surface of the backplane, in other words the opposite plane of the solar cell sunny-side). Patterned M2 also monolithically completes the interconnections of the solar cell with its MIBS device. The M1 pattern only has fine-pitch interdigitated base and emitter fingers without busbars to eliminate electrical shading due to busbars.

In the following section, the required MIBS diode area using a pn junction diode MIBS implementation embodiment is described. For exemplary purposes, this example is described for a 156 mm×156 mm solar cell. The minimum MIBS bypass diode area is governed by considerations such as the maximum allowable forward-bias (ON-state) resistance of the diode—or in other words when the MIBS diode is activated and forward biased as a result of solar cell shading. Assuming an n-type substrate region, the solar cell base, with phosphorus doping of about $3\times10^{15}$ cm$^{-3}$, this corresponds to an n-type substrate (or n-type base region) resistivity of about 1.60 Ω·cm. And further assuming a relatively thin crystalline silicon base region thickness of about 40 μm (microns), the required MIBS bypass diode area for three different levels of allowable series resistance values (excluding contact resistance) may be calculated as follows (this example is provided as a very approximate order of magnitude calculation as a rough guideline):

For a maximum allowable series resistance of $R_s$=0.010Ω (max R.I$^2$=1W power dissipation for 5W cell):
Area=(1.6Ω·cm×40×10$^{-4}$ cm)/0.01Ω=0.64 cm$^2$ (MIBS device area~0.26% of solar cell area)
The rim width for 156 mm×156 mm cell: 0.64/(15.6×4) =0.010 cm=0.10 mm or 100 microns For a max allowable series resistance of $R_s$=0.005Ω (max R.I$^2$=0.5W power dissipation for 5W cell):
Area=(1.6Ω·cm×40×10$^{-4}$ cm)/0.005Ω=1.28 cm$^2$ (MIBS device area~0.52% of solar cell area)
The rim width for 156 mm×156 mm cell: 1.28/(15.6×4) =0.020 cm=0.20 mm or 200 microns For a max allowable series resistance of $R_s$=0.002Ω (max R.I$^2$=0.1W power dissipation for 5W cell):
Area=(1.6Ω·cm×40×10$^{-4}$ cm)/0.002 Ω=3.20 cm$^2$ (MIBS device area~1.30% of solar cell area)
The rim width for 156 mm×156 mm cell: 3.20/(15.6×4) =0.050 cm=0.50 mm or 500 microns Based on the above approximate calculations, for a 156 mm×156 mm solar cell a MIBS rim diode width in the range of about 100 μm to 500 μm is reasonable (in terms of limiting the on-resistance-induced power dissipation while maintaining a relatively small MIBS to solar cell area ratio) with the rim diode area being approximately ~0.26% to ~1.3% of solar cell area.

Figure 20A:
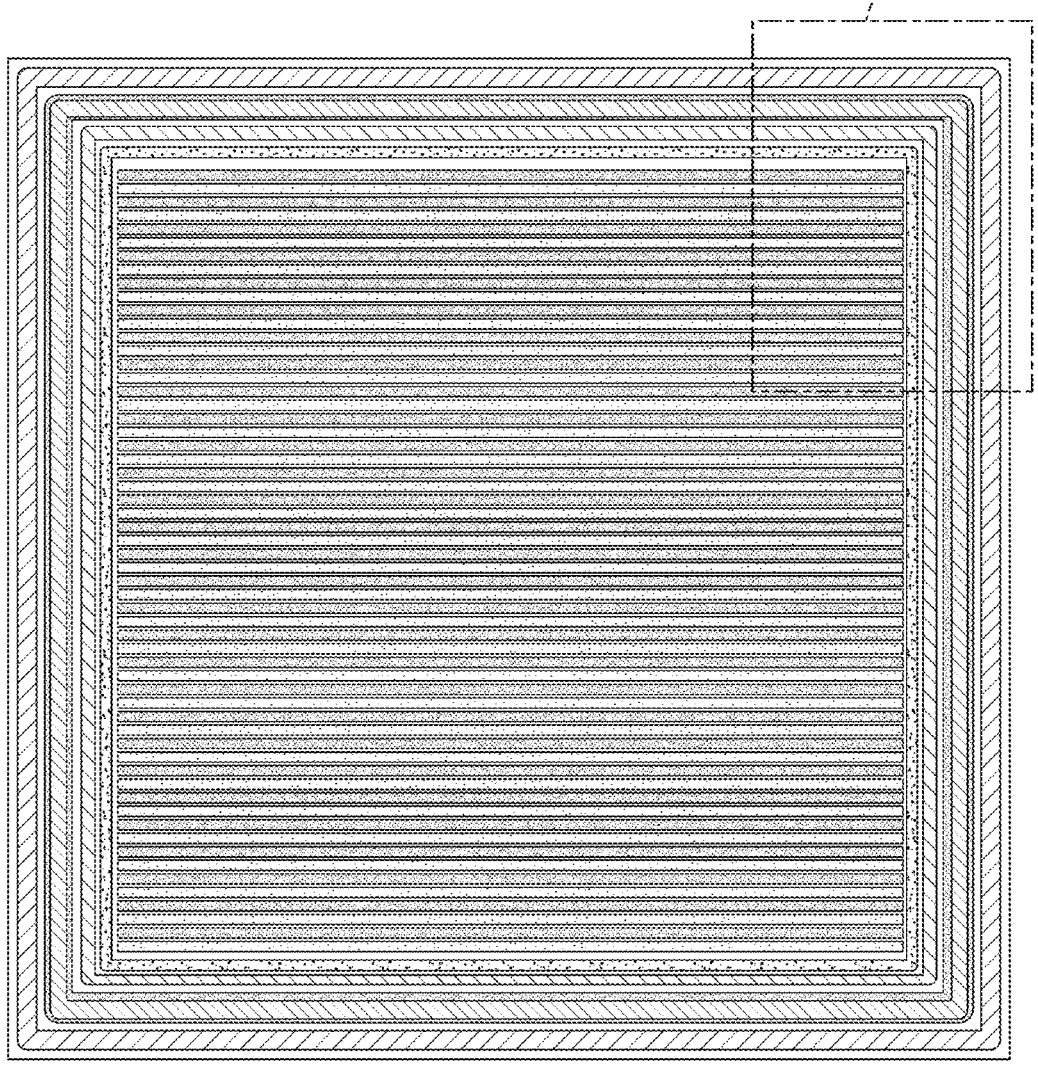
FIGS. 20A and 20B (FIG. 20B is the expanded view of a portion of FIG. 20A) are schematic diagrams showing a top view a first-level metallization pattern (M1) embodiment of MIBS (using either Schottky diode or pn junction diode), for example, using a relatively high-electrical-conductivity aluminum (or another suitable metal or metallic alloy) metallization (e.g., formed by PVD followed by patterning, direct screen printing of an aluminum or aluminum-silicon alloy or another suitable metallic paste, or another suitable M1 formation method)
Figure 20B:
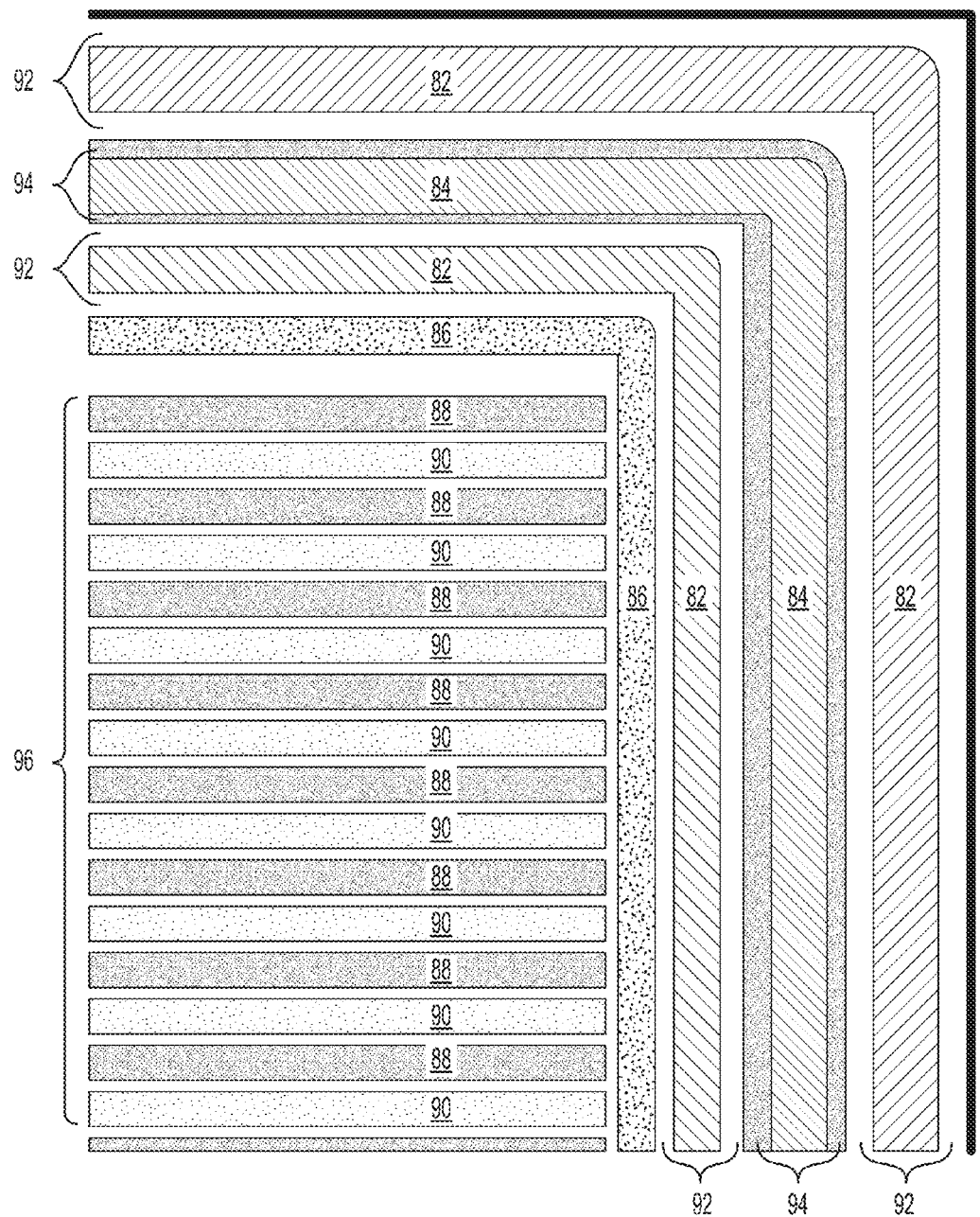

FIG. 20A is a schematic diagram showing a plan view of the first-level metallization pattern (M1) embodiment (patterned M1 metal layer formed over the cell and MIBS backside surface prior to the continuous backplane lamination to the semiconductor substrate), for example using aluminum or aluminum-silicon alloy metallization (or another suitable metallic or metallic alloy material), for a back-contact/back-junction (IBC) solar cell with a peripheral MIBS rim pn junction diode, such as that shown in FIG. 16. FIG. 20B is an expanded selection view of FIG. 20A provided for descriptive purposes. FIGS. 20A and 20B show a busbarless interdigitated solar cell base and emitter metal formed as patterned M1 layer (for example, aluminum or aluminum-silicon alloy) interdigitated base and emitter metal fingers 96 as well as the aluminum (or aluminum-silicon or another suitable conductor) metallization contacts forming the MIBS pn junction diode diode p and n contacts. Trench isolation region 86 partitions and electrically isolates the solar cell semiconductor substrate from the MIBS bypass diode semiconductor substrate region. Aluminum (or aluminum-silicon alloy or another suitable metal) contact metal is positioned on n-doped regions of the solar cell, shown as base metallization fingers 88, and also on n-doped regions of the MIBS bypass diode 92, shown as n doped region metallization contacts 82, (aluminum or aluminum-silicon alloy ohmic contacts are made through doped n+ contact diffusion regions). Aluminum or aluminum-silicon alloy contact metal is positioned on p+ doped regions of solar cell, shown as emitter metallization fingers 90, and also on p+ doped regions of the MIBS bypass diode 94, shown as p+ doped region metallization contacts 84, (through doped p+ contact diffusion regions). The patterned M1 aluminum or aluminum-silicon alloy metallization layer may be formed by patterned screen printing of an aluminum or aluminum alloy paste layer or by physical vapor deposition (PVD) of aluminum or aluminum alloy (such as aluminum silicon) followed by a patterning process (such as laser ablation). The thickness of the aluminum or aluminum-silicon alloy layer (M1 layer) may be in the range of a small fraction of 1 micron up to about few microns for M1 aluminum formed by PVD and in the range of a few microns up to 10's of microns (e.g., about 20 microns) for aluminum or aluminum-silicon alloy formed by screen printing of aluminum or aluminum-silicon alloy paste.

Alternatively, in a peripheral MIBS rim Schottky diode MIBS implementation embodiment of a back-contact/back-junction (IBC) solar cell, the first-level metallization (M1) pattern (for example aluminum or aluminum-silicon alloy metallization) may be the same that shown in FIGS. 20A and 20B. In a peripheral MIBS rim Schottky diode MIBS implementation as described with reference to FIG. 20B, the cell comprises busbarless interdigitated solar cell base and emitter metal (e.g., aluminum or aluminum-silicon alloy) ohmic fingers 96 as well as the aluminum or aluminum-silicon metallization contacts forming the MIBS diode non-ohmic Schottky barrier on lightly doped n-type silicon and ohmic contacts on heavily doped n+ silicon (the latter for ohmic contact to the n-type substrate). As part of patterned M1, aluminum (or aluminum silicon alloy) contact metal is positioned on or to overlap heavily doped n+ regions formed on n-type substrate regions of the solar cell, shown as base metallization ohmic fingers 88, and also on n+ doped ohmic contact regions formed on n-type substrate regions of MIBS Schottky bypass diode 92, shown as n doped region metallization ohmic contacts 82 (heavily n+ doped contact diffusion regions contacting n– doped silicon substrate). Aluminum or aluminum-silicon contact metal (as part of patterned M1 layer) is also positioned on heavily p+ doped regions of solar cell, shown as emitter metallization ohmic fingers 90, (through p+ doped contact diffusion regions). As part of patterned M1, aluminum or aluminum-silicon Schottky barrier contact metal 84 is also positioned directly on lightly doped n-type substrate regions of MIBS bypass diode 94, for example only on the n-type surface in order to form the Schottky barrier region of the rectifier. The patterned M1 aluminum or aluminum-silicon alloy (or another suitable material) metallization layers may be formed by patterned screen printing of an aluminum or aluminum-silicon (or another suitable conductive material) paste layer or by physical vapor deposition (PVD) of aluminum or aluminum-silicon (or another suitable conductive material) followed by a patterning process (such as laser ablation). The thickness of the aluminum layer may be in the range of a small fraction of 1 micron up to a few microns for M1 aluminum or aluminum-silicon alloy formed by PVD and in the range of a few microns up to 10's of microns (e.g., up to about 20 microns) for aluminum or aluminum-silicon formed by screen printing of a corresponding paste.

The back-contact/back-junction IBC solar cell and associated MIBS diode are metallized and interconnected to form a completed solar cell. Example metallization uses a two-level metallization structure in conjunction with and enabled by the solar cell and MIBS shared backplane with a first-level contact metallization pattern (M1), for example made of aluminum or a suitable aluminum alloy such as aluminum with a small percentage of silicon, formed prior to the backplane attachment/lamination and a second-level final patterned metallization layer (M2), for example made of a thicker high-conductivity conductor comprising aluminum and/or copper or a combination thereof and optionally having additional layers such as a barrier layer and/or a top solder layer. The inter-level connections between M1 and M2 may be made using conductive via plugs through via holes drilled or formed in the backplane layer prior to the formation of the patterned M2 layer with the backplane serving as the electrically insulating inter-level dielectric layer. Key attributes of the two-level monolithic solar cell and MIBS metallization structure described above are as follows:

- First-level metal M1 (for example formed on the solar cell backside prior to the backplane attachment and lamination) may be a patterned aluminum layer (and/or an alloy comprising aluminum such as Al and Si), made of PVD (plasma sputtering evaporation, ion-beam deposition, etc.) aluminum (or aluminum alloy) or screen printed aluminum (or aluminum alloy) paste.
- Patterned M1 serves as the contact metallization and forms the interdigitated base and emitter metallization lines on the solar cell (in some embodiments there are no busbars on M1 in order to eliminate or minimize electrical shading associated with busbars).
- In some embodiments, the patterned interdigitated M1 metallization fingers do not extend beyond the solar cell island to overlap underneath the trench isolation region and extend to the MIBS rim diode region. The electrical interconnections between the solar cell and its associated MIBS device are made using the patterned M2 layer and the conductive via plugs making patterned interconnections between the patterned M1 and M2 layers according to a pre-specified interconnection design.
- In the case of a full-periphery rim diode design used for MIBS, the M1 aluminum or aluminum alloy metallization level may be designed to form three concentric full-periphery continuous aluminum metallization loops (shown as square shaped loops for square-shaped cells) to make electrical ohmic contacts to the p+ doped junction region as well as to the inner and outer n– doped substrate regions (through n+ doped contact diffusion regions) of the MIBS rim diode.

The M2 metal level may be formed using screen printing and/or PVD (such as plasma sputtering and/or thermal evaporation and/or electron-beam evaporation, for instance for metallization comprising aluminum) and/or electrochemical deposition or plating (for instance, for metallization comprising copper), or other metallization processes (or a combination thereof) with a relatively inexpensive, low-resistivity conductor material comprising copper and/or aluminum (or a combination thereof).

The patterned M2 metal may be patterned in substantially orthogonal interdigitated fingers connected to the interdigitated on-cell M1 fingers through a plurality of conductive via plugs. In this design, the orthogonal arrangement of the coarser pitch M2 fingers of the solar cell with respect to the interdigitated finer pitch M1 fingers of the solar cell allow for the number of M2 fingers to be substantially less than the number of M1 fingers. For instance, the solar cell may have hundreds of M1 fingers directly formed on the cell prior to the backplane lamination while the number of M2 fingers formed after the backplane lamination may be typically a factor of approximately 5 to about 50 less than the number of M1 fingers.

Patterned M2 metal may also connect the heavily p+ doped and n-type substrate contact M1 metallization of MIBS pn junction diode to the base and emitter busbars of the solar cell, respectively. Alternatively, in the case of using a Schottky barrier diode for MIBS, patterned M2 metal may also connect the Schottky barrier contact (for instance, aluminum or aluminum-silicon alloy non-ohmic Schottky contact on lightly doped n-type silicon) and n-type ohmic contact M1 metallization of MIBS Schottky diode to the base and emitter busbars of the solar cell, respectively.

Again it is important to note that while the embodiments described herein have been largely explained in conjunction with back-contact/back-junction crystalline silicon solar cells using thin crystalline silicon absorber layers and continuous backplanes, it should be understood that aspects of the disclosed subject matter may be applied to other solar cell and module implementations by one skilled in the art, including but not limited to: non-IBC back-contact solar cells (including bt not limited to the MWT solar cells), front contact solar cells and corresponding PV modules; non-crystalline silicon solar cells and modules such as those made from crystalline GaAs, GaN, Ge, and/or other elemental and compound semiconductors; and, various wafer-based solar cells including back-contact/front-junction, back-contact/back-junction and front-contact solar cells made from crystalline semiconductor wafers, such as CZ mono-crystalline silicon wafers, FZ mono-crystalline silicon wafers, and cast multi-crystalline silicon wafers.

However, as noted earlier, the use of back-contact cells may be advantageous in some respects as MIBS implementations may be applied to back-contact cells without substantially impacting final module manufacturing. Further, availability of both the emitter and base interconnection leads on the backsides of the cells may further simplify the overall implementation of on-cell electronics for enhanced energy harvesting as well as additional cell-level monitoring and control functions.

Figure 21:
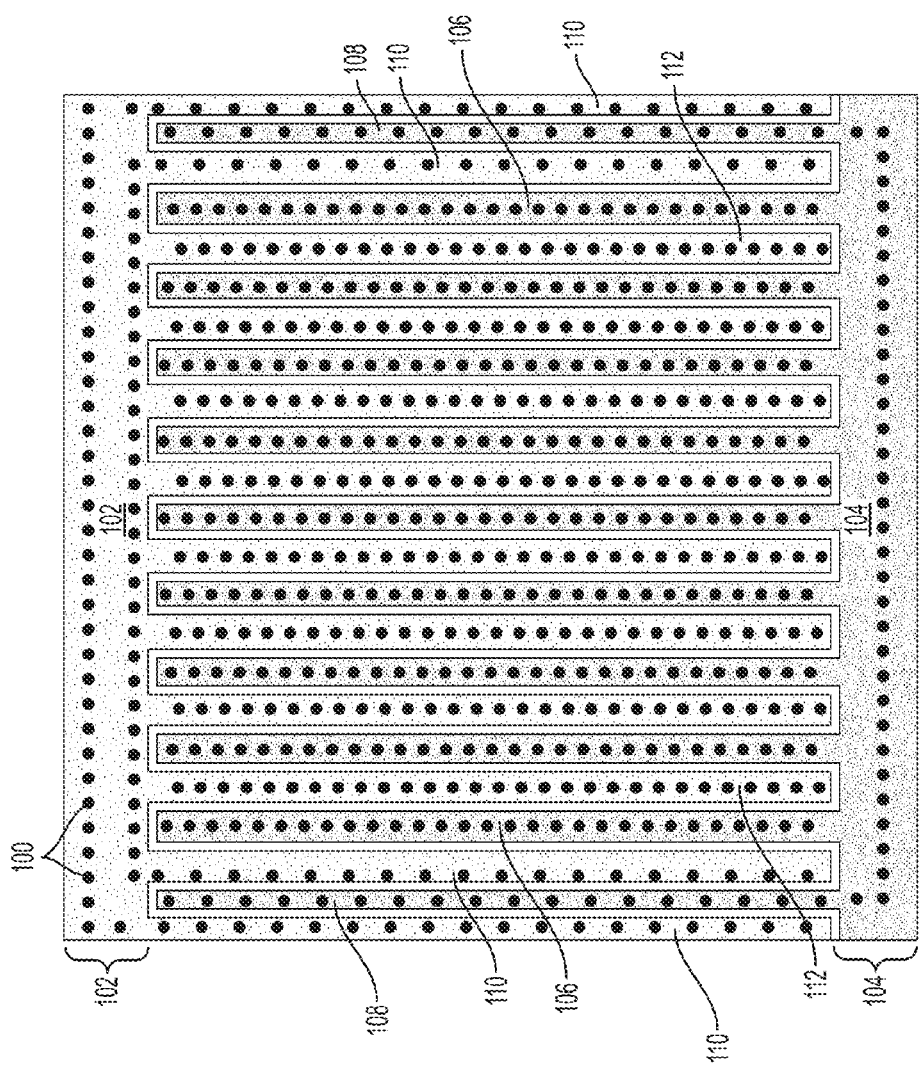
FIG. 21 is a diagram (Option 1) of the backside of an interdigitated back contact (IBC)/back junction solar cell with a peripheral MIBS rim diode (using pn junction or Schottky diode); this figure shows the schematic diagram of the second-level metal (Metal 2 or M2 fingers and busbars) pattern along with the plurality of conductive via plugs interconnecting patterned M2 level to the patterned Metal 1 (M1) level at designated regions, completing the solar cell as well as the MIBS rim electrical interconnections (solar cell and MIBS rim diode dimensions not shown to scale). The M2 finger pattern is may be substantially orthogonal or perpendicular to the M1 finger pattern and the number of M2 fingers is may be substantially smaller than the number of M1 fingers, i.e., M1 pattern is a fine-pitch pattern and M2 pattern is a coarse-pitch pattern.

FIG. 21 is a schematic diagram of the backside of a back-contact/back-junction solar cell with a peripheral MIBS rim diode (for example either a pn junction diode or a Schottky barrier diode) showing a second-level metallization pattern (M2) embodiment. In this design, the patterned M2 is positioned on the shared electrically insulating backplane and physically separated from the M1 layer by the backplane sheet. Patterned M2 layer comprises base busbar 104 which is connected to the MIBS pn junction diode p+ doped region M1 ohmic contact metal (for example p+ doped region metallization contacts 84 in FIG. 20B also formed as part of patterned M2 metallization layer), emitter busbar 102 which is connected to MIBS pn junction diode n− doped substrate region M1 metal ohmic contact (for example n doped region metallization contacts 82 in FIG. 20B), conductive via plugs 100 interconnecting M2 fingers to M1 fingers according to a pre-specified pattern (each M2 base finger is connected to all the M1 base fingers through the conductive via plugs, and each M2 emitter finger is connected to all the M1 emitter fingers through the conductive via plugs), and emitter interdigitated fingers 112 and base interdigitated fingers 106. FIG. 21 shows the patterned M2 layer overlaid in a substantially orthogonal or perpendicular orientation with respect to the M1 fingers on a patterned M1 layer (not shown in this figure) which may be, for example, a patterned M1 layer comprising the busbarless interdigitated solar cell base and emitter metal fingers as well as the aluminum (or aluminum-silicon alloy) metallization contacts forming the MIBS diode ohmic contacts such as that shown in FIG. 20A. The MIBS rim diode (pn junction diode or Schottky barrier diode) and solar cell and the related metallization dimensions are not shown to relative scale. Plurality of conductive via plugs 100 may be formed by drilling vias through the backplane and landing on the intended M1 regions (without punching through the M1 layer on the landing pads) and subsequently forming the conductive via plugs by M2 metallization process to interconnect the desired portions of M2 metallization to the specified portions of M1 metallization layer (i.e., the M2 emitter fingers are connected by the conductive via plugs to the M1 emitter fingers as well as the M1 contact to the MIBS n-type substrate; the M2 base fingers are connected by the conductive via plugs to the M1 base fingers as well as the M1 contact to the p+ region of the pn junction diode, or to the Schottky barrier M1 metal region of the Schottky barrier diode). The combination of M1 patterns as depicted in FIGS. 20A and M2 patterns as depicted in FIG. 21 connected through conductive via plugs completes the overall solar cell and associated MIBS device metallization as well as monolithic distributed interconnection of the MIBS terminals to the solar cell terminals which then may be used to form the monolithic integrated shade management interconnections at the cell level.

For the purpose of electrical polarity differentiation, FIG. 21 shows M2 layer in two shades of gray. The darker gray portion of M2 pattern comprises the solar cell base busbar 104 which is connected to the MIBS rim pn junction diode p+ doped (or Schottky diode aluminum/n-type silicon Schottky contact, if Schottky diode is used for MIBS) underlying M1 metallization region. As shown in this representative embodiment, the M2-M1 interconnections for the MIBS to solar cell interconnections are made through conductive via plugs located on three sides of the solar cell substrate: within base busbar 104 as well as two vertical base busbar fingers 108 on the left and right sides of M2 (one finger on each side). This structure forms a distributed interconnection between the base of the solar cell and the pn junction diode p+ terminal of the MIBS pn junction diode (or the aluminum (or aluminum-silicon)/n-type silicon Schottky barrier contact terminal of the MIBS Schottky diode). The interdigitated base fingers 106 shown as vertical fingers connected to base busbar 104 on the interior of M2 connect to the underlying M1 interdigitated base fingers (not shown) through conductive via plugs. Using an orthogonal transformation of M2 pattern relative to the M1 pattern shown in FIG. 20A, the number of M2 base fingers compared to the number of M1 base fingers may be substantially reduced, typically by a factor of approximately 5 to about 50. The lighter gray portion of M2 pattern includes the solar cell emitter busbar 102 which is connected to the MIBS rim pn junction diode n-type silicon substrate ohmic contact or the MIBS rim Schottky barrier diode n-type silicon ohmic contact (through doped n+ contact diffusion for n-type silicon ohmic contact) formed as part of the underlying M1 metallization region. As shown, interconnections are made through conductive via plugs on three sides of the solar cell: within emitter busbar 102 as well as four emitter busbar fingers 110 on the left and right sides (two fingers on each side). This structure forms a distributed interconnection between the emitter of the solar cell and the n-type silicon substrate (through n+ contact diffusion for ohmic contact) terminal of the MIBS pn junction diode or MIBS Schottky barrier diode. The emitter interdigitated fingers 112 connected to the emitter busbar on the interior of M2 connect to the underlying M1 interdigitated emitter fingers through the conductive via plugs. Again, by using an orthogonal transformation of M2 pattern relative to the M1 pattern, the number of M2 emitter fingers compared to the number of M1 emitter fingers may be substantially reduced, typically by a factor of approximately 5 to about 50. As a result of the M2 pattern orthogonal transformation, the M2 pattern (e.g., fingers) may have much larger minimum dimensions (or average finger widths) than the M1 finger pattern. For instance, the interdigitated solar cell base and emitter fingers and busbars on M2 have much wider metal fingers, and may also have much larger finger to finger pitch, than the interdigitated solar cell base and emitter fingers on patterned M1 layer. In this configuration, the narrowest M2 fingers are the side fingers (base busbar fingers 108 and emitter busbar fingers 110) for M2-M1 interconnections between the MIBS rim diode and solar cell terminals (connected through the conductive via plugs). In this configuration, the solar cell to MIBS device connections are made on three sides of the solar cell and MIBS through conductive via plugs from M2 to M1.

Figure 22:
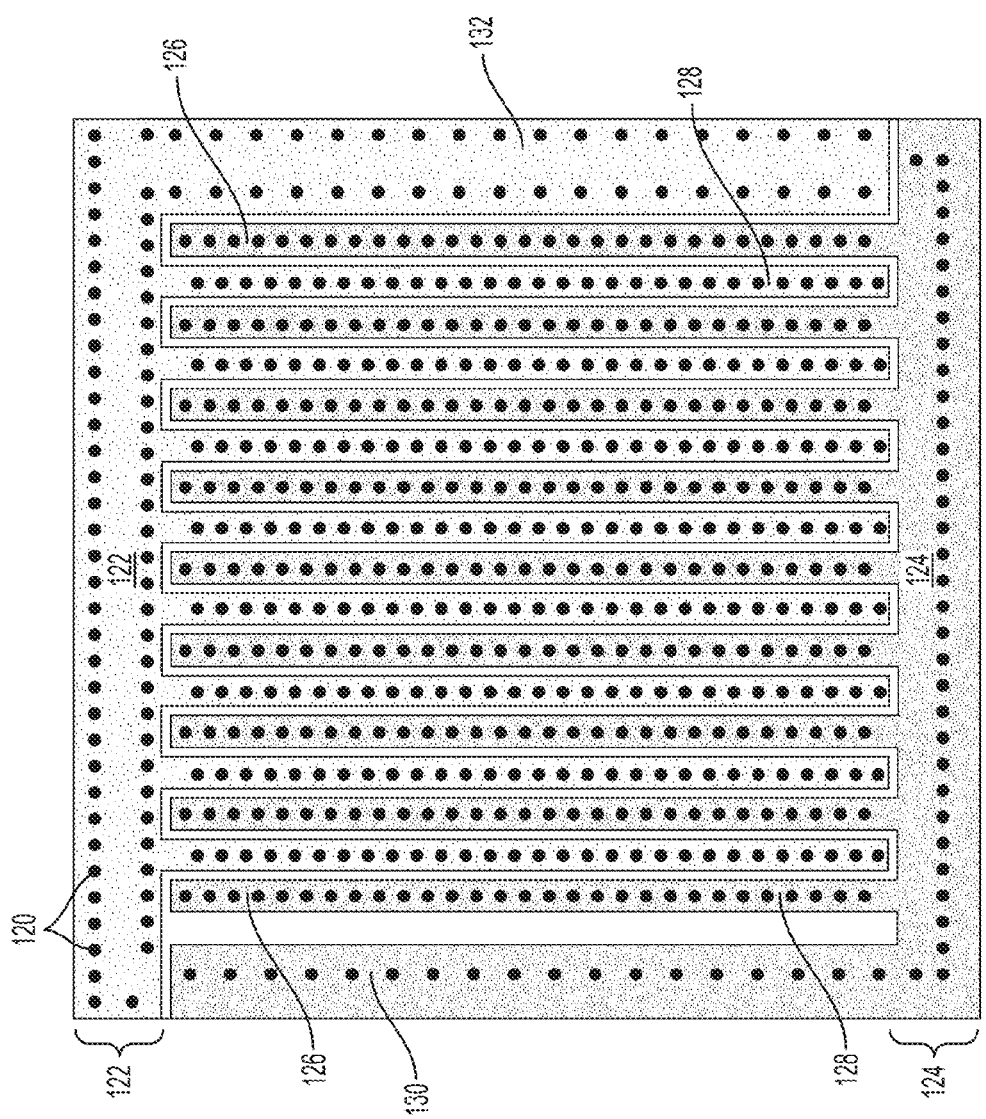
FIG. 22 is a diagram (Option 2) of the backside of an interdigitated back contact (IBC)/back junction solar cell with a peripheral MIBS rim diode (using pn junction or Schottky diode); this figure shows the second-level metal (Metal 2 or M2) pattern along with the conductive via plugs interconnecting patterned M2 to the patterned Metal 1 (M1), completing the cell as well as the MIBS rim electrical interconnections (solar cell and MIBS rim diode dimensions not shown to scale). The M2 finger pattern may be substantially orthogonal or perpendicular to the M1 finger pattern and the number of M2 fingers may be substantially smaller than the number of M1 fingers, i.e., M1 pattern is a fine-pitch pattern and M2 pattern is a coarse-pitch pattern.

FIG. 22 is a schematic diagram of the backside of a back-contact/back-junction solar cell with a peripheral MIBS rim diode (for example either a pn junction diode or a Schottky barrier diode) showing an alternative second-level metallization pattern (M2) embodiment. The patterned M2 is positioned on the shared electrically insulating continuous backplane and physically separated from the M1 layer by the laminated backplane. Patterned M2 comprises base busbar 124 which is connected to the MIBS pn junction diode p+ doped region M1 metal (for example p+ doped region metallization contacts 84 in FIG. 20B), emitter busbar 122 which is connected to MIBS diode n-doped substrate region M1 metal ohmic contact (for example n doped region metallization contacts 82 in FIG. 20B), conductive via plugs 120 connecting M2 to M1, and interdigitated emitter fingers 128 (connecting to the M1 interdigitated emitter fingers through conductive via plugs), and interdigitated base fingers 126 (connecting to the M1 interdigitated base fingers through conductive via plugs). FIG. 22 shows the patterned M2 layer overlaid on a patterned M1 layer (underlying M1 layer not shown) which may be, for example, the patterned M1 layer comprising the busbarless interdigitated solar cell base and emitter metal fingers as well as the aluminum or aluminum-silicon alloy metallization contacts forming the MIBS diode metallization contacts shown in FIG. 20A.

The MIBS rim diode (pn junction diode or Schottky barrier diode) and solar cell and the related metallization dimensions are not shown to relative scale. Plurality of conductive via plugs 120 connect the desired portions of M2 metallization to the specified portions of M1 metallization layer and may be formed by drilling vias through the backplane to the intended M1 regions then forming the conductive via plugs during M2 metallization. The combination of M1 pattern as depicted in FIGS. 20A and M2 pattern as depicted in FIG. 22 connected through conductive via plugs completes the overall solar cell and MIBS device metallization as well as monolithic distributed interconnection of the MIBS device terminals to the solar cell terminals which then may be used to form the monolithic integrated shade management interconnections at the cell level.

For the purpose of electrical polarity differentiation, FIG. 22 shows M2 in two different shades of grey. The darker grey portion of the M2 pattern includes solar cell base busbar 124 which is connected to the MIBS rim pn junction diode p+ doped (or Schottky barrier diode aluminum/n-type silicon Schottky contact, if Schottky barrier diode is used for MIBS) underlying M1 metallization region through conductive via plugs on two sides of the solar cell (one side being the busbar side): within the base busbar as well as base busbar finger 130 shown as a vertical finger on the left side of M2. This structure forms a distributed interconnection between the base region of the solar cell and the p+ terminal of the MIBS pn junction diode (or the aluminum/n-type silicon Schottky contact terminal of the MIBS Schottky barrier diode). Interdigitated base fingers 126 shown as vertical fingers on the interior of M2 are connected to the base busbar and also connect to the underlying M1 interdigitated base fingers through the conductive via plugs. The orthogonal transformation of M2 pattern relative to the M1 pattern allows the number of M2 base fingers compared to the number of M1 base fingers to be substantially reduced, typically by a factor of approximately 5 to about 50. The lighter grey portion of M2 pattern includes solar cell emitter busbar 122 which is connected to the MIBS rim pn junction diode n-type silicon substrate ohmic contact (through ohmic contacts to doped n+ regions) or the MIBS rim Schottky barrier diode n-type silicon substrate ohmic contact (through n+ contact diffusion for n-type silicon ohmic contact) formed as part of underlying patterned M1 metallization region (M2-M1 connections made through conductive via plugs on two sides of the solar cell: within the emitter busbar as well as the vertical emitter busbar finger 132 on the right side of M2). This structure forms a distributed interconnection between the emitter of the solar cell and the n-type silicon substrate (through n+ contact diffusion for ohmic contact) terminal of the MIBS pn junction diode or MIBS Schottky barrier diode. Interdigitated emitter fingers 128 shown as vertical fingers on the interior of M2 are connected to the emitter busbar and also connect to the underlying M1 interdigitated emitter fingers through conductive via plugs. Again, by using an orthogonal transformation of M2 pattern relative to the M1 pattern the number of M2 emitter fingers compared to the number of M1 emitter fingers may be substantially reduced, typically by a factor of approximately 5 to about 50. As a result of the M2 pattern orthogonal transformation, the M2 pattern (e.g., interdigitated fingers) may have much larger minimum dimensions (or average finger width) than the M1 pattern (or the M1 average finger width). For instance, the interdigitated base fingers 126, interdigitated emitter fingers 128, and busbars on M2 may have much wider metal fingers or lines, and also have much larger finger to finger pitch, than the interdigitated solar cell base and emitter fingers formed on M1 layer. In this configuration, the narrowest M2 fingers may be the two side fingers (vertical base busbar finger 130 and vertical emitter busbar finger 132) for M2-M1 interconnections between the MIBS rim diode and solar cell terminals through the conductive via plugs). In this configuration, the solar cell to MIBS device electrical interconnections are made on two sides of the solar cell and MIBS (connected conductive via plugs from M2 to M1). This configuration enables wider fingers, vertical base busbar finger 130 and vertical emitter busbar finger 132, on the sides of the solar cell and MIBS (in other words the two sides not used for the main solar cell busbars) to make the distributed interconnections between the solar cell and the MIBS device.

The MIBS devices described herein utilize either a Schottky barrier diode or a pn junction diode. If a Schottky barrier diode is used as MIBS, an aluminum metal electrode, or aluminum with some silicon content, positioned on the lightly-doped n-type silicon in the MIBS silicon substrate regions as the Schottky contact may be used. Key attributes and descriptions relating to Schottky barrier diode MIBS embodiments include:

- A MIBS Schottky barrier diode may be made by forming two metal contacts (from the same M1 layer) on a semiconductor surface (such as on silicon). One metallic contact, which may be formed on a heavily doped region of the semiconductor substrate, is an ohmic contact (for instance, formed through n+ doped regions placed on designated areas of the n-type substrate) and the other contact is formed on a lightly doped n-type region of the semiconductor substrate and forms a metal-to-n-type semiconductor Schottky barrier (non-ohmic) contact that provides diode rectification electrical properties. The same metal (M1 pattern) may be used for both the Schottky barrier (non-ohmic) contact and n-type substrate ohmic contact (the latter through doped n+ regions on n-type substrate) of the MIBS Schottky diode at minimal or no additional fabrication costs for the solar cell manufacturing.

- If n-type silicon is used for the semiconductor substrate (such as for the solar cell base region for a crystalline-silicon back-contact/back-junction cell as described herein), aluminum or an alloy of aluminum with some silicon content may be used as the Schottky barrier metal. These materials provide excellent Schottky barrier diode performance properties and are compatible with the solar cell process flow and materials. Aluminum has a work function which is less than the n-type silicon work function and forms a good Schottky barrier on lightly doped n-type silicon where the lightly doped silicon surface is provided by the n-type silicon substrate layer also used as the solar cell base and absorber. Aluminum, or an alloy of aluminum with some silicon content, may also be used as the ohmic contact on n+ doped silicon for the other terminal of the Schottky diode (i.e., ohmic contact to the n-type silicon substrate through n+ doped regions).

- For a high-performance Schottky barrier diode, whether for a front contact or back contact solar cell, n-type silicon substrates may be used as compared to p-type silicon substrates. The use of n-type silicon substrate is also advantageous for fabrication of high-efficiency solar cells without any bulk light-induced degradation (commonly observed with p-type silicon wafers).

- Applying a positive potential to the aluminum Schottky barrier contact metal electrode on n− doped silicon (also called the Schottky contact) results in a smaller potential drop across the silicon layer—thus, decreasing the barrier height for electron injection from the lightly doped n-type silicon substrate to the aluminum Schottky contact electrode. Thus, more electrons will diffuse toward the metal than into the silicon and a net electrical current will flow through the junction. This is the forward bias or ON state of the Schottky barrier diode. This forward-bias condition is the MIBS state providing protection for the solar cell in case of shading.

- As a negative voltage (or reverse bias voltage) is applied to the Schottky aluminum metal electrode, the potential across the barrier rises increasing the depletion layer width and suppressing electron injection from the n-type silicon substrate into the metal electrode. The resulting potential barrier limits the electrons flowing to the metal electrode and results in negligible current (OFF state of the MIBS Schottky diode—This reverse-bias condition represents the MIBS state when there is no solar cell shading). An aluminum-semiconductor Schottky contact junction can provide excellent rectifying properties to be used as MIBS. While a large current may exist under forward bias (ON state), negligible current flows under reverse bias (OFF state), both desirable properties for MIBS.

- In some instances, a Schottky barrier diode may used as compared to a pn junction diode in a MIBS implementation. A Schottky barrier diode has a smaller ON-state forward-bias voltage than a pn junction diode (e.g., on the order of −0.2 V to 0.5V for Schottky diode vs −0.6 V to 0.8 V for a pn junction diode) resulting in a lower power dissipation by the MIBS device when a Schottky barrier diode is used as MIBS (when the solar cell is shaded, the MIBS device is turned on to protect the solar cell). The smaller power dissipation of the Schottky barrier diode compared to the pn junction diode is quite advantageous and makes the Schottky barrier diode a superior choice for the MIBS device.

- A MIBS rim Schottky diode MIBS implementation may use a relatively lightly doped n-type silicon substrate as the main doped diode region. In a solar cell substrate fabrication process using epitaxial silicon lift-off solar cell processes with epitaxially grown n-type base and a back-contact/back-junction solar cell design, the n-type silicon region for the MIBS diode may be formed from the same substrate as the epitaxial n− doped silicon (or the base region of the solar cell) and which are subsequently electrically isolated from each other using trench isolation during cell processing. In this case, the region used for the Schottky aluminum contact has light n-type doping, the same as the solar cell base doping (e.g., phosphorus doping on the order of $3\times10^{15}$ $cm^{-3}$, while the doping may be larger or smaller than this amount depending on the solar cell design requirements), without the heavily-doped n+ base contact diffusion region. The ohmic contact to the n-type silicon substrate (the second terminal of the Schottky diode) may be also be made using aluminum (or an alloy of aluminum with some silicon content) as part of the patterned M1 metallization layer through n+ doped (heavily doped phosphorus) ohmic contact regions formed on the designated regions of the n-type substrate.

- The ohmic contact of the MIBS Schottky barrier diode is formed by using the aluminum ohmic contact to the n-type silicon substrate region, through the heavily-doped n+ doped contact diffusion regions (this is formed using and during the same process that also forms the n+ doped regions used for the base ohmic contact of the back-junction/back-contact solar cell).

The aluminum (or Al/Si alloy) layer utilized to make the aluminum (or aluminum silicon) to n-type silicon Schottky contact and aluminum (or aluminum silicon) to n+ silicon (and n-type silicon) ohmic contact may be the same Metal-1 (M1) aluminum (and/or aluminum silicon) layer used to make the interdigitated base and emitter contact metallization in the solar cell. For example, it may be a high conductivity aluminum layer with some silicon content (a few percentage points of silicon to prevent junction spiking or aluminum spiking into silicon) to make high-quality electrical ohmic (and Schottky) contacts to silicon. The patterned M1 aluminum layer may be made using screen printing, stencil printing, aerosol jet printing, or inkjet printing of aluminum (or aluminum alloy) paste or aluminum (or aluminum alloy) ink (again, for example, with a silicon content percentage to prevent junction spiking), followed by thermal curing of the paste or ink. Alternatively, Metal 1 (M1) may be formed by another suitable method, for instance, a deposition method such as plasma sputtering, thermal or electron-beam evaporation, ion beam deposition, or another blanket deposition method followed by M1 patterning (e.g., by laser ablation or wet etch patterning). The thickness of M1 aluminum or aluminum alloy layer may depend on the resistivity of the aluminum layer. Typically, techniques such as physical-vapor deposition or PVD (e.g., plasma sputtering or thermal evaporation or electron-beam evaporation) deposit aluminum layers with near-bulk electrical conductivity (e.g., resistivity ~3 $\mu\Omega\cdot$cm), thus the required thickness of M1 aluminum layer may be in the approximate range of about 100 nm up to about 2000 nm (thicker M1 metal would not be required due to the two-level M1-M2 metallization architecture). On the other hand, formation of M1 from aluminum or aluminum alloy paste or ink typically results in a lower resulting metal conductivity (much lower conductivity than that of bulk aluminum), such as material resistivity in the range of ~30 $\mu\Omega\cdot$cm, to ~200 $\mu\Omega\cdot$cm. Therefore, a thicker metal layer would be required if M1 is produced from paste or ink (for instance, screen printed M1 in the thickness range of about 1 micron up to about 20 microns).

FIGS. 23A through 23L are schematic diagrams showing plan views of various representative embodiments of relative MIBS diode and solar cell geometrical arrangements shown for MIBS with full-square-shaped solar cells. The solar cell and MIBS dimensions are not shown to actual or relative scales. As can be seen in the representative embodiments of FIGS. 23, the total MIBS diode area (including the area of any associated trench isolation) may be much less than the solar cell area (fraction of the total MIBS & trench isolation area to the solar cell area is selected to be <1% and often no more than about 0.3%). Of course larger area rations may be utilized (with the undesirable consequence of reduced total-area cell and module efficiencies).

Figure 23A:
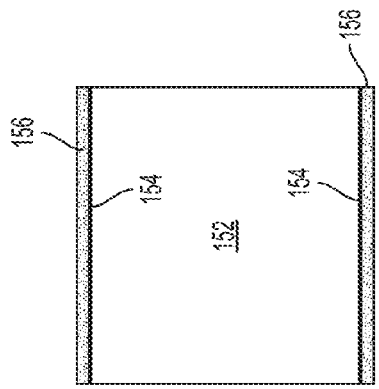
FIGS. 23A through 23L are schematic diagrams showing a plan (top side) view various representative embodiments of relative MIBS diode and solar cell geometrical arrangements (these examples are shown with full-square-shaped solar cells; same general designs may be used with solar cell shapes using other substrate geometries such as pseudo-square cell substrates). The dimensions in these schematic diagrams are not shown to actual scale. The MIBS area as a fraction of the total solar cell plus MIBS area is selected to be relatively small (in order to minimize the non-electricity-generating area fraction allocated to MIBS), for instance, less than about 1% of the solar cell area.

FIG. 23A shows a full-periphery closed-loop rim MIBS design, as previously describe herein, comprising solar cell island 140 surrounded by full-periphery MIBS rim diode 144 which is partitioned and electrically separated by full-periphery trench isolation region 142. And while this design may have certain benefits, an infinite number of other MIBS-solar cell design possibilities may also be used.

Figure 23B:
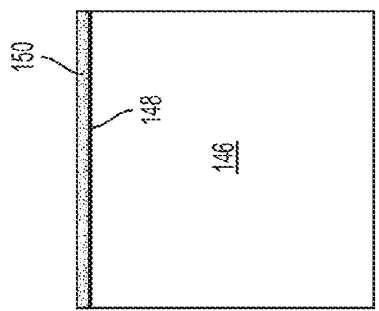
Figure 23C:
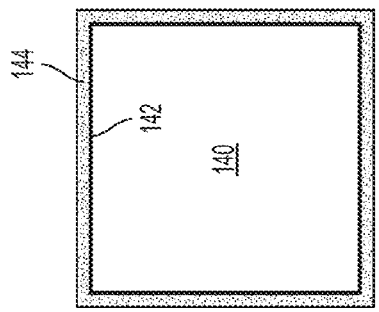
Figure 23D:
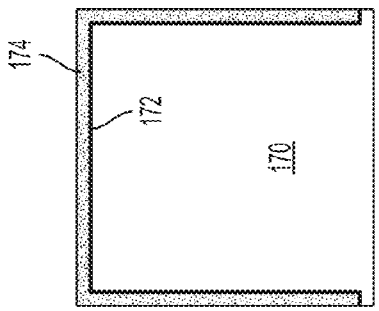
Figure 23E:
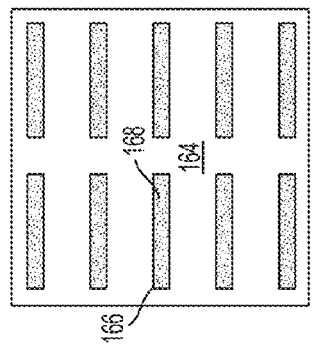
Figure 23F:
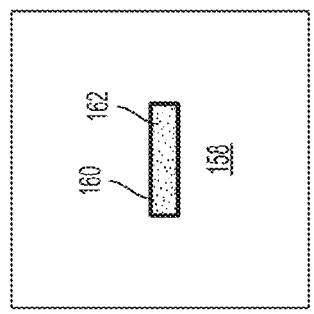

For instance, FIGS. 23B, 23C, and 23F show examples of non-full-periphery MIBS diode designs, where the MIBS diode may be made a non-closed-loop rim diode on 1, 2, or 3 sides of the square-shaped solar cell (in contrast to full periphery MIBS diode formed on all 4 sides of the square-shaped solar cell). FIG. 23B shows a solar cell with a MIBS rim diode on one side comprising solar cell area 146, trench isolation region 148, and non-full-periphery MIBS rim diode 150 which is partitioned and electrically separated by trench isolation region 148. FIG. 23C shows a solar cell with a MIBS rim diode on two sides comprising solar cell area 152, trench isolation regions 154, and non-full-periphery MIBS rim diodes 156 which are partitioned and electrically separated by trench isolation regions 154. FIG. 23F shows a solar cell with a MIBS rim diode on three sides comprising solar cell area 170, trench isolation region 172, and non-full-periphery MIBS rim diode 174 which is partitioned and electrically separated by trench isolation regions 172.

As another embodiment, FIG. 23D shows MIBS configured as a single island within the solar cell area, comprising island MIBS diode 162 defined and electrically isolated/partitioned by closed loop trench isolation region 160 within solar cell area 158. (FIG. 23D shows an example for the MIBS island being around the center of the solar cell although the island(s) may be positioned anywhere in the solar cell area). The MIBS island may be in any geometrical shape (FIGS. 23D and 23E show MIBS diode islands in a rectangular shape; other polygonal or other geometrical shapes may be used).

FIG. 23E shows the MIBS implementation in the form of a plurality of discrete MIBS islands (which may be electrically interconnected through the M1 and M2 metallization patterns), comprising a plurality of island MIBS diodes 168 defined and electrically isolated/partitioned by closed loop trench isolation regions 166 within solar cell area 164.

Figure 23G:
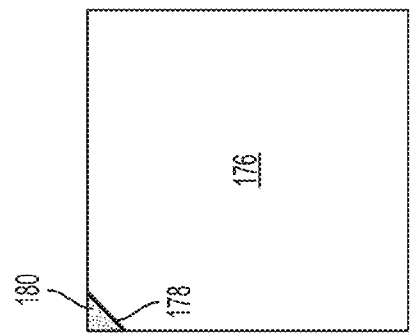
Figure 23H:
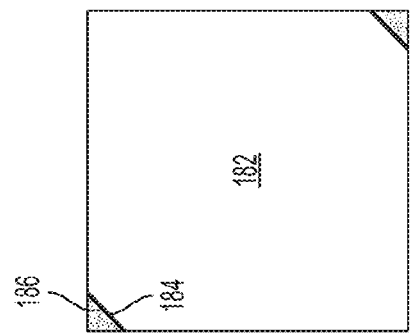
Figure 23I:
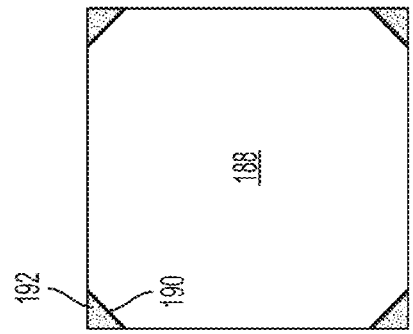

In another embodiment shown in FIG. 23G, the MIBS device may be positioned in a corner of the solar cell. FIG. 23G comprising corner MIBS diode 180 defined and electrically isolated by trench isolation region 178 in one corner of solar cell area 176. While FIG. 23G shows a triangular-shaped corner MIBS, the shape of the corner MIBS may be any geometrical shape (e.g., square, rectangle, etc.). Further, the number of corner MIBS devices may be more than one, for instance, two corner MIBS devices as shown in FIG. 23H, three, or four corner MIBS devices as shown in FIG. 23I. FIG. 23H shows a configuration comprising a plurality of corner MIBS diodes 186 defined and electrically isolated/partitioned by trench isolation regions 184 in two corners of solar cell area 182. FIG. 23I shows a configuration comprising a plurality of corner MIBS diodes 192 defined and electrically isolated/partitioned by trench isolation regions 190 in four corners of solar cell area 188.

Figure 23J:
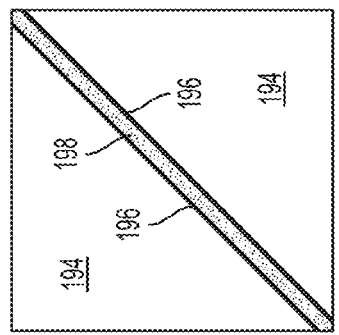
Figure 23K:
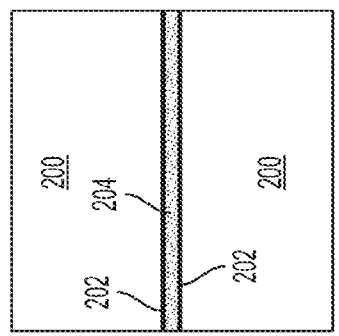
Figure 23L:
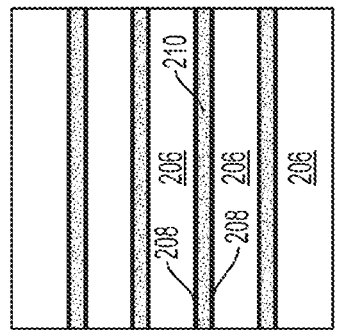

In another embodiment shown in FIG. 23J, the MIBS device may be formed as a diagonal strip from one corner extending to the opposite diagonal corner of the solar cell. FIG. 23J shows a configuration comprising a narrow diagonal strip MIBS diode 198 defined and electrically isolated/partitioned by trench isolation regions 196 extending from one corner to an opposite corner of solar cell area 194. Alternatively, the MIBS device may be a single strip extending between two opposite sides of the solar cell as shown in FIG. 23K or a plurality of strips extending between two opposite sides of the solar cell as shown in FIG. 23L. FIG. 23K shows a configuration comprising side to side strip MIBS diode 204 defined and electrically isolated/partitioned by trench isolation regions 202 and positioned in the center and from one side to an opposite side of solar cell area 200. FIG. 23J shows another configuration comprising a plurality of side to side strip MIBS diodes 210 defined and electrically isolated/partitioned by trench isolation regions 208 from one side to an opposite side of solar cell area 206.

The representative structures shown in FIG. 23 are only a few examples of the MIBS geometrical designs with respect to a solar cell among essentially infinite number of possible MIBS geometrical designs. And while the examples are shown here for full-square solar cells, it should be understood that various concepts and embodiments of the disclosed subject matter may be applied to solar cells made with any geometrical shape, including but not limited to pseudo square, rectangular, hexagonal, other polygon shapes, circular, etc.

FIGS. 24 through 31 are various representative process flow embodiments for the fabrication of back-contact/back-junction mono-crystalline silicon solar cells and associated MIBS devices (either pn junction diode or Schottky barrier diode) using thin epitaxial silicon lift-off and reusable crystalline silicon templates. And while the following solar cell and MIBS manufacturing process flows are provided as examples of thin (e.g., sub-100 microns) epitaxial silicon back-junction/back-contact solar cells with backplanes and two-level metallization (on-cell M1 and on-backplane M2), it should be understood that the designs, concepts, and various embodiments disclosed herein may be extended and applied to integrated MIBS with various other solar cell designs and technologies, including but not limited to the crystalline silicon solar cells manufactured on crystalline silicon wafers formed from bulk mono-crystalline ingots or cast multi-crystalline bricks or multi-crystalline ribbons (such as crystalline silicon wafers obtained using slurry or diamond wire saw, hydrogen ion implantation and exfoliation, metal stress induced exfoliation, etc.), standard thickness CZ or FZ mono-crystalline silicon wafers, front-contact homo-junction and hetero junction solar cells using n-type silicon wafers, front-contact or back-contact solar cells made from semiconductor materials other than silicon (such as gallium arsenide, gallium nitride, etc.), as well as various metallization schemes using a single metallization layer or multi-level metallization using two or more metal levels. The process flows show that the MIBS device (described herein as a pn junction diode or Schottky barrier diode) may be monolithically integrated with the high-efficiency back-contact/back-junction back-plane-laminated solar cell while adding negligible to zero process complexity, fabrication process tools, or incremental MIBS-related manufacturing cost. Essentially all of the embodiments disclosed herein utilize the same material layers and processes for the MIBS implementation as may already be used in the solar cell fabrication.

Figure 24:
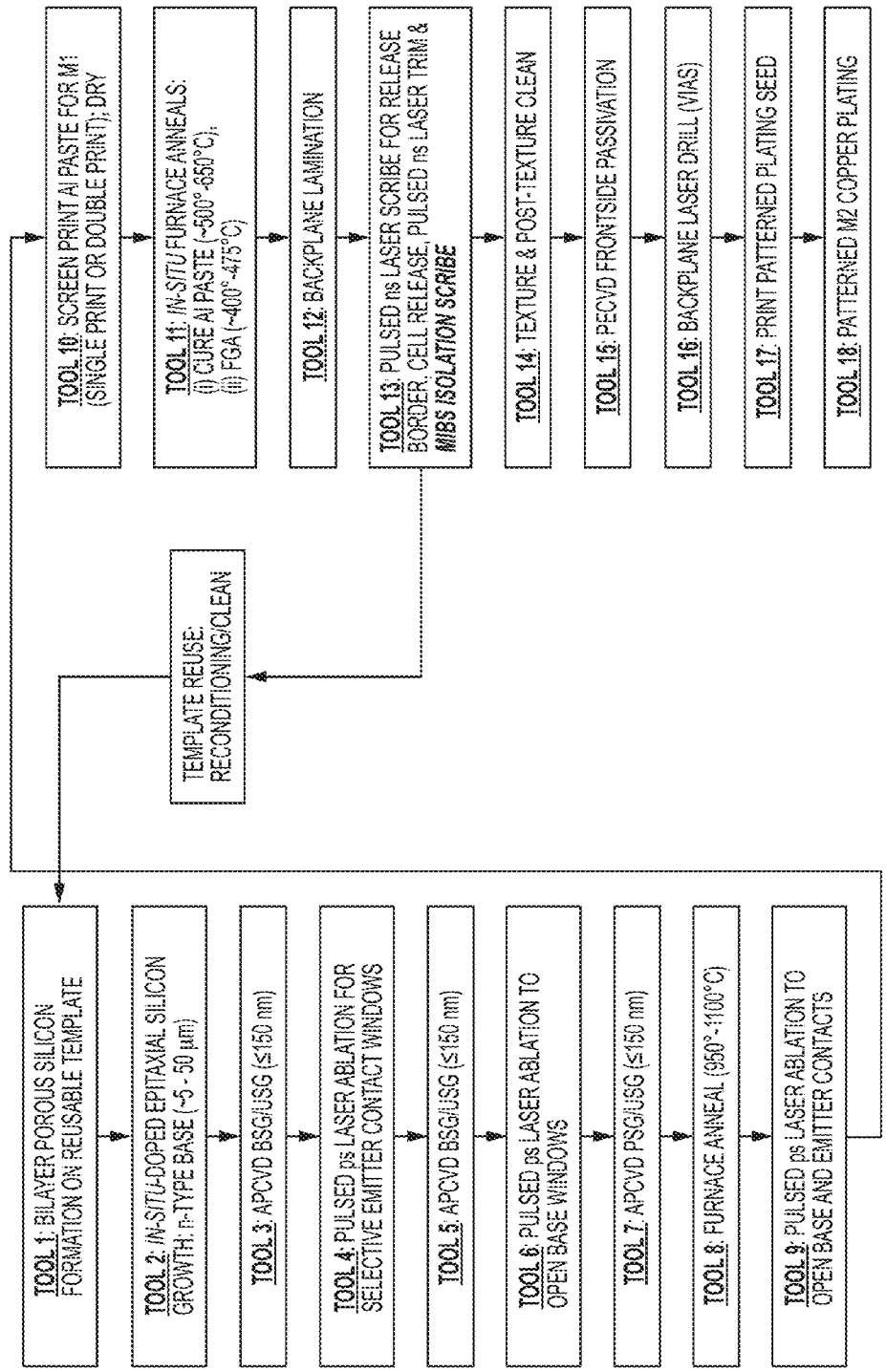
FIGS. 24 through 31 are several representative solar cell manufacturing process flow embodiments for the fabrication of back-contact/back-junction monocrystalline silicon solar cells and associated MIBS devices (these representative embodiments are shown with thin epitaxially grown silicon substrates for the resulting solar cells; the MIBS structures and methods of this invention may also be used in conjunction with other solar cells, for instance including but not limited to, back-contact solar cells made using starting mono-crystalline silicon wafers manufactured by wire saw from Czochralski or CZ ingots, or starting multi-crystalline silicon wafers manufactured by wire saw from cast multi-crystalline silicon bricks)

FIG. 24 is a representative process flow embodiment for manufacturing epitaxial silicon solar cell with pn junction diode MIBS implementation. The process flow of FIG. 24 shows an option to fabricate a high-efficiency back-contact/back-junction solar cell along with its associated MIBS pn junction diode using a fabrication process which utilizes two APCVD BSG processes to form the heavily doped p+ field emitter and the more heavily doped p++ doped ohmic contact (all p+ and p++ regions are boron doped) regions for the selective emitter area (called a double-BSG selective emitter process). The solar cell and MIBS common substrate is formed by epitaxial deposition of n-type silicon on a reusable crystalline silicon template after formation of a sacrificial porous silicon (Tool 1) serving both as the epitaxial seed and also the lift-off release layer. The in-situ-doped epitaxial layer (formed by Tool 2) has the desired n-type doping for the n-type substrate and base region of the back-contact/back-junction solar cell (which is also used for the MIBS pn junction diode n-type substrate). Most of the back-contact/back-junction cell processing (cell processing through the patterned M1 layer) is subsequently performed while the epitaxial layer is supported by the template. These process steps may use a combination of APCVD (Atmospheric-Pressure Chemical-Vapor Deposition), pulsed laser ablation, furnace thermal processing, and screen printing and curing of the aluminum or aluminum-silicon alloy paste for patterned M1 (through Tool 11 in FIG. 24) to complete back-junction/back-contact solar cell processing steps through M1 metallization layer formation. These processes are performed while the solar cell is supported on the reusable crystalline silicon template. Next, the backplane is permanently attached and laminated to the backside of the solar cell on the template (Tool 12). Subsequently (in Tool 13), the solar cell, and its associated MIBS, is lifted off and detached from the reusable template by laser scribing to define the release boundary, mechanical lift-off release, and optional laser trimming of the lifted solar cell. Trench isolation region(s) to partition and electrically isolate the MIBS substrate region(s) is/are formed by scribing from the sunny-side of the detached backplane-laminated solar cell, for example using the same pulsed laser source or tool which is also used to perform the pre-release scribing of silicon and/or the post-release trimming of the solar cell and MIBS peripheral boundary. Then, the remaining back-end solar cell (and MIBS) processing steps are completed (Tools 14 through 18). These steps comprise sunny-side texture and post-texture wet clean (which may also clean the laser-scribed isolation trenches and remove any laser-generated damage in the trench isolation regions), PECVD sunny-side passivation 7 ARC (which also passivates the MIBS front surface and sidewalls/edges), and final high-conductivity patterned M2 metallization and conductive via holes on the backplane (for example by using one or an appropriate combination of screen printing, PVD, and/or plating).

In the process flow of FIG. 24, the MIBS implementation with the solar cell does not require any additional fabrication process tools or process steps. The trench isolation regions are formed using the same tool or laser source(s) used to scribe and/or trim the solar cell prior to release and after release. Thus, there is negligible to zero incremental cost for a MIBS solar cell implementation. The process flow of FIG. 24 is provided as a representative example, while many other variations of such process flow are possible to manufacture a solar cell and associated MIBS without added fabrication process complexity or cost. While the process flow in FIG. 24 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 13 would form the trench isolation regions. All the other process steps shown in FIG. 24 would be the same as shown for epitaxial silicon lift-off processing.

Again, the n-type epitaxial silicon layer (or the n-type crystalline silicon wafer in the case of using CZ or FZ or multi-crystalline wafers instead of epitaxial silicon substrates) serves as the monolithic substrate for both the solar cell and the MIBS device. This n-type layer serves as the absorber substrate and base of the solar cell as well as the n-type substrate region of the MIBS pn junction diode. The emitter process forming the p+ field emitter and p++ doped emitter contact regions also forms the MIBS p+(and/or p++) regions for the pn junction diode. The APCVD PSG assisted process to form the n+ heavily doped regions is used both for the solar cell base ohmic contact regions and also for the MIBS ohmic contact to the n-type substrate region of the pn junction diode. The solar cell M1-M2 metallization makes contact to the MIBS pn junction diode and completes monolithic interconnections with the solar cell as an integrated shade management bypass switch.

Figure 25:
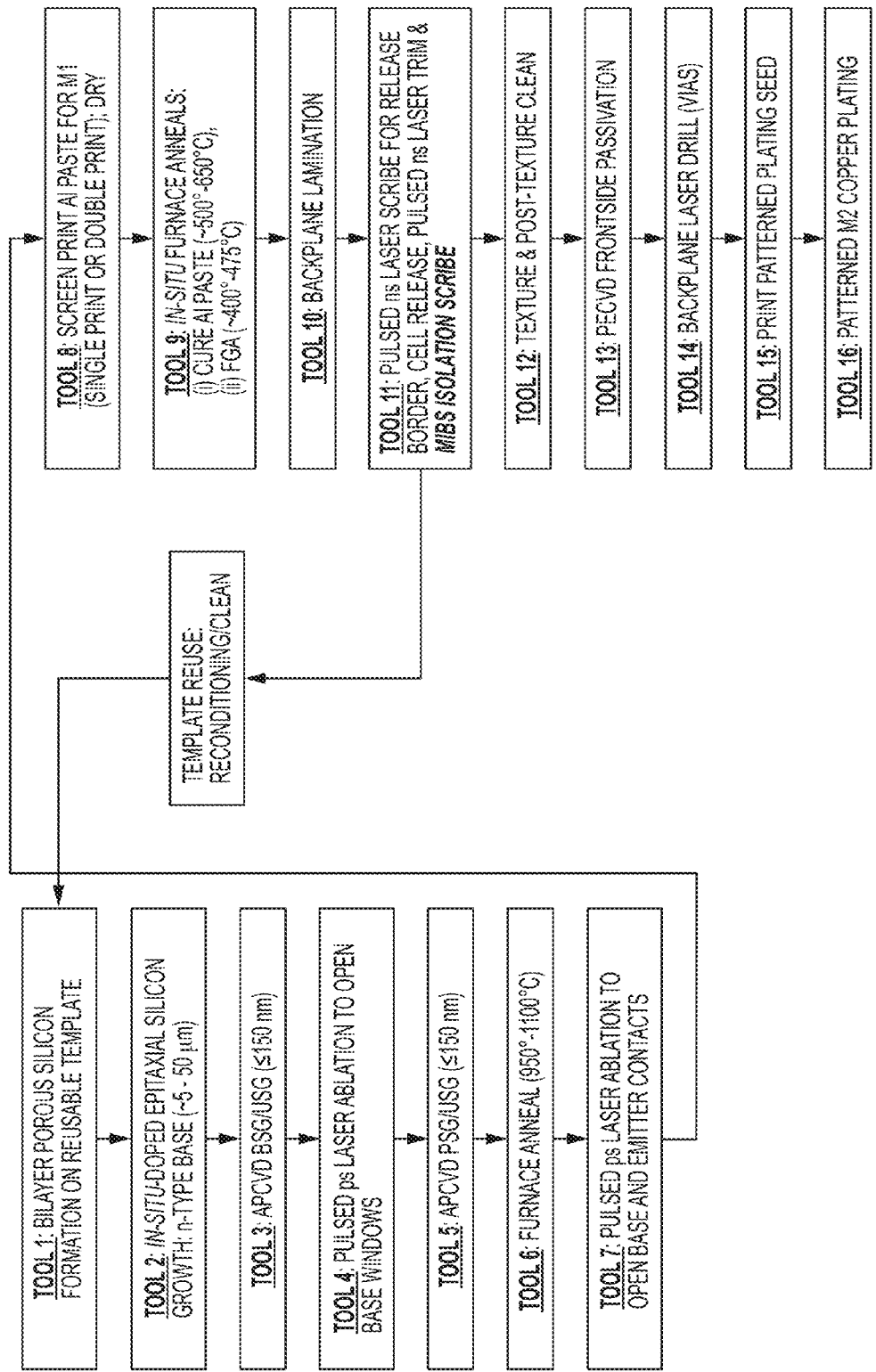

FIG. 25 is a process flow embodiment for manufacturing epitaxial silicon solar cell with MIBS pn junction diode without selective emitters using single (instead of double) APCVD BSG. This process flow shows a fabrication option for a high-efficiency back-contact/back-junction solar cell and associated MIBS pn junction diode using a process flow utilizing one APCVD BSG process to form the heavily boron doped p+ emitter (called a double-BSG selective emitter). Again, the n-type epitaxial silicon layer serves as the monolithic substrate for both the solar cell and the MIBS device. This n-type layer serves as the absorber and base region of the solar cell as well as the n-type substrate region of the MIBS pn junction diode. The emitter process forming the p+ emitter regions also forms the MIBS p+ regions for the MIBS pn junction diode. The APCVD PSG assisted process to form the n+ heavily doped regions is used both for the solar cell base ohmic contact regions and for the MIBS ohmic contact to the n-type substrate region of the pn junction diode. The solar cell M1-M2 metallization is used to make contacts to the MIBS pn junction diode and complete its monolithic interconnections with the solar cell as an integrated shade management bypass switch. While the process flow in FIG. 25 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 11 would form the trench isolation regions. All the other process steps shown in FIG. 25 would be the same as shown for epitaxial silicon lift-off processing.

FIGS. 26 through 31 are process flows embodiments for manufacturing solar cells with a Schottky barrier diode used as the MIBS device. Aspects of the disclosed process flows may be combined and/or extended to various other processing techniques for MIBS solar cell implementation in accordance with the disclosed subject matter.

Figure 26:
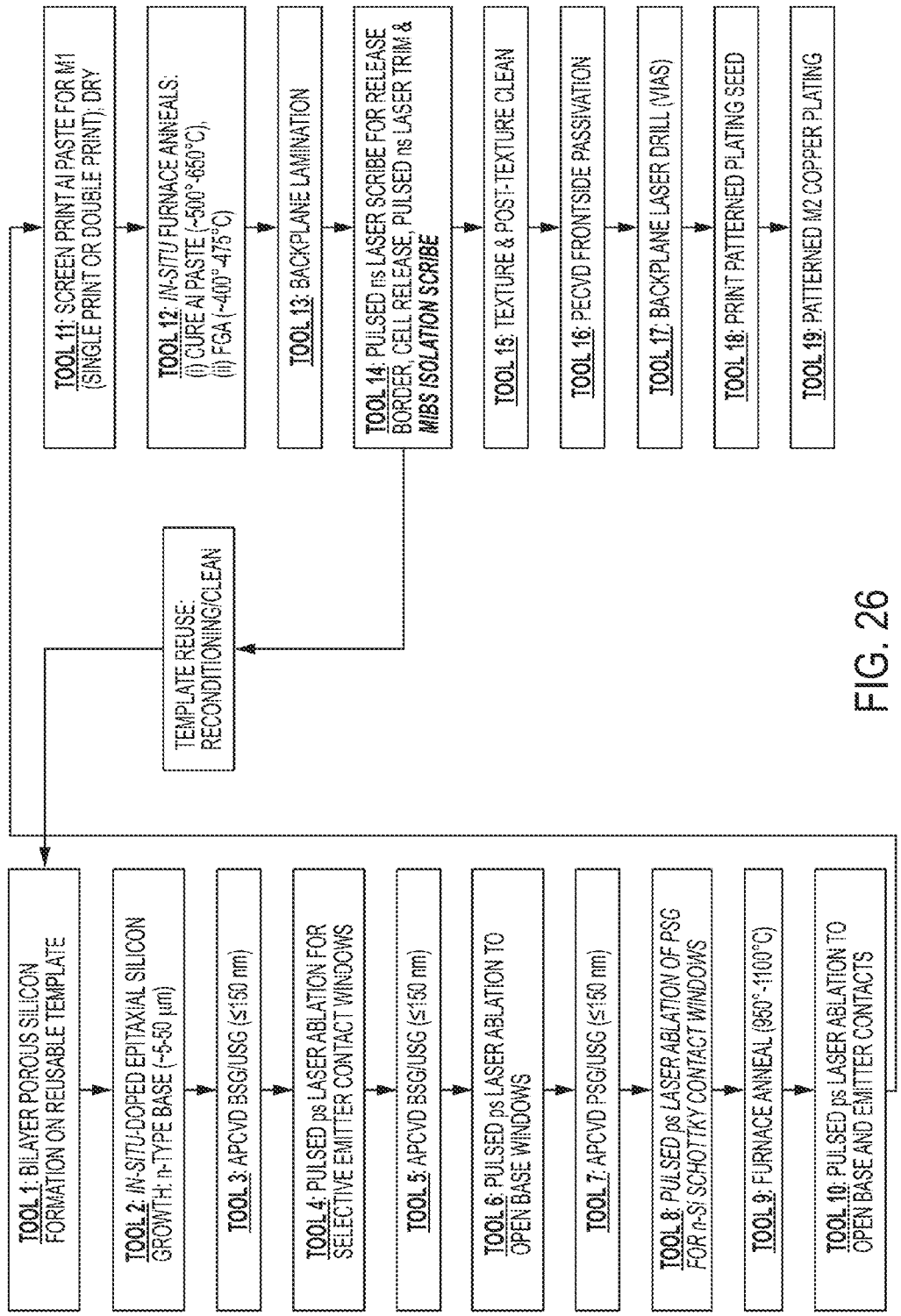

FIG. 26 is a process flow for manufacturing an epitaxial solar cell with MIBS aluminum/n-type silicon Schottky barrier diode (a solar cell with selective emitters). The process flow of FIG. 26 shows an option to fabricate a high-efficiency back-contact/back-junction solar cell along with its associated MIBS Schottky barrier diode utilizing two APCVD BSG processes to form the heavily doped p+ field emitter and the more heavily doped p++ doped emitter ohmic contact (all p+ and p++ regions are boron doped) regions for the selective emitter area (called a double-BSG selective emitter). The solar cell and MIBS common substrate is formed by epitaxial deposition of n-type silicon on a reusable crystalline silicon template after formation of a sacrificial porous silicon layer (Tool 1) which serves as both the epitaxial seed and the lift-off release layer. The in-situ-doped epitaxial layer (formed by Tool 2) has the desired n-type doping for the base of the back-contact/back-junction solar cell (which is also used for the MIBS Schottky barrier diode substrate). Most of the back-contact/back-junction cell processing may be performed while the epitaxial layer is supported by the template. These process steps may use a combination of APCVD (Atmospheric-Pressure Chemical-Vapor Deposition), pulsed laser ablation, furnace thermal processing, and screen printing and curing of the aluminum paste (through Tool 12 in FIG. 26) to complete the back-junction back-contact solar cell processing steps through M1 metallization layer. All these processes are performed while the solar cell is supported on the reusable silicon template.

One specific process tool is added to the flow (Tool 8) to perform pulsed picoseconds (or pulsed femtoseconds or nanoseconds) laser ablation of the PSG/UGS layer immediately after the APCVD PSG/USG process and prior to the furnace anneal process to enable fabrication of the MIBS Schottky barrier diode. This single added process step and tool allows for subsequent fabrication of the Schottky contact (aluminum or aluminum-silicon to n-type silicon) during the patterned M1 process. Next, the backplane is permanently attached and laminated to the backside of the solar cell on the template (Tool 13). Subsequently (in Tool 14), the solar cell (and its associated MIBS) is lifted off and detached from the reusable template (by laser scribing to define the release boundary, mechanical lift-off release, and laser trimming of the lifted solar cell) and the trench isolation region(s) to define and electrically isolate the MIBS region(s) is (are) formed by scribing from the sunny-side of the detached backplane-laminated solar cell, for example using the same pulsed laser source or tool used to perform the pre-release scribing of silicon and/or the post-release trimming of the solar cell and MIBS peripheral boundary. Then, the remaining back-end solar cell (and MIBS) processing steps are completed (Tools 15 through 19), including sunny-side texture and post-texture wet clean (which may also clean the laser-scribed isolation trenches), PECVD sunny-side passivation and ARC deposition (which may also passivate the MIBS front surface and sidewalls/edges), and final high-conductivity M2 metallization on the backplane (using one or an appropriate combination of screen printing, PVD, and/or plating).

The MIBS Schottky diode solar cell implementation of FIG. 26 requires only one additional fab process tool (Tool 8) to perform one additional process step (PSG/USG ablation immediately after the APCVD PSG/USG process). The trench isolation regions may be formed using the same tool or laser source(s) used to scribe and/or trim the solar cell prior to release and after release. Thus, there is a relatively small incremental cost for implementation of this MIBS Schottky diode embodiment along with the solar cell using the representative manufacturing process flow of FIG. 26. While the process flow in FIG. 26 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 14 would form the trench isolation regions. All the other process steps shown in FIG. 26 would be the same as shown for epitaxial silicon lift-off processing.

The process flow of FIG. 26 is shown as a representative example, and many other variations of such process flow are possible to manufacture the combination of the solar cell and its associated MIBS without added fab process complexity or significant cost addition. Again, the n-type epitaxial silicon layer (or the n-type silicon wafer in the case of using wafers instead of epitaxial silicon lift off processing) serves as the monolithic substrate for both the solar cell and the MIBS device. This n-type silicon substrate layer serves as the absorber and base of the solar cell as well as the n-type substrate region of the MIBS Schottky barrier diode (including M1 aluminum to n-type silicon Schottky contact). The APCVD PSG assisted process to form the n+ heavily doped regions may be used both for the solar cell base ohmic contact and also for the MIBS ohmic contact to the n-type region of the MIBS Schottky diode. The solar cell M1-M2 metallization make contacts to the MIBS Schottky barrier diode and completes monolithic interconnections with the solar cell as an integrated shade management bypass switch. The process flow of FIG. 26 shows that the MIBS device (in this case Schottky barrier diode) may be monolithically integrated with the high-efficiency back-contact/back-junction backplane-laminated solar cell without adding any additional materials or material layers, with only one added simple process step (Tool 8), and with relatively small incremental MIBS-related fab cost. The embodiments of FIG. 26 may use the same material layers and processes for the MIBS implementation as already used for the solar cell fabrication.

Figure 27:
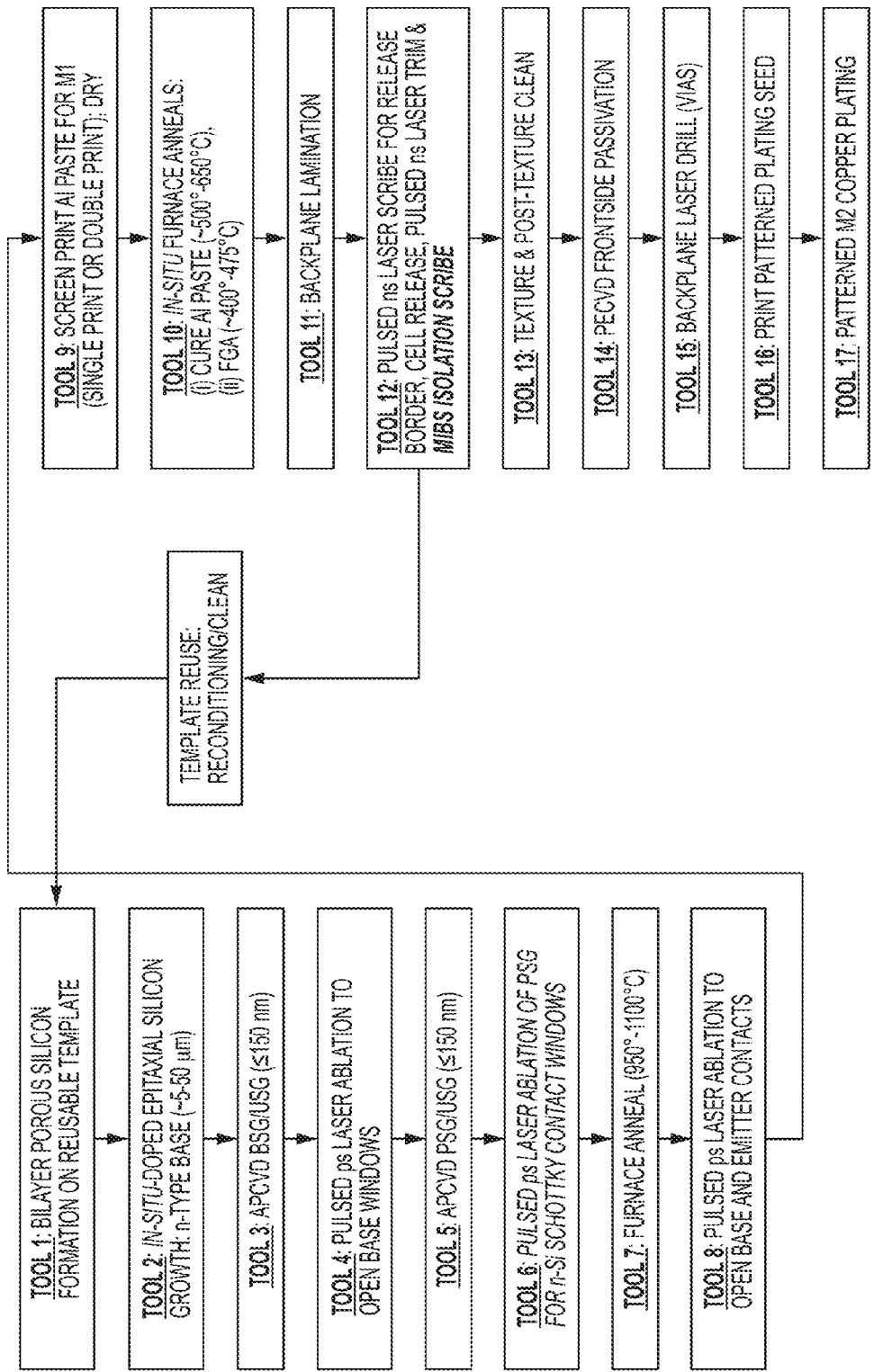

FIG. 27 shows a representative manufacturing process flow for epitaxial solar cell with MIBS Aluminum/n-type silicon Schottky barrier diode (solar cell without emitter). This process flow shows the option to fabricate a high-efficiency back-contact/back-junction solar cell along with its associated MIBS Schottky barrier diode using a process flow which utilizes one APCVD BSG process to form the heavily doped p+ emitter (so called single-BSG emitter—no selective emitter). Except for the use of a single BSG in this flow instead of double BSG described in the previous flow (FIG. 26), the process flows of FIGS. 26 and 27 are comparable. While the process flow in FIG. 27 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 12 would form the trench isolation regions. All the other process steps shown in FIG. 27 would be the same as shown for epitaxial silicon lift-off processing.

Figure 28:
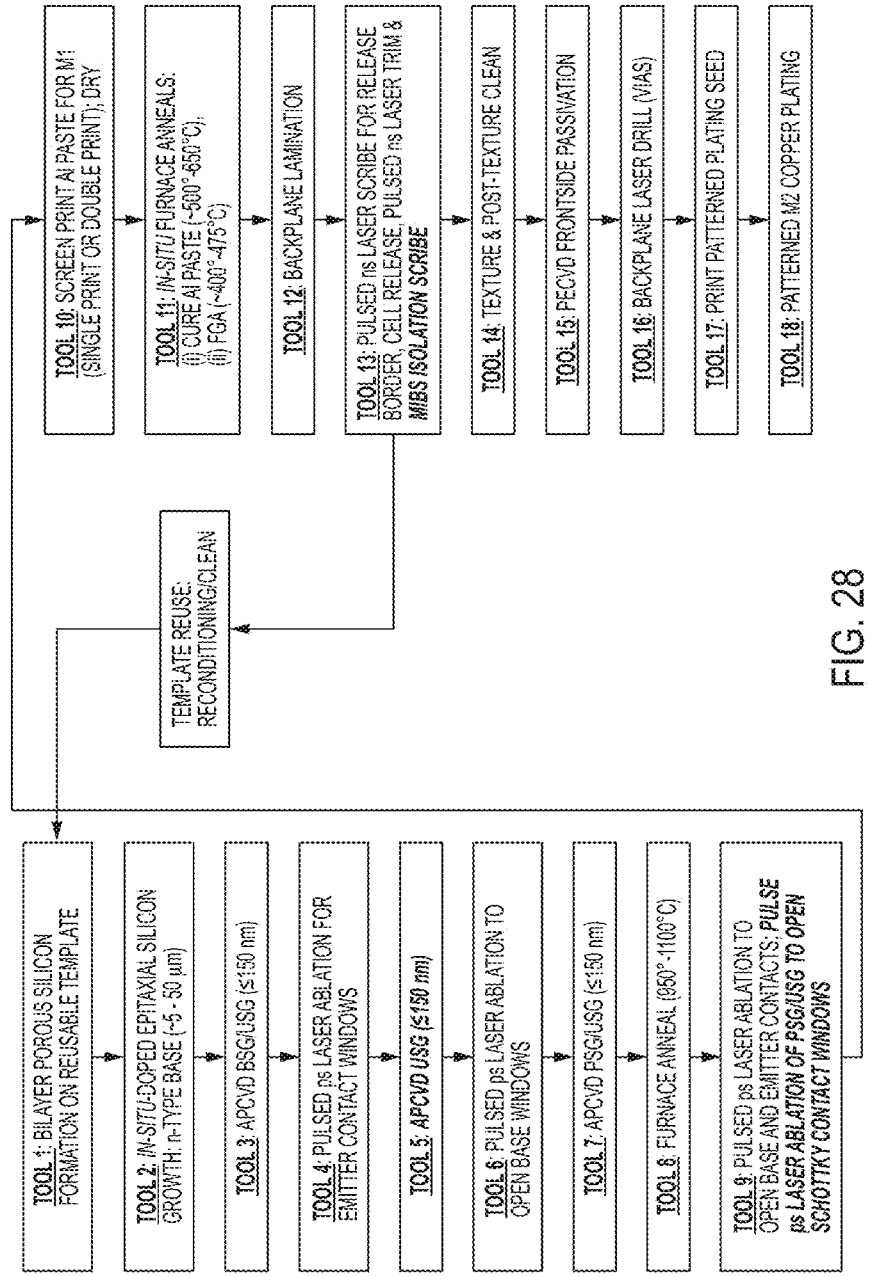

FIG. 28 shows another representative manufacturing process flow for epitaxial solar cell with MIBS Aluminum/n-type silicon Schottky diode (solar cell without selective emitter process). This process flow shows the option to fabricate a high-efficiency back-contact/back-junction solar cell along with its associated MIBS Schottky barrier diode using a process flow which utilizes one APCVD BSG process to form the heavily doped p+ emitter (so called single-BSG non-selective emitter). In order to enable fabrication of the MIBS Schottky barrier diode in this embodiment, one specific process tool is added to the flow (Tool 5; APCVD USG or undoped oxide) in order to deposit an undoped layer of oxide to protect the n-type silicon regions which will subsequently be used for the MIBS Schottky contact (using M1 aluminum or aluminum silicon alloy). This added Tool 5 may also be useful to the solar cell process flow by enabling separation of the solar cell n+ doped regions from the p+ emitter regions (to prevent abutted junctions by forming separated junctions). The pulsed picoseconds (or pulsed femtoseconds or pulsed nanoseconds) laser ablation tool (Tool 9) subsequently used to open the base and emitter contacts is also used to open the n-type silicon regions for MIBS Schottky contact. This single added process step and tool (Tool 5) allows for subsequent fabrication of the Schottky contact (aluminum to n-type silicon) during the patterned M1 process. As shown in this process flow enabling MIBS Schottky barrier diode, the MIBS implementation with the solar cell in this embodiment only requires one additional fab process tool (Tool 5) to perform only 1 additional process step (APCVD USG between two laser ablation process steps). While the process flow in FIG. 28 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 13 would form the trench isolation regions. All the other process steps shown in FIG. 28 would be the same as shown for epitaxial silicon lift-off processing.

Figure 29:
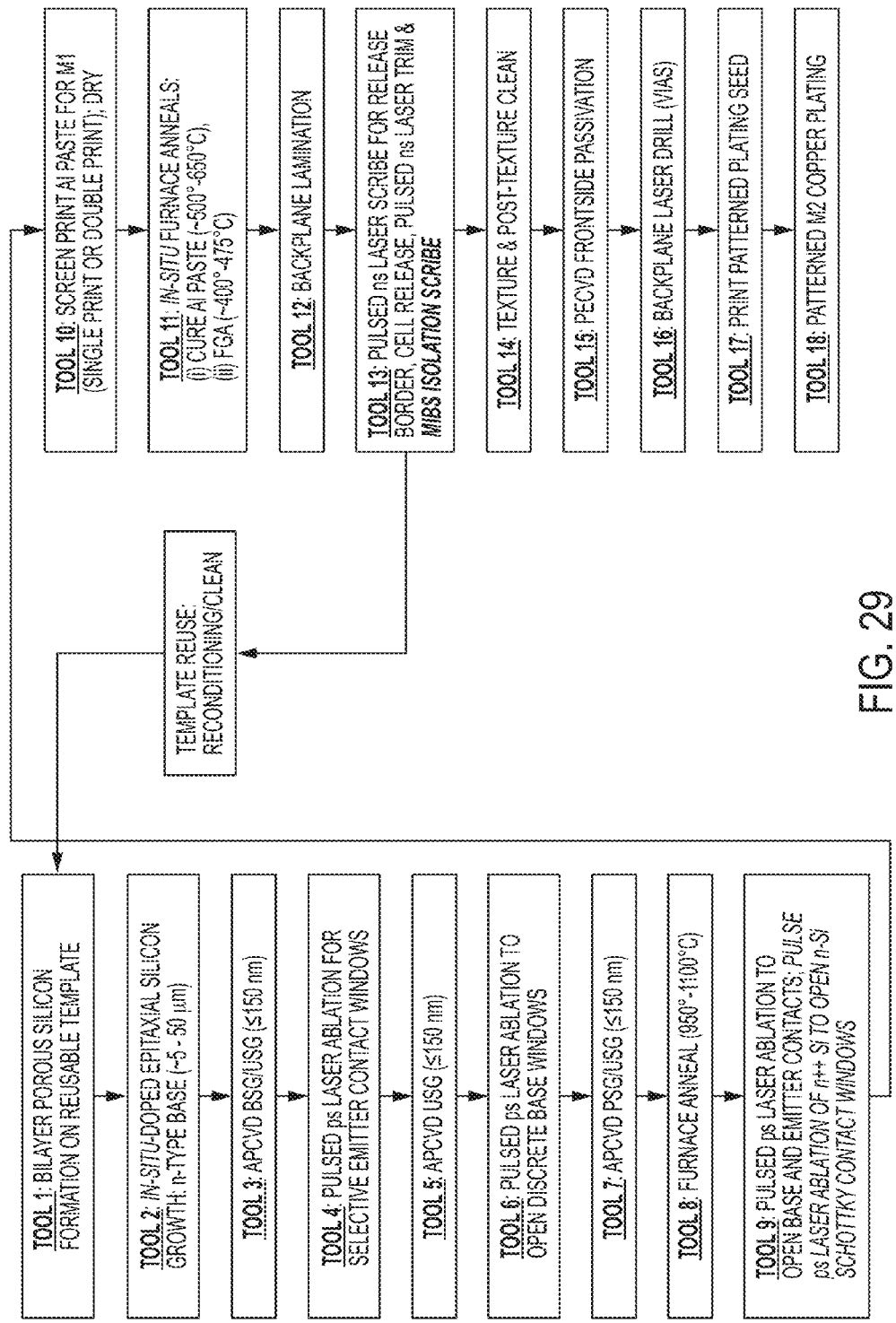

FIG. 29 shows another representative manufacturing process flow for epitaxial solar cell with MIBS Aluminum/n-type silicon Schottky barrier diode (solar cell with selective emitter). This process flow shows the option to fabricate a high-efficiency back-contact/back-junction solar cell along with its associated MIBS Schottky barrier diode using a process flow which utilizes two APCVD BSG processes to form the heavily doped p+ field emitter and the more heavily doped p++ doped emitter ohmic contact (all p+ and p++ regions are boron doped) regions for the selective emitter area (so called double-BSG selective emitter process). In order to enable fabrication of the MIBS Schottky barrier diode, one specific additional process is performed in an existing solar cell fabrication tool (Tool 9 is used to open base and emitter contact holes as well as to expose n-type silicon Schottky contact windows) in order to perform pulsed picoseconds (or pulsed femtoseconds) laser ablation of the n+ silicon layer to form the exposed lightly doped n-type silicon regions for the MIBS Schottky contact formation with M1. This single added process step (which can be done without adding any dedicated fab tool by adding an additional laser ablation source to Tool 9) allows for subsequent fabrication of the Schottky contact (aluminum to n-type silicon) during the patterned M1 formation process. As shown in this process flow enabling MIBS Schottky barrier diode, the MIBS implementation with the solar cell in this embodiment only requires one additional process step (which can be done in an existing contact ablation tool—Tool 9, to perform n+ silicon ablation to form exposed lightly doped n-type silicon region). The process flow described above demonstrates that the MIBS device (in this case Schottky barrier diode) can be monolithically and easily integrated with the high-efficiency back-contact/back-junction backplane-laminated solar cell without adding any additional materials or material layers, and with only one added process step (performed in the shared solar cell fab Tool 9 also used to form the base and emitter contact openings), and with rather small incremental MIBS-related fab cost. While the process flow in FIG. 29 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 13 would form the trench isolation regions. All the other process steps shown in FIG. 29 would be the same as shown for epitaxial silicon lift-off processing.

Figure 30:
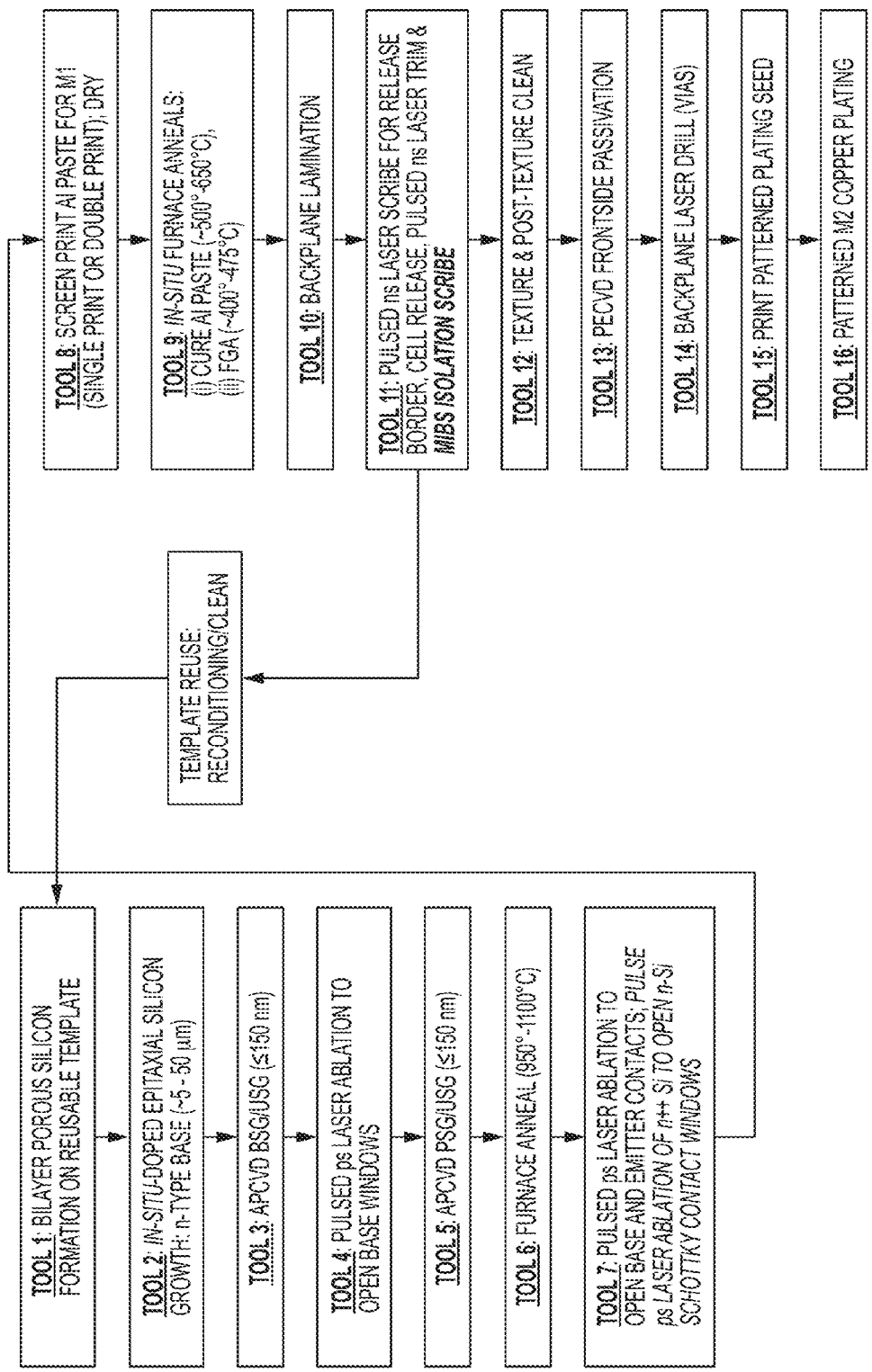

FIG. 30 shows another representative manufacturing process flow for epitaxial solar cell with MIBS Aluminum/n-type silicon Schottky barrier diode (solar cell with non-selective emitter). This process flow shows the option to fabricate a high-efficiency back-contact/back-junction solar cell along with its associated MIBS Schottky barrier diode using a process flow which utilizes one APCVD BSG process to form the heavily doped p+ emitter regions (so called single-BSG non-selective emitter). In order to enable fabrication of the MIBS Schottky barrier diode, one specific additional process is performed in an existing solar cell fabrication tool (Tool 7 also used to open base and emitter contact holes) in order to perform pulsed picoseconds (or pulsed femtoseconds or pulsed nanoseconds) laser ablation of the n+ silicon layer to form the exposed lightly doped n-type silicon regions for the MIBS Schottky contact formation with patterned M1. This single added process step (which can be done without adding any dedicated fab tool) allows for subsequent fabrication of the Schottky contact (aluminum to n-type silicon) during the patterned M1 formation process. As shown in this process flow enabling MIBS Schottky barrier diode, the MIBS implementation with the solar cell in this embodiment only requires one additional process step (which can be done in an existing contact ablation tool—Tool 7, to perform n+ silicon ablation to form exposed lightly doped n-type silicon region). The process flow described above demonstrates that the MIBS device (in this case Schottky barrier diode) can be monolithically and easily integrated with the high-efficiency back-contact/back-junction backplane-laminated solar cell without adding any additional materials or material layers, and with only one added process step (performed in the shared solar cell fab Tool 7 also used to form the base and emitter contact openings), and with rather small incremental MIBS-related fab cost. While the process flow in FIG. 30 is shown and described for solar cells and MIBS made using epitaxial silicon lift-off substrate formation, a similar process flow can be used to make solar cells and associated MIBS devices on starting crystalline silicon wafers, without epitaxial silicon lift-off substrate formation. This can be done by using starting FZ or CZ or cast wire-sawn crystalline silicon wafers (hence, eliminating Tools 1 and 2). In this case, there would be no lift-off release and the process step shown at Tool 11 would form the trench isolation regions. All the other process steps shown in FIG. 30 would be the same as shown for epitaxial silicon lift-off processing.

Figure 31:
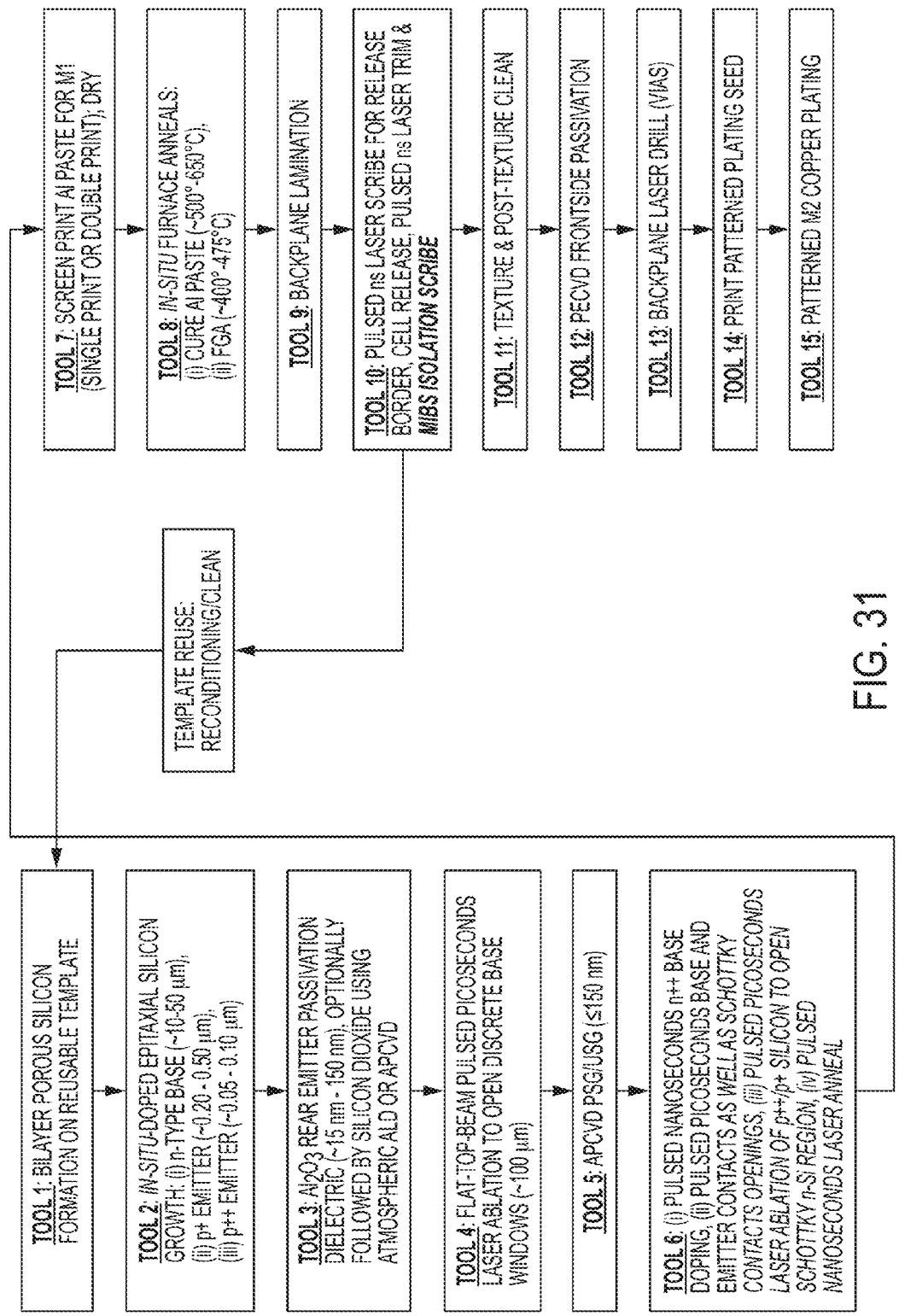

FIG. 31 shows another representative manufacturing process flow for epitaxial solar cell with MIBS Aluminum/n-type silicon Schottky barrier diode (solar cell with in-situ-doped epitaxial p++/p+ emitter). This process flow shows the option to fabricate a high-efficiency back-contact/back-junction solar cell along with its associated MIBS Schottky barrier diode using a process flow which utilizes epitaxial deposition with in-situ p++/p+ emitter (deposited at the end of the epitaxial silicon process after formation of the n-type base region). This in-situ emitter process eliminates the need for APCVD BSG emitter doping (since the emitter junction is already formed in situ during the epitaxial silicon process). The Schottky barrier diode fabrication is performed using n-type silicon opening by laser ablation of p++/p+ in-situ-formed emitter silicon using Tool 6 which is the same process tool also used to open the base and emitter contact openings using oxide laser ablation, and also post-contact annealing using pulsed nanoseconds laser annealing. This enables formation of M1 (aluminum) on n-type silicon Schottky contact on the MIBS substrate region. The solar cell and MIBS common substrate is formed by epitaxial deposition of silicon initially with n-type silicon doping for the base region (for a large fraction of the epitaxial silicon layer thickness) and then a thin layer of p+ doped epitaxial emitter followed by a thin layer of p++ doped emitter contact layer. The in-situ-doped (base and emitter) epitaxial layer is formed on a reusable crystalline silicon template after formation of a sacrificial porous silicon (Tool 1) serving both as the epitaxial seed and also the lift-off release layer. The in-situ-doped epitaxial layer (formed by Tool 2) has the desired n-type base doping for the base of the back-contact/back-junction solar cell (which is also used for the MIBS Schottky barrier diode substrate), as well as the p++/p+ doping for the solar cell emitter region. Most of the back-contact/back-junction cell processing (processing through the patterned M1 layer) is subsequently performed while the epitaxial layer is supported by the template. These process steps may use a combination of APCVD (Atmospheric-Pressure Chemical-Vapor Deposition), pulsed laser ablation and annealing, and screen printing and curing of the aluminum paste (through Tool 8 in FIG. 31) to complete the back-junction/back-contact solar cell processing steps through M1 metallization layer. All these processes are may be performed while the solar cell is supported on the reusable silicon template. In order to enable fabrication of the MIBS Schottky barrier diode, one specific additional process is performed in an existing solar cell fabrication tool (Tool 6 also used to open base and emitter contact holes) in order to perform pulsed picoseconds (or pulsed femtoseconds or pulsed nanoseconds) laser ablation of the p++/p+ silicon layer to form the exposed lightly doped n-type silicon regions for the MIBS Schottky contact formation with patterned M1. This single added process step (which can be done without adding any dedicated fab tool) allows for subsequent fabrication of the Schottky contact (aluminum to n-type silicon) during the M1 process. Next, the backplane is permanently attached and laminated to the backside of the solar cell on the template (Tool 9). Subsequently (in Tool 10), the solar cell (and its associated MIBS) is lifted off and detached from the reusable template (by laser scribing to define the release boundary, mechanical lift-off release, and laser trimming of the lifted solar cell) and the trench isolation region(s) to partition and electrically isolate the MIBS region(s) is (are) formed by scribing from the sunny-side of the detached backplane-laminated solar cell, in some instances using the same pulsed laser source or tool which is also used to perform the pre-release scribing of silicon and/or the post-release trimming of the solar cell and MIBS peripheral boundary. Then, the remaining back-end solar cell (and MIBS) processing steps are completed (Tools 11 through 15) which involves sunny-side texture & post-texture wet clean (which also cleans the laser-scribed isolation trenches), PECVD sunny-side passivation and ARC formation (which also passivates the MIBS front surface and sidewalls/edges), and final high-conductivity M2 metallization and conductive via plugs on the backplane (using one or an appropriate combination of screen printing, PVD, and/or plating). As shown in this process flow enabling MIBS Schottky barrier diode, the MIBS implementation with the solar cell in this embodiment only requires one additional process step (which can be done in an existing contact ablation tool—Tool 6 to perform p++/p+ silicon ablation to form exposed lightly doped n-type silicon region). The trench isolation process is actually performed using the same tool or laser source(s) which is used to scribe and/or trim the solar cell prior to release and after release. Therefore, there is essentially a rather small incremental cost for implementation of the MIBS Schottky barrier diode embodiment of this invention along with the solar cell using this particular representative manufacturing process flow. This process flow is shown as a representative example, and many other variations of such process flow are possible in order to manufacture the combination of the solar cell and its associated MIBS device without added fab process complexity or cost. Again, the n-type epitaxial silicon layer serves as the monolithic substrate for both the solar cell and the MIBS device. This n-type substrate layer serves as the absorber and base region of the solar cell as well as the n-type substrate region of the MIBS Schottky barrier diode (including M1 aluminum to n-type silicon Schottky contact). The APCVD PSG assisted process to form the n+ heavily doped regions is used both for the solar cell base region ohmic contact and also for the MIBS ohmic contact to the n-type substrate region of the MIBS Schottky barrier diode. The solar cell M1-M2 metallization is also used to make contacts to the MIBS Schottky barrier diode and complete its monolithic interconnections with the solar cell as an integrated shade management bypass switch. The process flow described above demonstrates that the MIBS device (in this case Schottky barrier diode) can be monolithically and easily integrated with the high-efficiency back-contact/back-junction backplane-laminated solar cell without adding any additional materials or material layers, and with only one added process step (which can be performed in the shared solar cell fab Tool 6 also used to form the base and emitter contact openings), and with rather small or negligible incremental MIBS-related fab cost. The embodiments of this invention use the same material layers and processes for the MIBS implementation as already used for the solar cell.

The above-mentioned representative process flows show several embodiments of this invention to implement either Schottky barrier diode or pn junction diode MIBS devices with the solar cells using a monolithic fabrication process with negligible or small cost addition to the main solar cell process flow.

Figure 32:
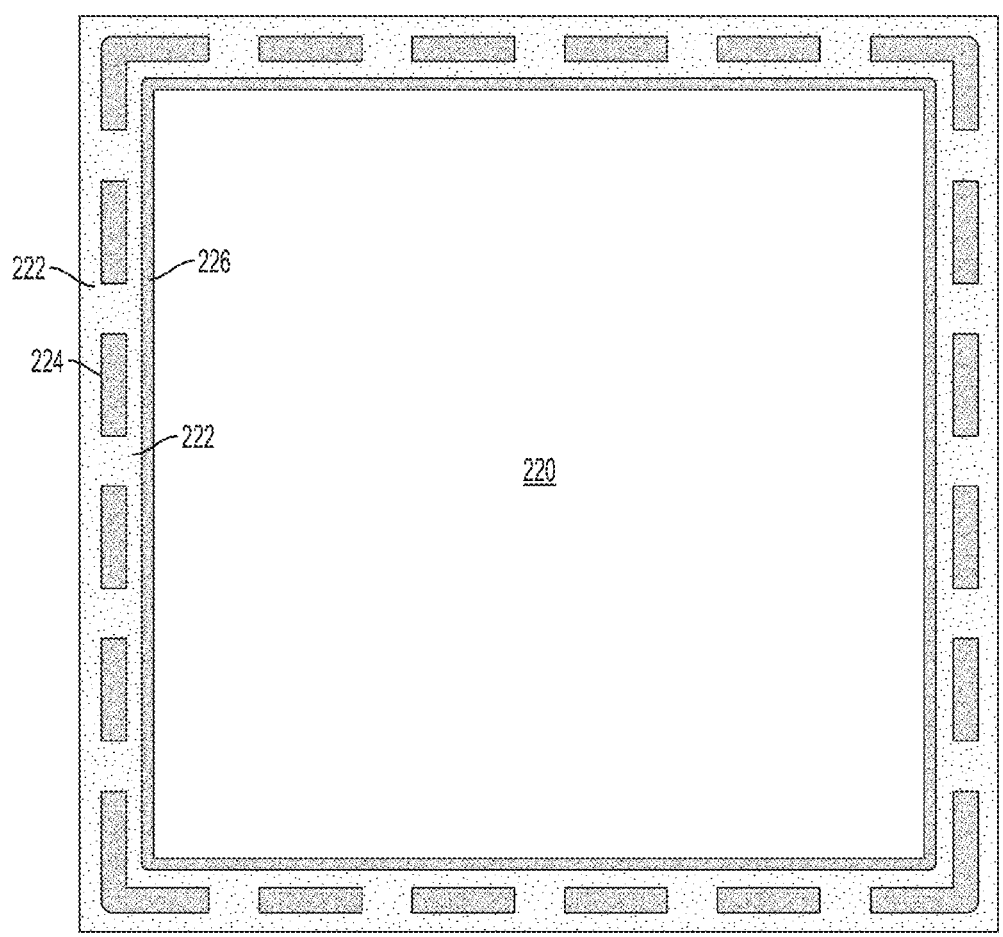
FIG. 32 is a schematic diagram showing a plan (top side) view of a MIBS back-contact/back-junction solar cell embodiment, with MIBS rim diode formed as a segmented pn junction diode.

A peripheral MIBS diode may have continuous closed-loop p+ doped junction sandwiched between the n-type regions (as seen in FIG. 16) or segmented p+ doped islands dispersed in the n-type silicon region of MIBS silicon rim (as seen in FIG. 32). Segmented p+ doped islands may allow M2 to be somewhat recessed from the outer edge of the monolithically integrated solar cell and MIBS substrate. And while one segmented island design is shown FIG. 32, other segmented designs are possible as well.

FIG. 32 is a diagram showing a plan view of a MIBS back-contact/back-junction solar cell embodiment with a plurality of segmented pn junction regions or islands within the MIBS n-type silicon substrate region (shown before M1 metallization). Solar cell island 220 is surrounded by trench isolation region 226 which partitions and isolates solar cell 220 from the MIBS rim region comprising n doped region 222 and pn junction island regions 224, all sharing a common continuous backplane and formed from a common originally continuous and subsequently partitioned solar cell semiconductor substrate. In this structure, solar cell island 220 is partitioned and isolated from the full-periphery rim pn junction diode by full-periphery closed loop trench isolation. The same design shown in FIG. 32 for a MIBS pn junction diode may also be applied to a Schottky barrier diode wherein island regions 226 are M1 aluminum to n-type silicon Schottky contact regions.

Figure 33A:
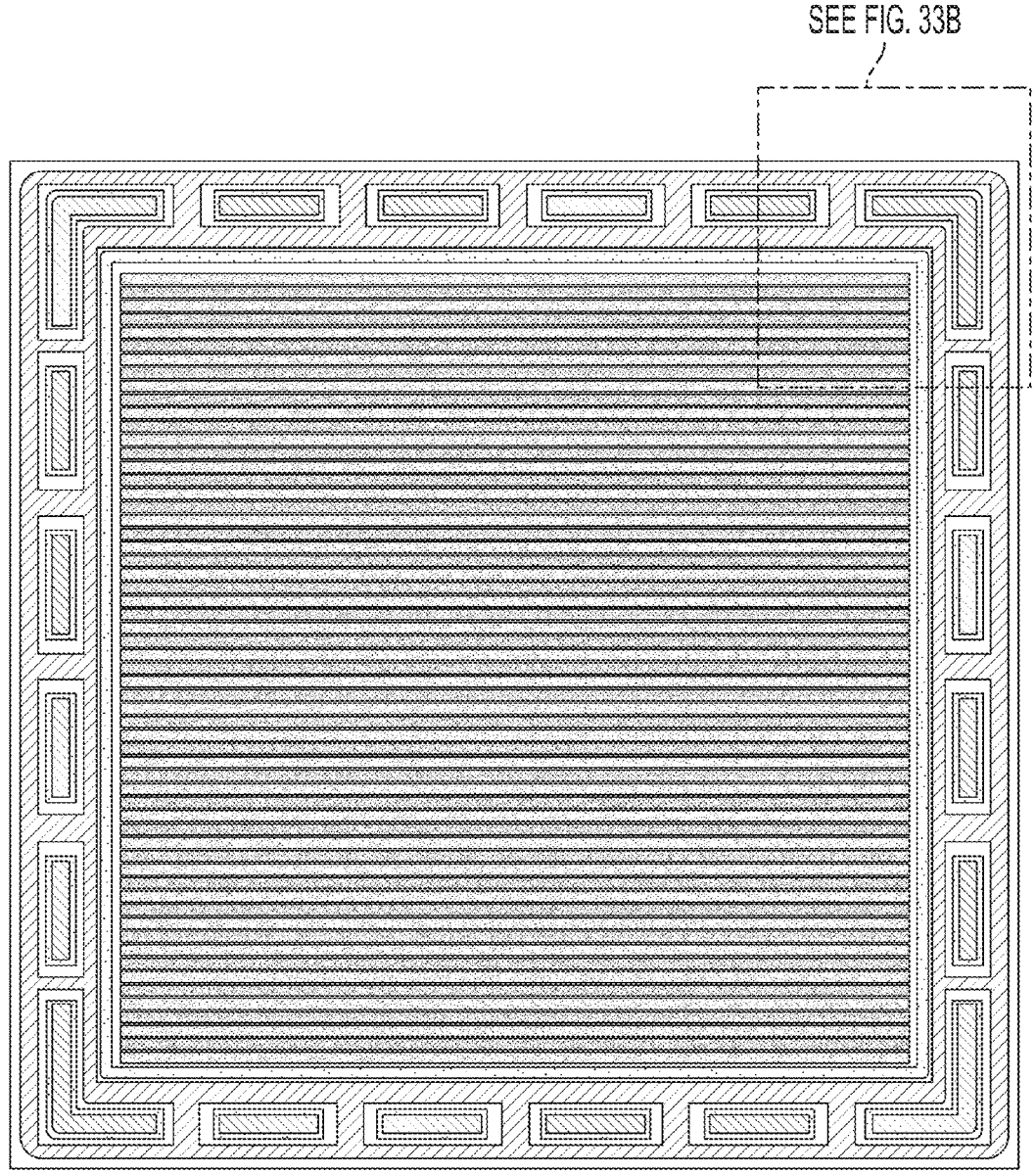
FIGS. 33A and 33B (FIG. 33B is an expanded view of a portion of FIG. 33A) are schematic diagrams showing a schematic top view of the solar cell first-level metallization pattern (Metal 1 or M1) embodiment for a representative MIBS rim diode made with a segmented pn junction diode structure.
Figure 33B:
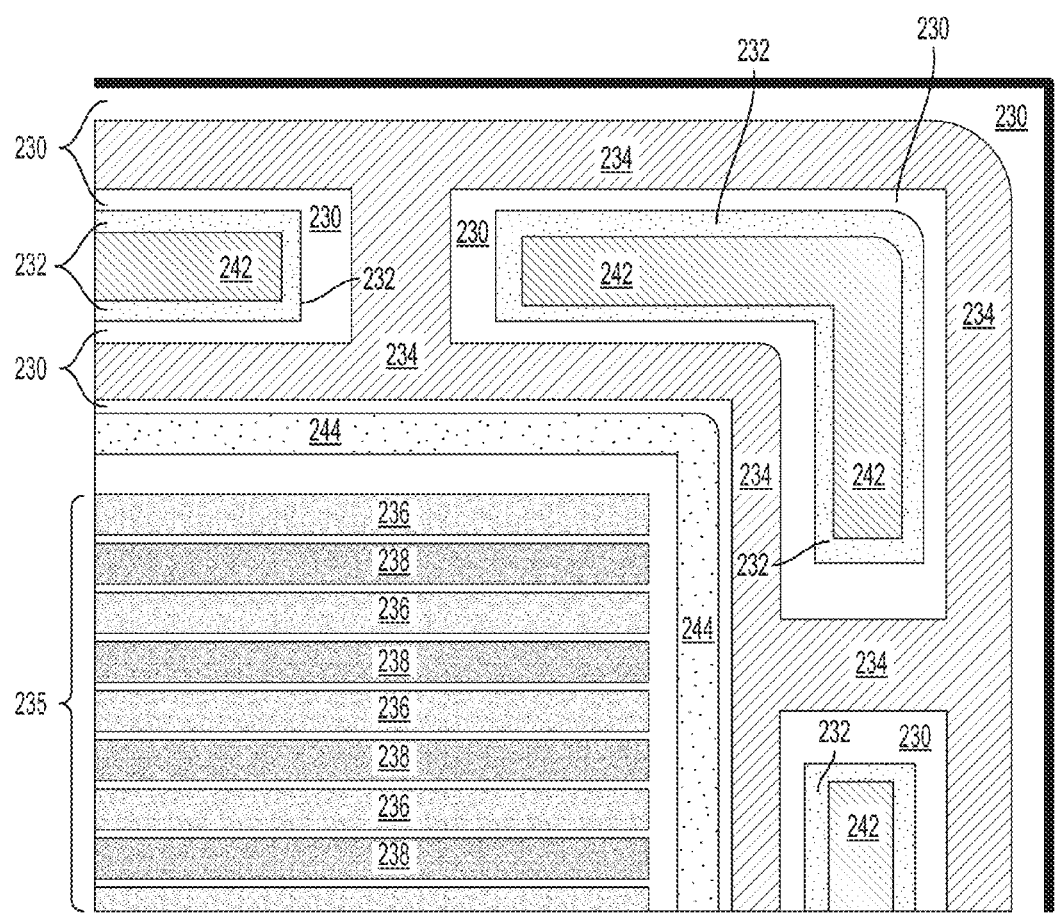

FIG. 33A is diagram showing a plan view of a first-level metallization pattern (M1) embodiment for a representative MIBS rim diode using a plurality of segmented pn junction regions or islands within the MIBS n-type silicon substrate region (shown after M1 metallization along with a representative M1 pattern), such as that shown in FIG. 32. FIG. 33B is an expanded selection of FIG. 33A provided for descriptive purposes. The MIBS rim diode and solar cell dimensions are not shown to scale. This particular example shows the main solar cell island partitioned and isolated from the full-periphery rim pn junction diode using the full-periphery closed loop trench isolation. This design allows a mesh type M1 pattern to make ohmic contact to the n-type silicon substrate region of the MIBS device (hence, allowing other M2 design alternatives for the M2-M1 interconnection of the MIBS device to the solar cell). The same design shown above for a MIBS pn junction diode may also be applied to a Schottky barrier diode (with the rim islands being the M1 aluminum to n-type silicon Schottky contact regions).

FIGS. 33A and 33B show a busbarless interdigitated solar cell base and emitter metal (M1), for example aluminum, fingers 235 as well as the aluminum metallization contacts forming the MIBS diode p+ and n-type substrate ohmic contacts. Trench isolation region 244 partitions and isolates the solar cell from the MIBS bypass diode region. Aluminum contact metal is positioned on n– doped regions of the solar cell, shown as base metallization fingers 236, and also on n– doped regions of the MIBS bypass diode 230, shown as n doped region metallization contacts 234, (ohmic contacts are made through n+ contact diffusion regions). Aluminum contact metal is positioned on p+ doped regions of solar cell, shown as emitter metallization fingers 238, and also on p+ doped regions of the MIBS bypass diode 232, shown as p+ doped region metallization contacts 242, (contacts are made through p+ contact diffusion regions). The patterned M1 aluminum metallization layer may be formed by screen printing of an aluminum or aluminum-silicon paste layer or by physical vapor deposition (PVD) of aluminum or aluminum-silicon alloy followed by a patterning process. The thickness of the aluminum layer may be in the range of a small fraction of 1 micron up to a few microns for M1 aluminum formed by PVD and in the range of a few microns up to 10's of microns (e.g., about 20 microns) for aluminum formed by screen printing of aluminum paste.

For an Al/n-Si Schottky barrier diode MIBS, the aluminum contact on n-type Silicon for Schottky contact may be either a paste made of pure aluminum or an alloy of aluminum with some silicon addition in order to mitigate or eliminate the possibility of aluminum spiking into silicon (same paste used for solar cell M1 single print or double print).

Optionally, any solar photo-generation effect in the MIBS pn junction diode may be suppressed or mitigated by one of several techniques including an end-of-the-line laser irradiation of the MIBS diode rim on the solar cell sunny-side to degrade passivation and substantially increase the front surface recombination velocity (FSRV) on the MIBS rim diode. Alternatively, the MIBS diode rim surface may be coated with a suitable inexpensive black light blocker ink, such light-blocking ink may be applied by inkjet or screen printing. Alternatively, an M1 pattern design which maximizes the M1 metal contact area coverage of the pn junction contacts, and thus increases the metal contact recombination losses in the MIBS device (and not in the solar cell) may be used.

Metallization structures described above have metallization and interconnections of the solar cell and the MIBS diode (for example a pn junction diode or Schottky barrier diode) using the combination of both M1 and M2 layers in a two-level metallization scheme. In another metallization structure, full metallization of the MIBS occurs at the M1 level and M2 is used only for the solar cell final high-conductivity metallization. This approach may be particularly attractive when the MIBS pn junction or Schottky diodes are integrated with an array of mini-cells or tiled mini-cell cell array, forming the master cell (master cell made of series-connected mini-cells or trench-isolated tiles)—as shown in FIG. 15. Full metallization of the MIBS at the M1 level may also be used with a solar cell without tiled cells.

An M1-only MIBS metallization and MIBS diode (pn junction diode or Schottky barrier diode) interconnection to the associated solar cell allows for: (i) M2 to be dedicated only to the solar cell metallization and interconnection through conductive M2-M1 via plugs landing on the interdigitated M1 fingers of the solar cell; (ii) the elimination of M2-M1 via plugs landing on the MIBS diode metallization area; (iii) making M2 recessed and offset with respect to the overall MIBS-integrated solar cell peripheral edges which may be attractive for certain M2 metallization processes such as one-sided M2 copper plating tool when using copper plating.

Figure 34A:
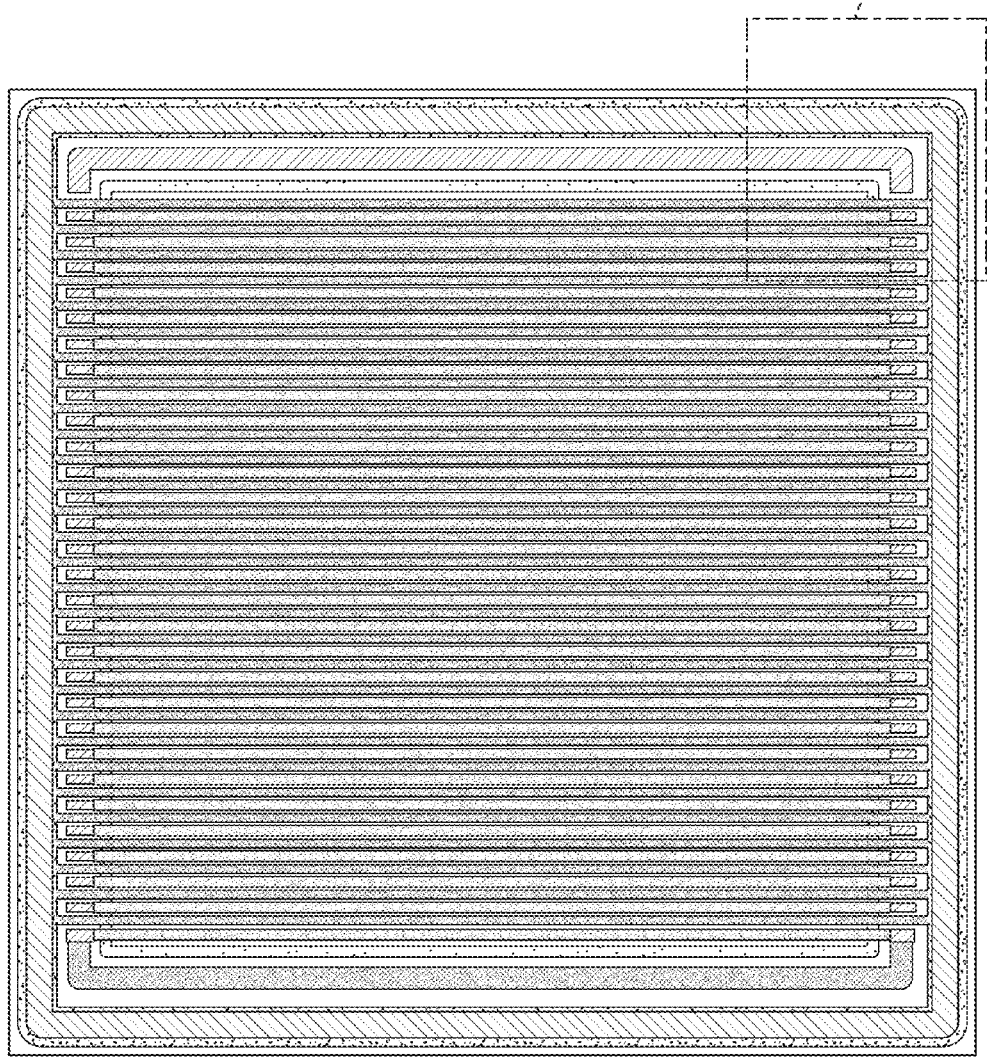
FIGS. 34A and 34B (FIG. 34B is an expanded view of a portion of FIG. 34A) are diagrams showing a plan (top side) view a first-level only metallization (M1 level) and MIBS/solar cell interconnection pattern (M1), for solar cells using either pn junction diode MIBS or Schottky diode MIBS.

FIG. 34A is diagram showing a plan view of a first-level only metallization and MIBS/solar cell interconnection pattern (M1) for a back-contact/back-junction solar cell with a peripheral MIBS rim pn junction diode, such as that shown in FIG. 16. In the structure of FIG. 34A the first-level metal (M1 metallization pattern) is used to fully interconnect the solar cell and associated MIB pn junction diode device using M1 only, and thus may utilize any additional metallization layer (such as the M2 metallization layer formed over the backplane) exclusively for final solar cell metallization in which case the conductive M2-M1 via plugs only land on and connect to the interdigitated emitter and base M1 fingers of the solar cell.

Figure 34B:
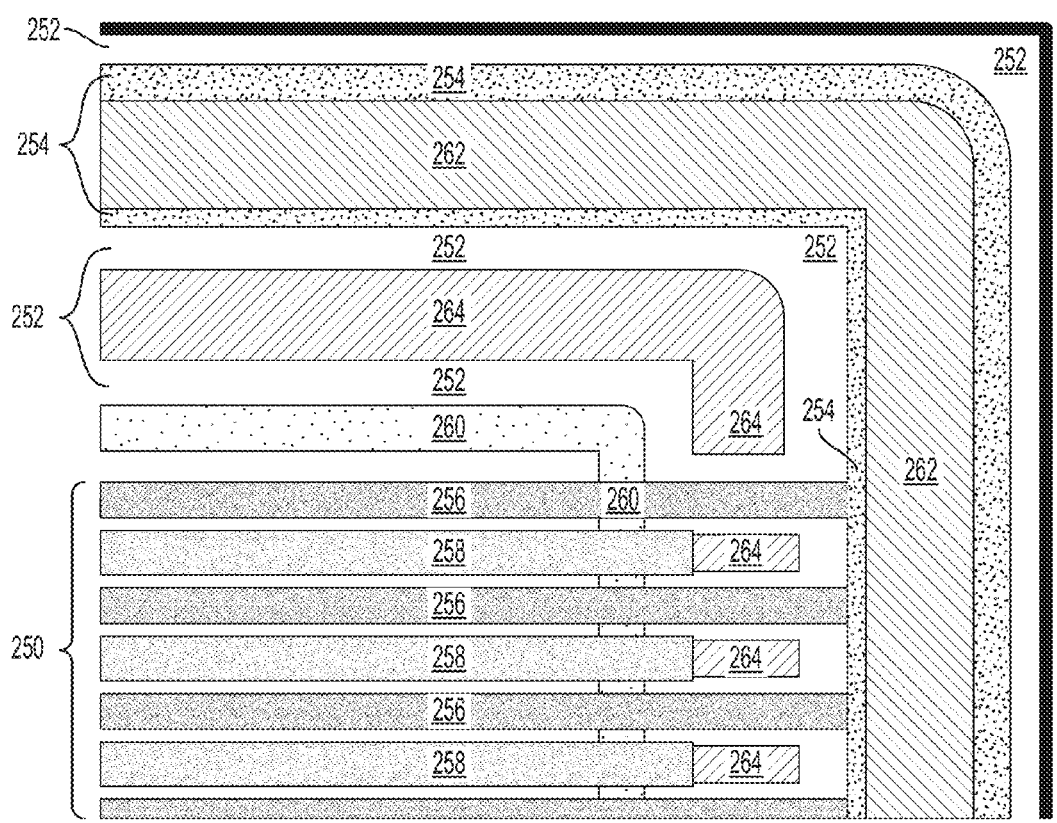

FIG. 34B is an expanded selection of FIG. 34A provided for descriptive purposes. The structure of FIGS. 34A and 34B comprise interdigitated solar cell base and emitter metal (M1), for example aluminum or aluminum-silicon alloy, interdigitated fingers 250 as well as the aluminum metallization contacts forming the MIBS diode p+ and n-type substrate ohmic contacts. Trench isolation region 260 partitions and isolates the solar cell from the MIBS bypass diode region. Aluminum or aluminum-silicon alloy contact metal is positioned on n– doped regions of the solar cell, shown as base metallization fingers 256, and also on n– doped regions of the MIBS bypass diode 252, shown as n doped region metallization contacts 264, (contacts are made through n+ contact diffusion regions). Aluminum contact metal is positioned on p+ doped regions of solar cell, shown as emitter metallization fingers 258, and also on p+ doped regions of the MIBS bypass diode 254, shown as p+ doped region metallization contacts 262, (contacts are made through p+ contact diffusion regions).

Similarly, FIGS. 34A and B may be used to show a first-level only metallization and MIBS/solar cell interconnection pattern (M1) for a full-periphery rim diode using aluminum on n-type silicon Schottky barrier diode. As above, in this case the first-level metal (M1 metallization pattern) is used to fully interconnect the solar cell and associate MIB Schottky barrier diode device using M1 only, thus any additional metallization layer (such as the M2 metallization layer over the backplane) may be exclusively used for the final solar cell metallization in which case the conductive M2-M1 via plugs only land on and connect to the interdigitated emitter and base M1 fingers of the solar cell.

In a first-level only metallization and MIBS/solar cell interconnection pattern (M1) for a full-periphery rim diode using aluminum on n-type silicon Schottky barrier diode implementation as described with reference to FIGS. 34A and B, the cell comprises busbarless interdigitated solar cell base and emitter metal (aluminum) ohmic fingers 250 as well as the aluminum metallization contacts forming the MIBS diode Schottky and ohmic contacts. Aluminum contact metal is positioned on n– doped regions of the solar cell, shown as base metallization ohmic fingers 256, and also on ohmic contact n– doped regions of MIBS Schottky bypass diode 252, shown as n doped region metallization ohmic contacts 264 (n+ contact diffusion regions contacting n– doped silicon). Aluminum contact metal is positioned on p+ doped regions of solar cell, shown as emitter metallization ohmic fingers 258, (through p+ contact diffusion regions). Aluminum Schottky contact metal 262 is positioned on lightly doped n-type regions of MIBS bypass diode 254, for example only on the n-type surface.

While the MIBS embodiments have been described herein in conjunction with back-contact back-junction crystalline silicon solar cells using thin (sub-200 µm thickness and as thin as sub-100 µm thickness) crystalline silicon absorber layers formed by porous silicon sacrificial and epitaxial silicon lift-off processing as well as associated continuous backplanes, it should be understood that the MIBS embodiments in accordance with the disclosed subject matter may be applied to other solar cell and PV module implementations, including but not limited to the following:

Solar cell substrates and resulting solar cells made of crystalline silicon fabricated by kerfless thin silicon exfoliation techniques such as proton or hydrogen ion implantation and exfoliation, metal stress induced thin silicon exfoliation, or any thickness of crystalline silicon wafers made by slurry or diamond wire saw.

Solar cells made using other crystalline semiconductor materials such as crystalline gallium arsenide, gallium nitride, germanium, silicon carbide, other compound semiconductors, etc.

Non-IBC back-contact solar cells (including but not limited to the MWT solar cells).

Front contact solar cells and PV modules comprising such front-contact cells.

Wafer-based solar cells including both back-contact/back-junction and front-contact solar cells made from crystalline semiconductor wafers (such as CZ or FZ monocrystalline silicon wafers or cast multi-crystalline silicon wafers) made using wire saw and other wafering techniques, with solar cell wafers attached to backplanes, Back-contact/back-junction cells may be advantageous in some applications as MIBS embodiments may be implemented without detrimentally impacting the final module assembly. Availability of both the emitter and base interconnection leads on the backsides of the cells (for instance, using the back-contact/back-junction (IBC) solar cells such as thin crystalline semiconductor supported on a backplane) is advantageous for various MIBS embodiments.

Further, the solar cell embodiments disclosed herein may be packaged as cell modules in a variety of materials such as rigid glass covered modules or flexible light weight photovoltaic module laminate without a glass cover.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A monolithically integrated solar cell and bypass switch structure, comprising:
    a semiconductor layer forming a solar cell region and a bypass switch region, said solar cell region and said bypass switch region partitioned by an electrical isolation trench, said semiconductor layer having a light receiving frontside and a backside opposite said frontside;

a patterned first-level metal layer (M1) positioned on said semiconductor layer backside providing base and emitter metallization on said solar cell region and metallization on said bypass switch region;

an electrically insulating backplane positioned on said patterned first-level metal layer (M1);

said electrical isolation trench formed through said semiconductor layer to said electrically insulating backplane and electrically isolating said solar cell region and said bypass switch region;

a patterned second-level metal layer (M2) positioned on said electrically insulating backplane; and a plurality of electrically conductive via plugs formed through said electrically insulating backplane connecting select portions of said patterned second-level metal layer (M2) to select portions of said patterned first-level metal layer (M1);

said patterned first-level metal layer (M1), said patterned second-level metal layer (M2), and said plurality of electrically conductive via plugs designed to complete the electrical metallization and interconnections of said integrated solar cell and bypass switch structure.

2. The integrated solar cell and bypass switch structure of claim 1, wherein said patterned first-level metal (M1) is an interdigitated pattern of busbarless base and emitter fingers.

3. The integrated solar cell and bypass switch structure of claim 1, wherein said patterned second-level metal (M2) is an interdigitated pattern of base and emitter fingers with solar cell busbars.

4. The integrated solar cell and bypass switch structure of claim 1, wherein said patterned second-level metal (M2) is substantially orthogonal to the patterned first-level metal (M1).

5. The integrated solar cell and bypass switch structure of claim 1, wherein said semiconductor layer is a mono-crystalline silicon layer.

6. The integrated solar cell and bypass switch structure of claim 1, wherein said semiconductor layer is a multi-crystalline silicon layer.

7. The integrated solar cell and bypass switch structure of claim 1, wherein the background doping of said semiconductor layer is an n-type doping to produce a solar cell with n-type absorber and base.

8. The integrated solar cell and bypass switch structure of claim 1, wherein said solar cell is a back-contact solar cell.

9. The integrated solar cell and bypass switch structure of claim 1, wherein said solar cell is an interdigitated back-contact (IBC) solar cell.

10. The integrated solar cell and bypass switch structure of claim 1, wherein said bypass switch region comprises a bypass diode.

11. The integrated solar cell and bypass switch structure of claim 1, wherein said bypass switch is a pn junction diode.

12. The integrated solar cell and bypass switch structure of claim 11, wherein the p-type and n-type terminals of said pn junction diode are connected to the n-type and p-type terminals of said solar cell, respectively.

13. The integrated solar cell and bypass switch structure of claim 1, wherein said bypass switch is a Schottky barrier diode.

14. The integrated solar cell and bypass switch structure of claim 1, wherein said bypass switch is a transistor.

15. The integrated solar cell and bypass switch structure of claim 1, wherein said semiconductor layer has a thickness in the range of about 1 micron up to about 200 microns.

16. The integrated solar cell and bypass switch structure of claim 1, wherein said electrically insulating backplane has a thickness in the range of about 50 micron up to about 250 microns.

17. The integrated solar cell and bypass switch structure of claim 1, wherein said electrically insulating backplane is a flexible material with relatively close Coefficient of Thermal Expansion (CTE) match to that of said semiconductor layer.

18. The integrated solar cell and bypass switch structure of claim 1, wherein said integrated solar cell and bypass switch structure is flexible and is packaged in a flexible lightweight photovoltaic module laminate.

19. The integrated solar cell and bypass switch structure of claim 1, wherein said light receiving frontside has a passivation and anti-reflection coating.

20. The integrated solar cell and bypass switch structure of claim 1, wherein the area ratio of said trench isolation pattern to said solar cell region and said bypass switch region is less than or equal to 1%.

21. The integrated solar cell and bypass switch structure of claim 1, wherein the area ratio of said bypass switch region to said solar cell region is less than or equal to 1%.

22. The integrated solar cell and bypass switch structure of claim 1, wherein the area ratio of said bypass switch region to said solar cell region is less than or equal to 0.3%.

23. The integrated solar cell and bypass switch structure of claim 1, wherein the area ratio of said bypass switch region to said solar cell region is in the range of approximately 0.26 to 1.3%.

24. The integrated solar cell and bypass switch structure of claim 1, wherein said electrically insulating backplane is a flexible prepreg sheet.

25. The integrated solar cell and bypass switch structure of claim 1, wherein said electrically insulating backplane sheet is rigid.

26. The integrated solar cell and bypass switch structure of claim 1, wherein said electrically insulating backplane is a flexible aramid fiber and resin prepreg sheet.

27. The integrated solar cell and bypass switch structure of claim 1, wherein said semiconductor layer comprises a plurality of mini solar cell regions and corresponding bypass switch regions.

28. The integrated solar cell and bypass switch structure of claim 1, wherein said semiconductor layer comprise at least one crystalline semiconductor material from the group of silicon, germanium, gallium arsenide, gallium nitride, gallium phosphide, other III-V semiconductors, or a combination thereof.

29. The integrated solar cell and bypass switch structure of claim 1, wherein said bypass switch is a full-periphery rim diode surrounding said solar cell region and separated from said solar cell region by said trench isolation pattern.

30. The integrated solar cell and bypass switch structure of claim 1, wherein said bypass switch region comprises a plurality of diodes.

31. The integrated solar cell and bypass switch structure of claim 1, wherein said bypass switch is a diode located on at least one side of said solar cell region and separated from said solar cell region by said trench isolation pattern.

32. The integrated solar cell and bypass switch structure of claim 1, wherein said bypass switch is a diode located on at least one corner of said solar cell region and separated from said solar cell region by said trench isolation pattern.

33. The integrated solar cell and bypass switch structure of claim 1, wherein said bypass switch comprises at least one diode island located within the area of said solar cell region and separated from said solar cell region by said trench isolation pattern.

34. The integrated solar cell and bypass switch structure of claim 1, wherein said bypass switch comprises at least one diagonal diode island positioned between two opposite diagonal corners of said solar cell region and separated from said solar cell region by said trench isolation pattern.

35. The integrated solar cell and bypass switch structure of claim 1, further comprising a plurality of monolithically integrated solar cells and bypass switches supported in a module laminate.

36. The integrated solar cell and bypass switch structure of claim 35, wherein said module laminate is a flexible laminate.

37. The integrated solar cell and bypass switch structure of claim 35, wherein said module laminate is a rigid glass-covered module laminate.

38. The integrated solar cell and bypass switch structure of claim 35, wherein said module laminate is a lightweight photovoltaic module laminate.

* * * * *